(12) United States Patent
Yamamoto

(10) Patent No.: US 10,559,595 B2
(45) Date of Patent: *Feb. 11, 2020

(54) MANUFACTURING METHOD OF SEMICONDUCTOR DEVICE

(71) Applicant: Renesas Electronics Corporation, Koutou-ku, Tokyo (JP)

(72) Inventor: Yoshiki Yamamoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/005,615

(22) Filed: Jun. 11, 2018

(65) Prior Publication Data

US 2018/0294285 A1 Oct. 11, 2018

Related U.S. Application Data

(63) Continuation of application No. 15/679,047, filed on Aug. 16, 2017, now Pat. No. 10,002,885.

(30) Foreign Application Priority Data

Sep. 16, 2016 (JP) ................................. 2016-181589

(51) Int. Cl.
*H01L 27/12* (2006.01)
*H01L 21/265* (2006.01)
(Continued)

(52) U.S. Cl.
CPC ........ *H01L 27/1207* (2013.01); *H01L 21/266* (2013.01); *H01L 21/2652* (2013.01);
(Continued)

(58) Field of Classification Search
CPC ............. H01L 27/1207; H01L 21/2652; H01L 21/266; H01L 21/31053; H01L 21/31116; H01L 21/31144; H01L 21/76283; H01L 21/84; H01L 29/0653; H01L 29/1083
See application file for complete search history.

(56) References Cited

U.S. PATENT DOCUMENTS 9,847,347 B1\* 12/2017 Smith ............... H01L 29/66628
2005/0196928 A1\* 9/2005 Bonser .............. H01L 21/76224
438/296

(Continued)

FOREIGN PATENT DOCUMENTS

JP 2002-009144 A 1/2002
JP 2004-363121 A 12/2004
(Continued)

*Primary Examiner* — Allen L Parker
*Assistant Examiner* — Charles N Ausar-El
(74) *Attorney, Agent, or Firm* — Sharpiro, Gabor and Rosenberger, PLLC

(57) ABSTRACT

A substrate in which an insulating layer, a semiconductor layer and an insulating film are stacked on a semiconductor substrate and an element isolation region is embedded in a trench is prepared. After the insulating film in a bulk region is removed by dry etching and the semiconductor layer in the bulk region is removed by dry etching, the insulating layer in the bulk region is thinned by dry etching. A first semiconductor region is formed in the semiconductor substrate in a SOI region by ion implantation, and a second semiconductor region is formed in the semiconductor substrate in the bulk region by ion implantation. Then, the insulating film in the SOI region and the insulating layer in the bulk region are removed by wet etching. Thereafter, a first transistor is formed on the semiconductor layer in the SOI region and a second transistor is formed on the semiconductor substrate in the bulk region.

16 Claims, 44 Drawing Sheets

(51) Int. Cl.
  *H01L 21/266*  (2006.01)
  *H01L 21/3105* (2006.01)
  *H01L 21/311*  (2006.01)
  *H01L 21/762*  (2006.01)
  *H01L 21/84*   (2006.01)
  *H01L 29/06*   (2006.01)
  *H01L 29/10*   (2006.01)

(52) U.S. Cl.
  CPC .. *H01L 21/31053* (2013.01); *H01L 21/31116* (2013.01); *H01L 21/31144* (2013.01); *H01L 21/76283* (2013.01); *H01L 21/84* (2013.01); *H01L 29/0653* (2013.01); *H01L 29/1083* (2013.01)

(56) References Cited

U.S. PATENT DOCUMENTS

| | | | |
|---|---|---|---|
| 2013/0087855 A1* | 4/2013 | Makiyama | H01L 21/84 257/350 |
| 2013/0140669 A1* | 6/2013 | Yugami | H01L 21/76224 257/506 |
| 2015/0364490 A1* | 12/2015 | Oda | H01L 21/26513 257/351 |
| 2017/0373145 A1* | 12/2017 | Shinkawata | H01L 29/66492 |
| 2019/0206744 A1* | 7/2019 | Maruyama | H01L 21/0206 |

FOREIGN PATENT DOCUMENTS

| | | |
|---|---|---|
| JP | 2006-222329 A | 8/2006 |
| JP | 2007-526652 A | 9/2007 |

\* cited by examiner

MANUFACTURING METHOD OF SEMICONDUCTOR DEVICE

CROSS-REFERENCE TO RELATED APPLICATION

The present application claims priority from Japanese Patent Application No. 2016-181589 filed on Sep. 16, 2016, the content of which is hereby incorporated by reference into this application.

TECHNICAL FIELD OF THE INVENTION

The present invention relates to a manufacturing method of a semiconductor device, for example, a technique effectively applied to a manufacturing method of a semiconductor device using a SOI (Silicon On Insulator) substrate.

BACKGROUND OF THE INVENTION

For the manufacture of a semiconductor device, an element isolation region is formed in a semiconductor substrate, a semiconductor element such as a MISFET (Metal Insulator Semiconductor Field Effect Transistor) is formed in each active region of the semiconductor substrate defined by the element isolation region, and a multilayer wiring structure is formed over the semiconductor substrate. Further, a technique using a SOI substrate as the semiconductor substrate has also been known.

Japanese Unexamined Patent Application Publication No. 2002-9144 (Patent Document 1), Japanese Unexamined Patent Application Publication No. 2004-363121 (Patent Document 2), Japanese Unexamined Patent Application Publication No. 2006-222329 (Patent Document 3) and Japanese Unexamined Patent Application Publication No. 2007-526652 (Patent Document 4) describe a technique relating to a semiconductor device including a STI (Shallow Trench Isolation).

SUMMARY OF THE INVENTION

It has been desired to improve the reliability of a semiconductor device manufactured using a SOI substrate.

The other problems and novel characteristics of the present invention will be apparent from the description of the present specification and the accompanying drawings.

According to one embodiment, a manufacturing method of a semiconductor device includes the step of: (a) preparing a substrate that includes a semiconductor substrate, an insulating layer on the semiconductor substrate, a semiconductor layer on the insulating layer, a first insulating film on the semiconductor layer, a trench penetrating the first insulating film, the semiconductor layer and the insulating layer so as to reach the semiconductor substrate, and an element isolation region embedded in the trench. The insulating layer, the first insulating film and the element isolation region are made of the same material as one another. The manufacturing method of a semiconductor device further includes the step of: (b) after the step (a), forming a first mask layer that covers the first insulating film in a first region of the substrate and exposes the first insulating film in a second region different from the first region of the substrate. The manufacturing method of a semiconductor device further includes the step of: (c) after the step (b), removing the first insulating film in the second region by dry etching with using the first mask layer as an etching mask, thereby exposing the semiconductor layer in the second region. The manufacturing method of a semiconductor device further includes the step of: (d) after the step (c), removing the semiconductor layer in the second region by dry etching with using the first mask layer as an etching mask, thereby exposing the insulating layer in the second region. The manufacturing method of a semiconductor device further includes the steps of: (e) after the step (d), performing dry etching for the insulating layer in the second region with using the first mask layer as an etching mask, thereby reducing a thickness of the insulating layer in the second region; and (f) after the step (e), removing the first mask layer. The manufacturing method of a semiconductor device further includes the step of: (g) after the step (f), forming a first semiconductor region by ion-implanting an impurity to the semiconductor substrate in the first region, and forming a second semiconductor region by ion-implanting an impurity to the semiconductor substrate in the second region. The manufacturing method of a semiconductor device further includes the step of: (h) after the step (g), removing the first insulating film in the first region and the insulating layer in the second region by wet etching, thereby exposing the semiconductor layer in the first region and the semiconductor substrate in the second region. The manufacturing method of a semiconductor device further includes the step of: (i) after the step (h), forming a first transistor on the semiconductor layer in the first region, and forming a second transistor on the semiconductor substrate in the second region.

According to one embodiment, it is possible to improve the reliability of the semiconductor device.

BRIEF DESCRIPTIONS OF THE DRAWINGS

and

Figure 44:
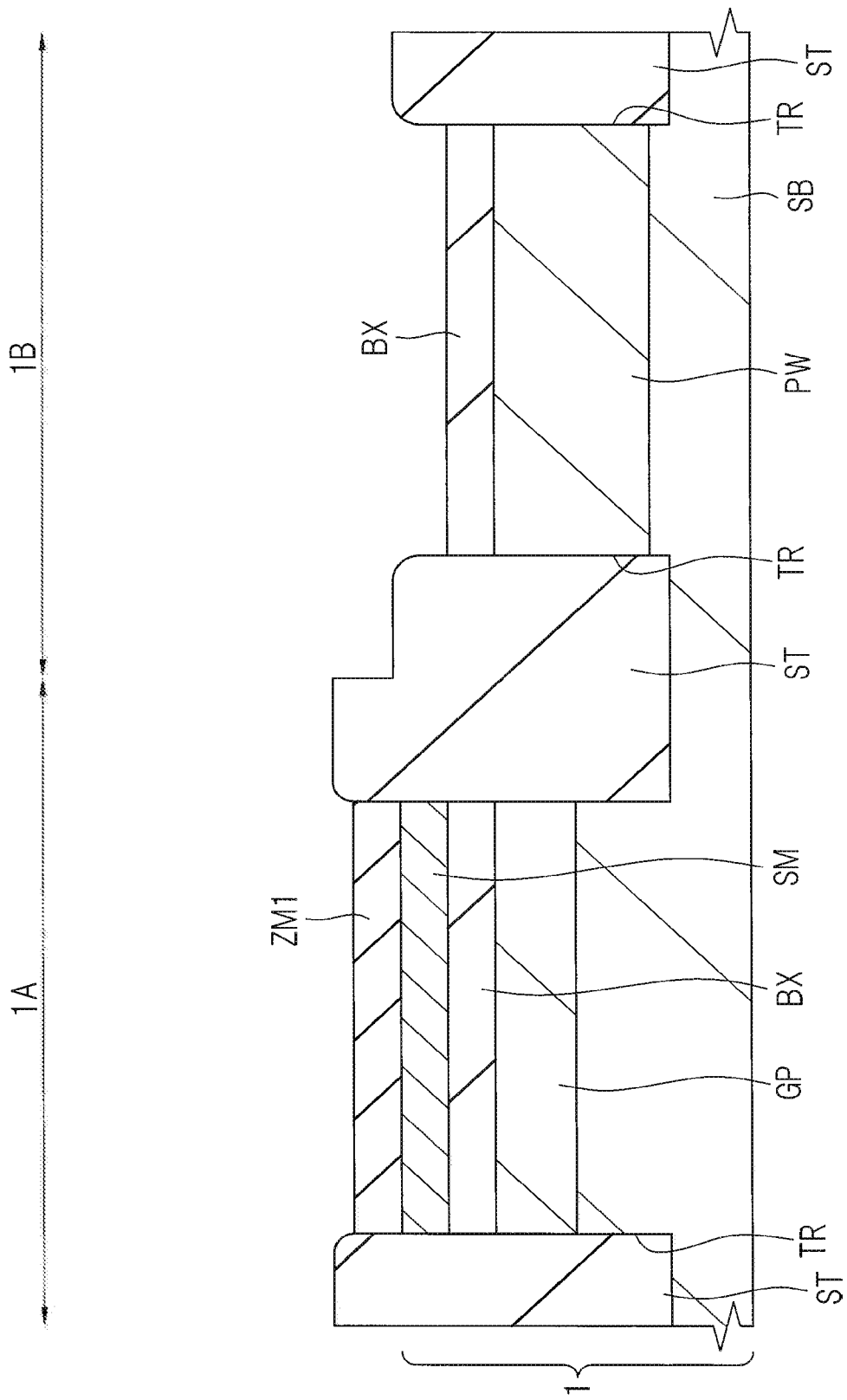
FIG. 44 is a cross-sectional view showing a principal part of the semiconductor device in the manufacturing process according to the examined example continued from FIG. 43.
Figure 45:
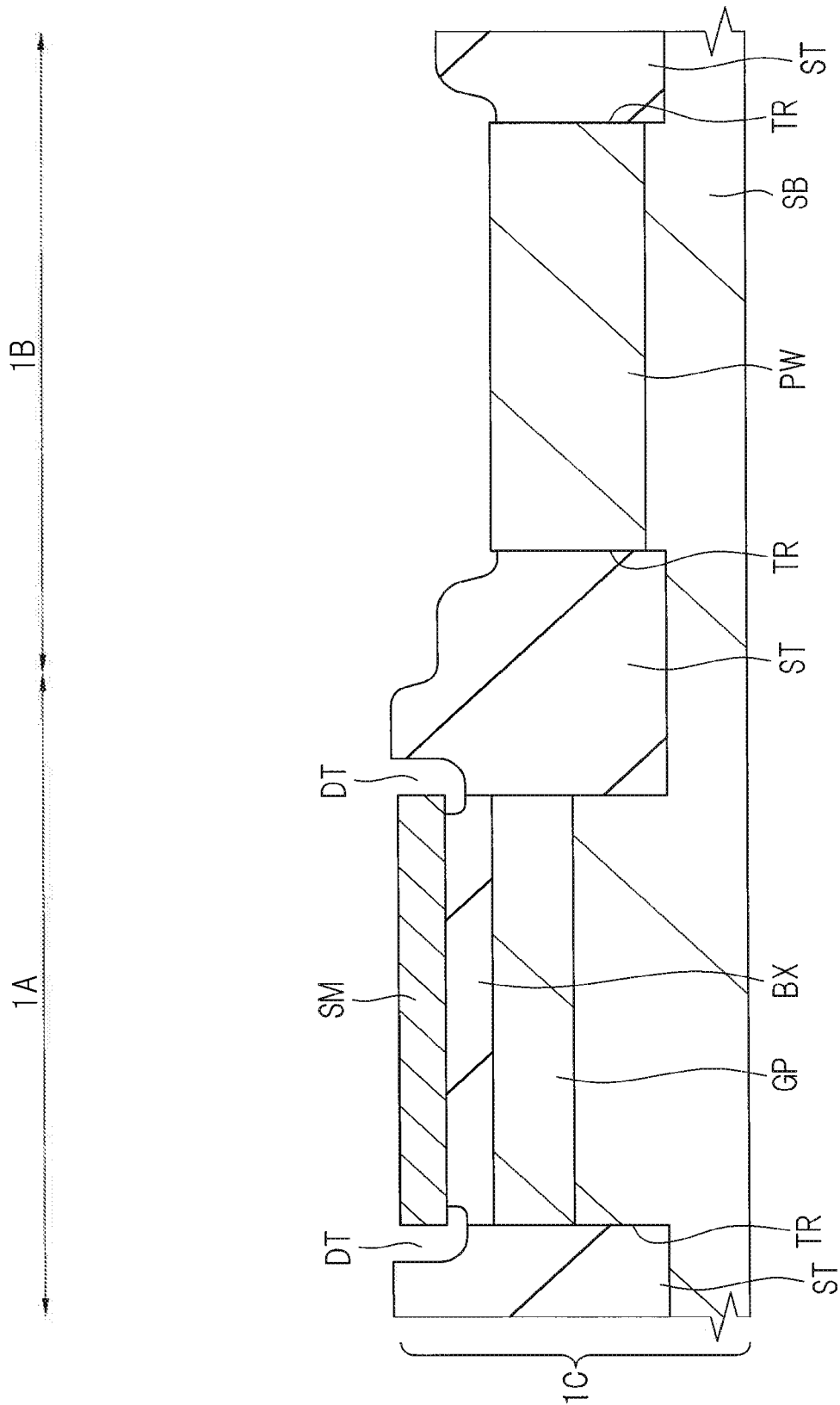

FIG. 45 is a cross-sectional view showing a principal part of the semiconductor device in the manufacturing process according to the examined example continued from FIG. 44.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps and the like) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments will be described in detail based on drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Embodiment

<Manufacturing Process of Semiconductor Device>

Figure 1:
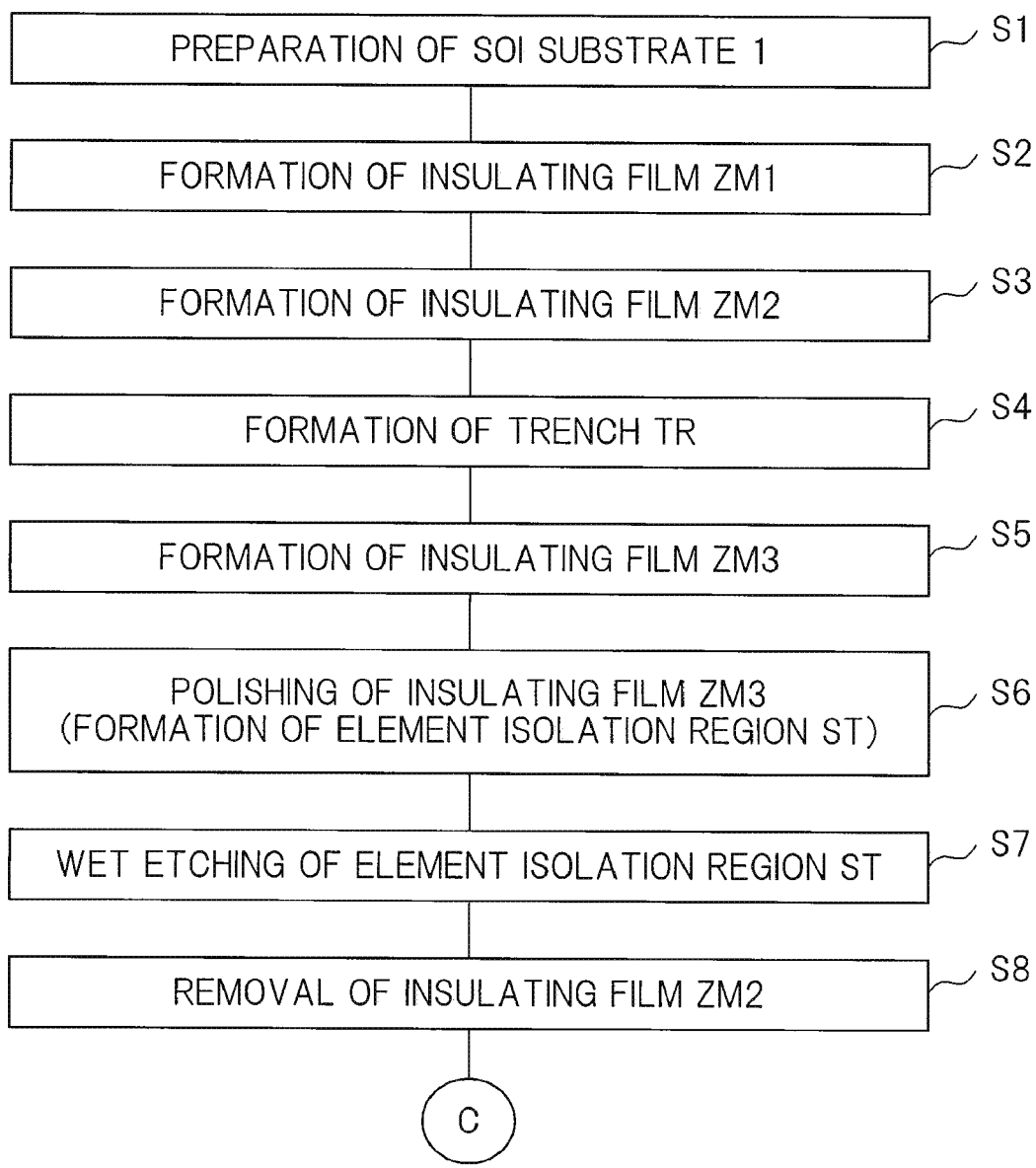
FIG. 1 is a process flow diagram showing a manufacturing process of a semiconductor device according to one embodiment.
Figure 2:
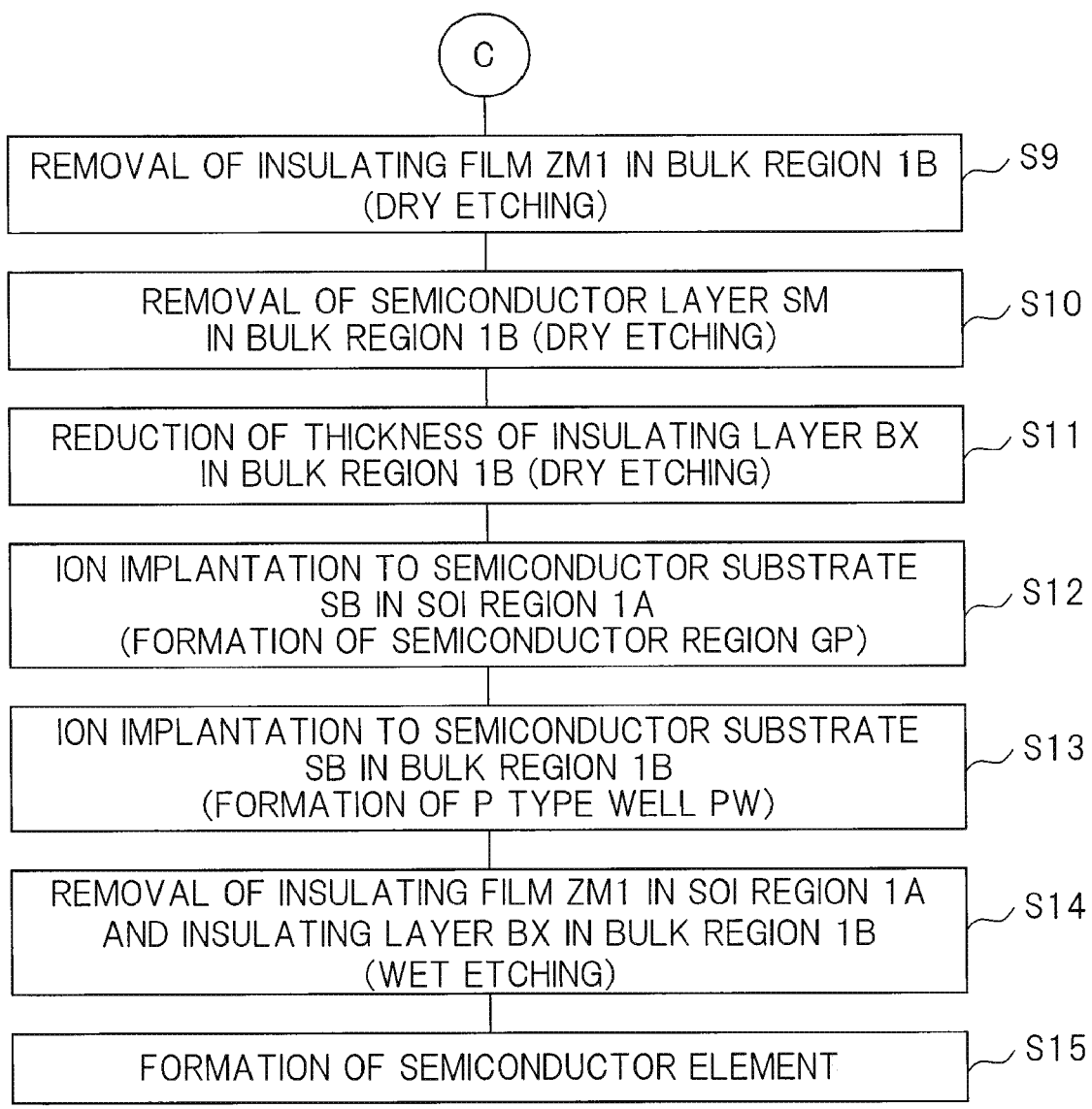
FIG. 2 is a process flow diagram showing the manufacturing process of the semiconductor device continued from FIG. 1.
Figure 24:
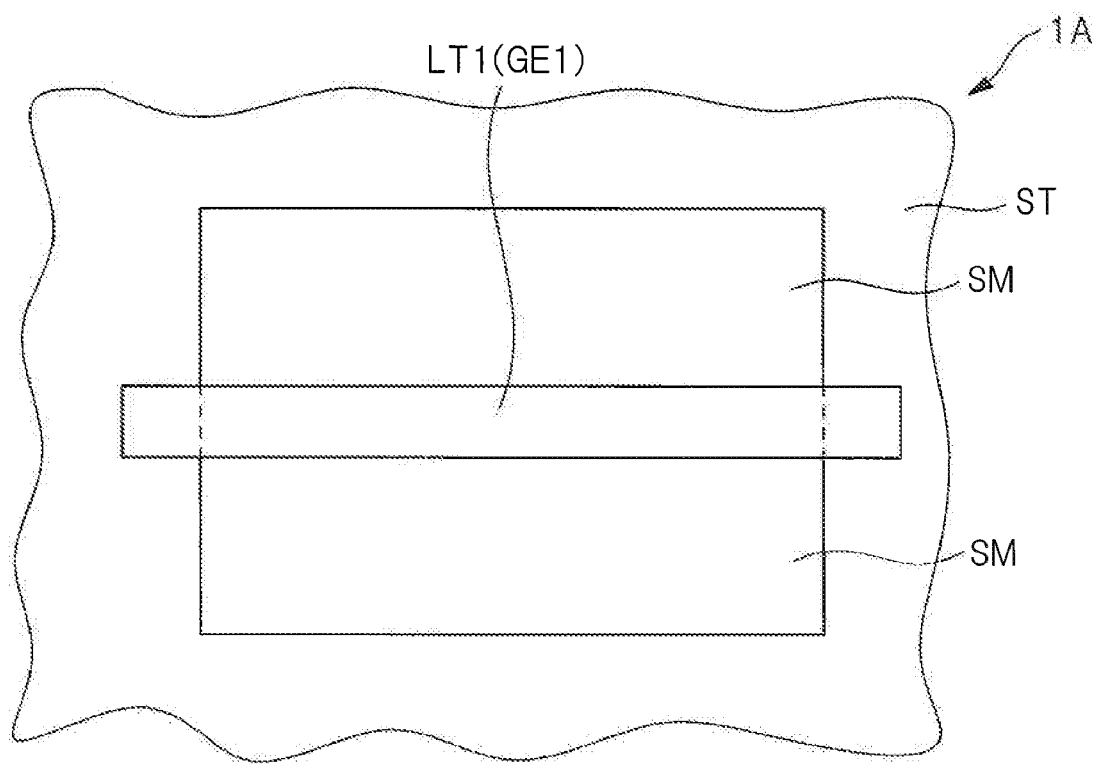
FIG. 24 is a plan view showing a principal part of the semiconductor device in the same manufacturing process as FIG. 23.
Figure 25:
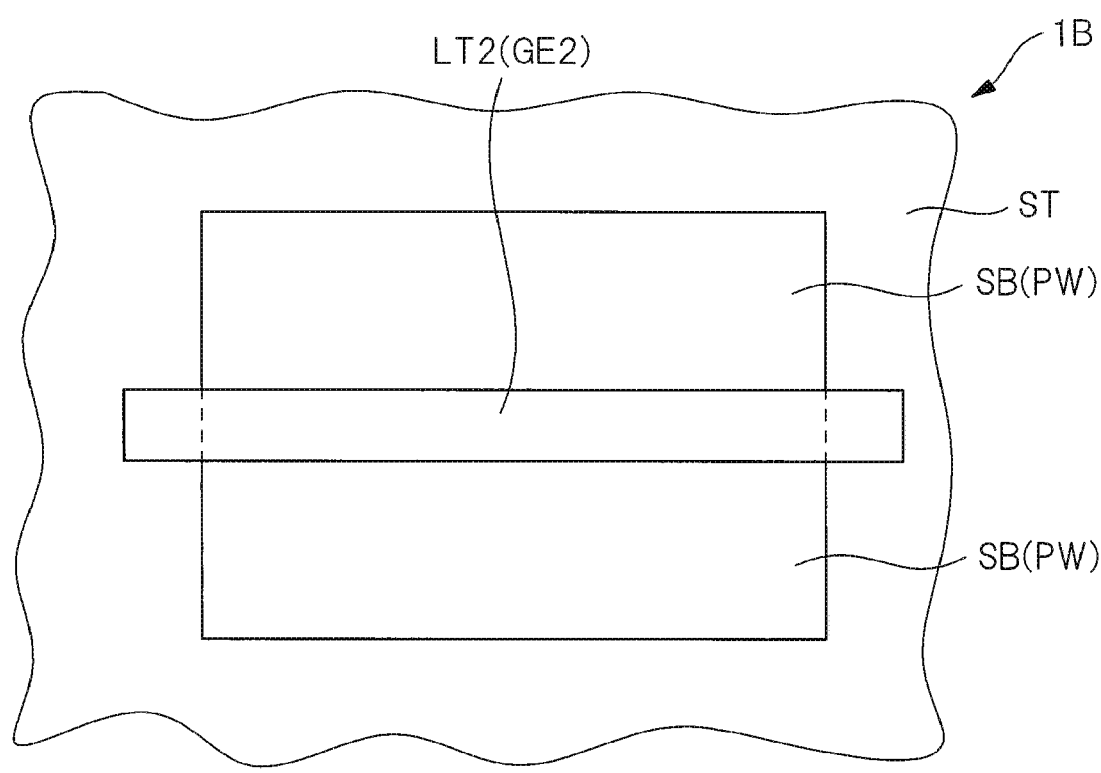
FIG. 25 is a plan view showing a principal part of the semiconductor device in the same manufacturing process as FIG. 23.

A manufacturing process of a semiconductor device according to the present embodiment will be described with reference to drawings. FIG. 1 and FIG. 2 are process flow diagrams showing a manufacturing process of a semiconductor device according to one embodiment of the present invention. FIG. 3 to FIG. 37 are cross-sectional views and plan views each showing a principal part of the semiconductor device in the manufacturing process according to one embodiment of the present invention. Note that FIG. 3 to FIG. 23 and FIG. 26 to FIG. 37 are cross-sectional views and FIG. 24 and FIG. 25 are plan views.

Figure 3:
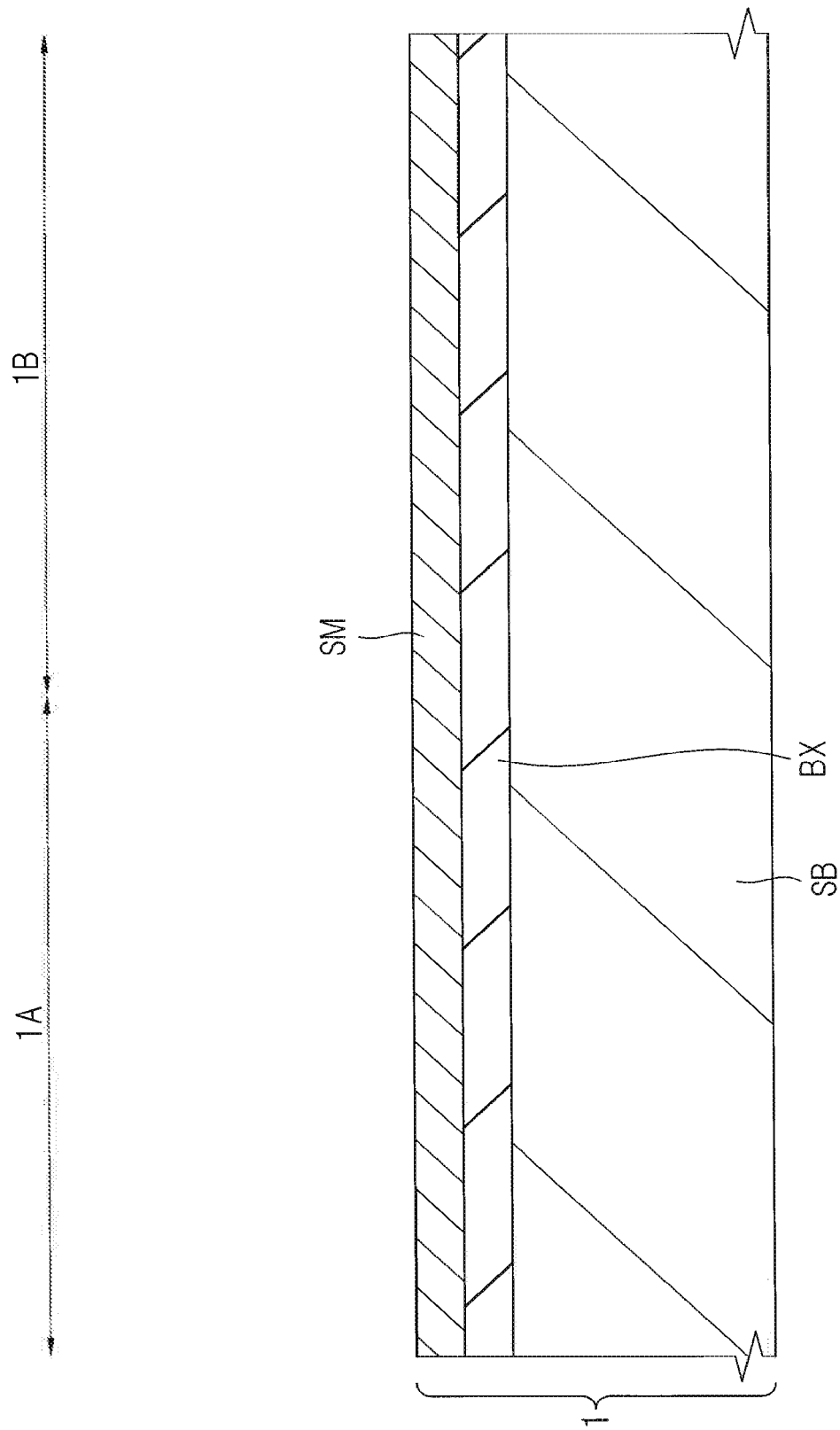
FIG. 3 is a cross-sectional view showing a principal part of the semiconductor device in the manufacturing process according to one embodiment.

First, as shown in FIG. 3, a SOI (Silicon On Insulator) substrate 1 is prepared (step S1 of FIG. 1).

The SOI substrate 1 includes a semiconductor substrate (support substrate) SB serving as a support substrate, an insulating layer (buried insulating film) BX formed on a main surface of the semiconductor substrate SB, and a semiconductor layer SM formed on an upper surface of the insulating layer BX.

The semiconductor substrate SB is a support substrate which supports the insulating layer BX and a structure above the insulating layer BX, and serves also as a semiconductor substrate. The semiconductor substrate SB is preferably a single crystal silicon substrate, and is made of, for example, p type single crystal silicon. For example, the semiconductor substrate SB can be formed of single crystal silicon with a specific resistance of about 1 to 10 Ωcm. The semiconductor substrate SB has a thickness of, for example, about 700 to 750 μm. The insulating layer BX is preferably a silicon oxide film, and the insulating layer BX has a thickness of, for example, about 10 to 30 nm. When the insulating layer BX is a silicon oxide film, the insulating layer BOX may be regarded as a BOX (Buried Oxide) layer. The semiconductor layer SM is made of single crystal silicon or the like. For example, the semiconductor layer SM can be formed of single crystal silicon with a specific resistance of about 1 to 10 Ωcm. A thickness of the semiconductor layer SM is smaller than that of the semiconductor substrate SB serving as a support substrate, and is, for example, about 15 to 25 nm. The SOI substrate 1 is comprised of the semiconductor substrate SB, the insulating layer BX and the semiconductor layer SM described above.

Note that the SOI substrate 1 has a SOI region 1A which is a region (planar region) in which the SOI structure is maintained until the semiconductor device is completed and a bulk region 1B which is a region (planar region) in which the semiconductor layer SM and the insulating layer BX are removed later and the SOI structure disappears. The SOI region 1A and the bulk region 1B are mutually different regions (planar regions). In addition, when mentioning the SOI structure, a silicon layer (single crystal silicon layer) is suitably used as the semiconductor layer on the insulating layer, but the semiconductor layer is not limited to this, and a semiconductor layer other than the single crystal silicon layer may be used in some cases.

Also, in the SOI substrate 1, one of main surfaces of the semiconductor substrate SB which is in contact with the insulating layer BX is referred to as an upper surface of the semiconductor substrate SB, and the other main surface on a side opposite to the upper surface of the semiconductor substrate SB is referred to as a rear surface of the semiconductor substrate SB. Further, in the SOI substrate 1, one of main surfaces of the insulating layer BX which is in contact with the semiconductor substrate SB is referred to as a lower surface of the insulating layer BX, and the other main surface which is in contact with the semiconductor layer SM is referred to as an upper surface of the insulating layer BX, and the upper surface and the lower surface of the insulating layer BX are surfaces opposite to each other. In addition, one of main surfaces of the semiconductor layer SM which is in contact with the insulating layer BX is referred to as a lower surface of the semiconductor layer SM, and the other main surface on a side opposite to the lower surface of the semiconductor layer SM is referred to as an upper surface of the semiconductor layer SM.

Although there is no limitation on a manufacturing method of the SOI substrate 1, the SOI substrate 1 can be manufactured by, for example, the SIMOX (Silicon Implanted Oxide) method. In the SIMOX method, $O_2$ (oxygen) is ion-implanted into a main surface of a semiconductor substrate made of silicon (Si) at high energy, and Si (silicon) and oxygen are combined by the subsequent heat treatment, thereby forming the insulating layer BX made of silicon oxide at a slightly deep position from the surface of the semiconductor substrate. In this case, a thin film of silicon (Si) remaining on the insulating layer BX serves as the semiconductor layer SM, and the semiconductor substrate below the insulating layer BX serves as the semiconductor substrate SB. Alternatively, the SOI substrate 1 may be formed by the bonding method. In the bonding method, for example, after forming the insulating layer BX by oxidizing a surface of a first semiconductor substrate made of silicon (Si), a second semiconductor substrate made of silicon (Si) is pressure-bonded to the first semiconductor substrate under high temperature, and then, the second semiconductor substrate is processed into a thin film. In this case, the thin film of the second semiconductor substrate remaining on the insulating layer BX serves as the semiconductor layer SM, and the first semiconductor substrate below the insulating layer BX serves as the semiconductor substrate SB. Furthermore, it is also possible to manufacture the SOI substrate 1 by still another method such as the smart cut process.

Figure 4:
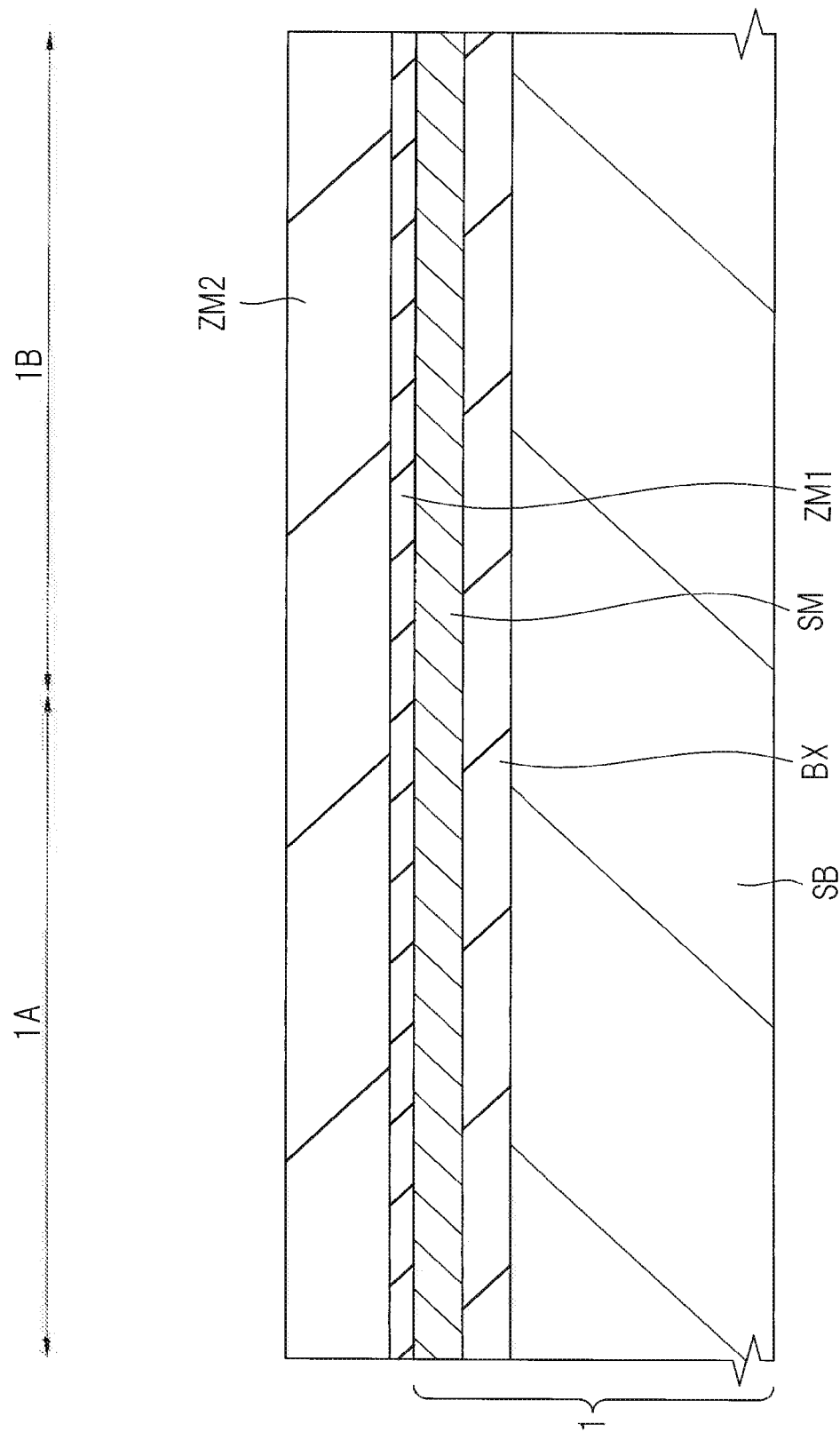
FIG. 4 is a cross-sectional view showing a principal part of the semiconductor device in the manufacturing process continued from FIG. 3.

Next, as shown in FIG. 4, an insulating film (pad insulating film) ZM1 is formed over the main surface of the SOI substrate 1, that is, over the upper surface of the semiconductor layer SM (step S2 of FIG. 1). The insulating film ZM1 is made of the same material as that of the insulating layer BX. When the insulating layer BX is made of silicon oxide, the insulating film ZM1 is also made of silicon oxide. The insulating film ZM1 can be formed by, for example, the CVD (Chemical Vapor Deposition) method. A formation thickness of the insulating film ZM1 is preferably set to be almost equal to the thickness of the insulating layer BX in the bulk region 1B at the stage when the step S11 described later is finished, and can be set to, for example, about 3 to 15 nm. Thus, it is preferable that the formation thickness of the insulating film ZM1 is smaller than the thickness of the insulating layer BX.

Next, an insulating film ZM2 is formed over the insulating film ZM1 (step S3 of FIG. 1). The insulating film ZM2 is made of a material different from that of the insulating film ZM1. When the insulating layer BX and the insulating film ZM1 are made of silicon oxide, the insulating film ZM2 is preferably made of silicon nitride. In addition, the insulating film ZM2 is made of a material different from that of an insulating film ZM3 described later. The insulating film ZM2 can be formed by, for example, the CVD method. A formation thickness of the insulating film ZM2 may be, for example, about 80 to 120 nm.

Through the process described above (steps S1 to S3), the substrate including the semiconductor substrate SB, the insulating layer BX on the semiconductor substrate SB, the semiconductor layer SM on the insulating layer BX, the insulating film ZM1 on the semiconductor layer SM, and the insulating film ZM2 on the insulating film ZM1 has been prepared.

Figure 5:
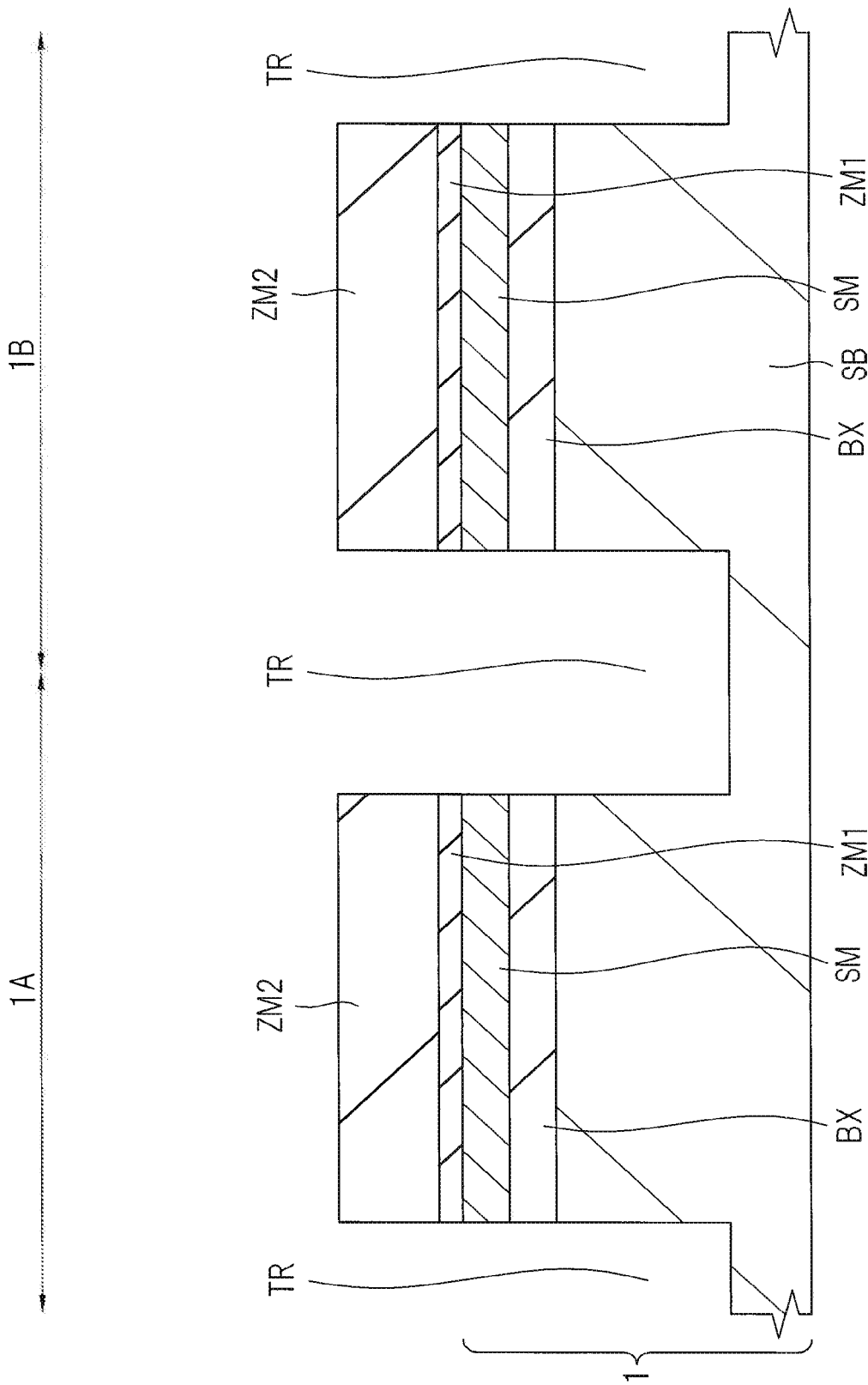
FIG. 5 is a cross-sectional view showing a principal part of the semiconductor device in the manufacturing process continued from FIG. 4.

Next, as shown in FIG. 5, a trench TR is formed (step S4 of FIG. 1). The trench TR is a trench for forming an element isolation region ST described later, that is, a trench for element isolation.

The trench TR can be formed in the following manner. That is, a photoresist pattern (not shown) is first formed over the insulating film ZM2 by the photolithography technique. This photoresist pattern has a pattern (planar shape) that exposes the insulating film ZM2 in a region where the trench TR is to be formed and covers the insulating film ZM2 in the other region. Then, the insulating film ZM2 is patterned by etching (preferably dry etching) with using the photoresist pattern as an etching mask. Consequently, the insulating film ZM2 in the region where the trench TR is to be formed is selectively removed. Subsequently, after the photoresist pattern is removed, the insulating film ZM1, the semiconductor layer SM, the insulating layer BX and the semiconductor substrate SB are etched (preferably dry-etched) with using the insulating film ZM2 as an etching mask (hard mask), thereby forming the trench TR.

The trench TR penetrates the insulating film ZM2, the insulating film ZM1, the semiconductor layer SM and the insulating layer BX, and a bottom surface (bottom part) of the trench TR reaches the semiconductor substrate SB. Namely, the bottom surface of the trench TR is located in the middle of the thickness of the semiconductor substrate SB. Accordingly, the bottom surface of the trench TR is located below the lower surface of the insulating layer BX, and the semiconductor substrate SB is exposed at the bottom surface of the trench TR. A depth of the trench TR may be, for example, about 250 to 300 nm.

Figure 6:
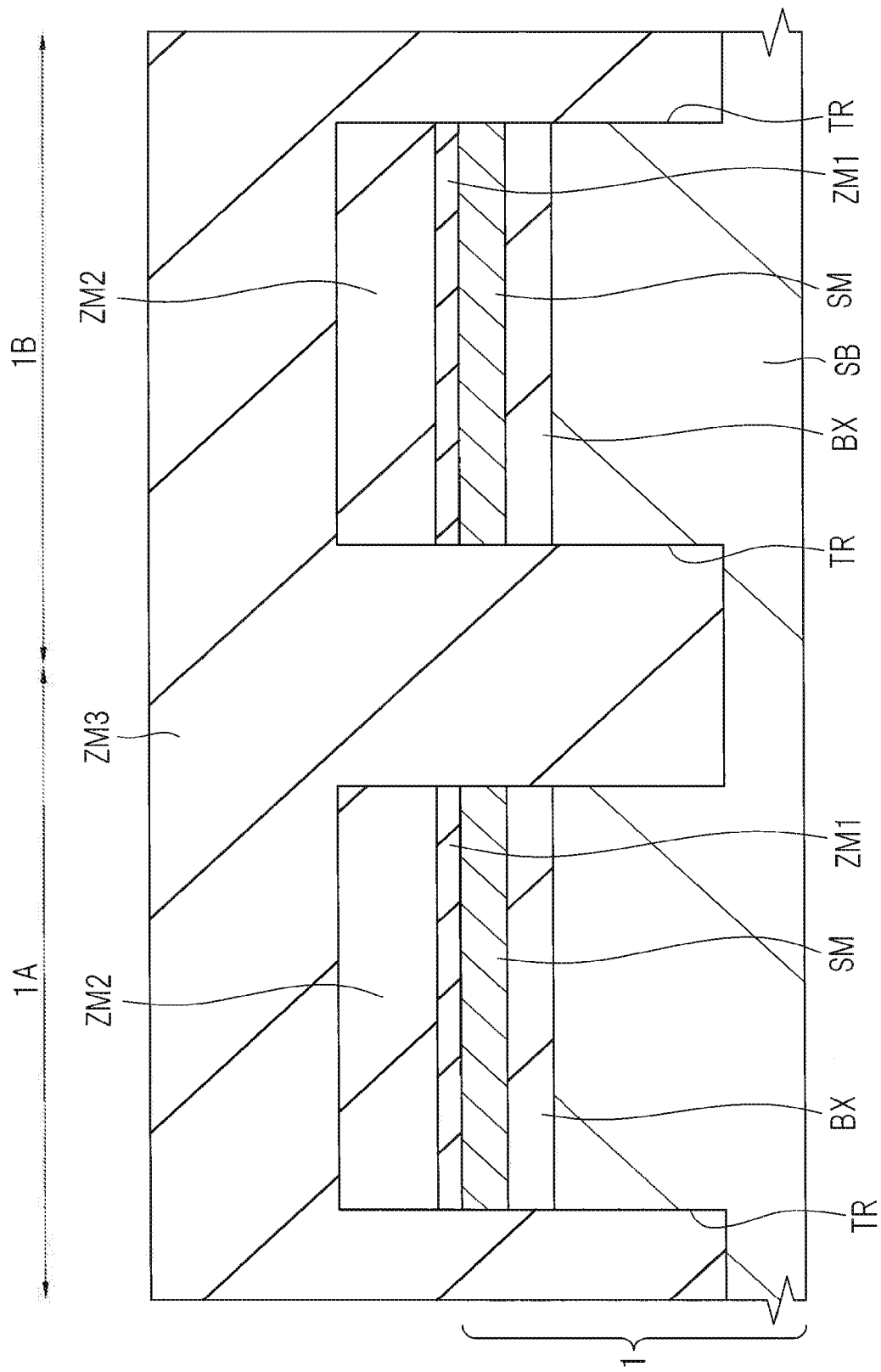
FIG. 6 is a cross-sectional view showing a principal part of the semiconductor device in the manufacturing process continued from FIG. 5.

Next, as shown in FIG. 6, an insulating film ZM3 is formed over the insulating film ZM2 so as to fill the trench TR (step S5 of FIG. 1). The insulating film ZM3 is an insulating film for forming the element isolation region ST, and is preferably a silicon oxide film. Thus, the insulating film ZM3, the insulating film ZM1 and the insulating layer BX are made of the same material, and are preferably made of silicon oxide. The insulating film ZM3 can be formed by the CVD method or the like. It is preferable that the insulating film ZM3 is formed to have a formation thickness capable of sufficiently filling the trench TR.

Figure 7:
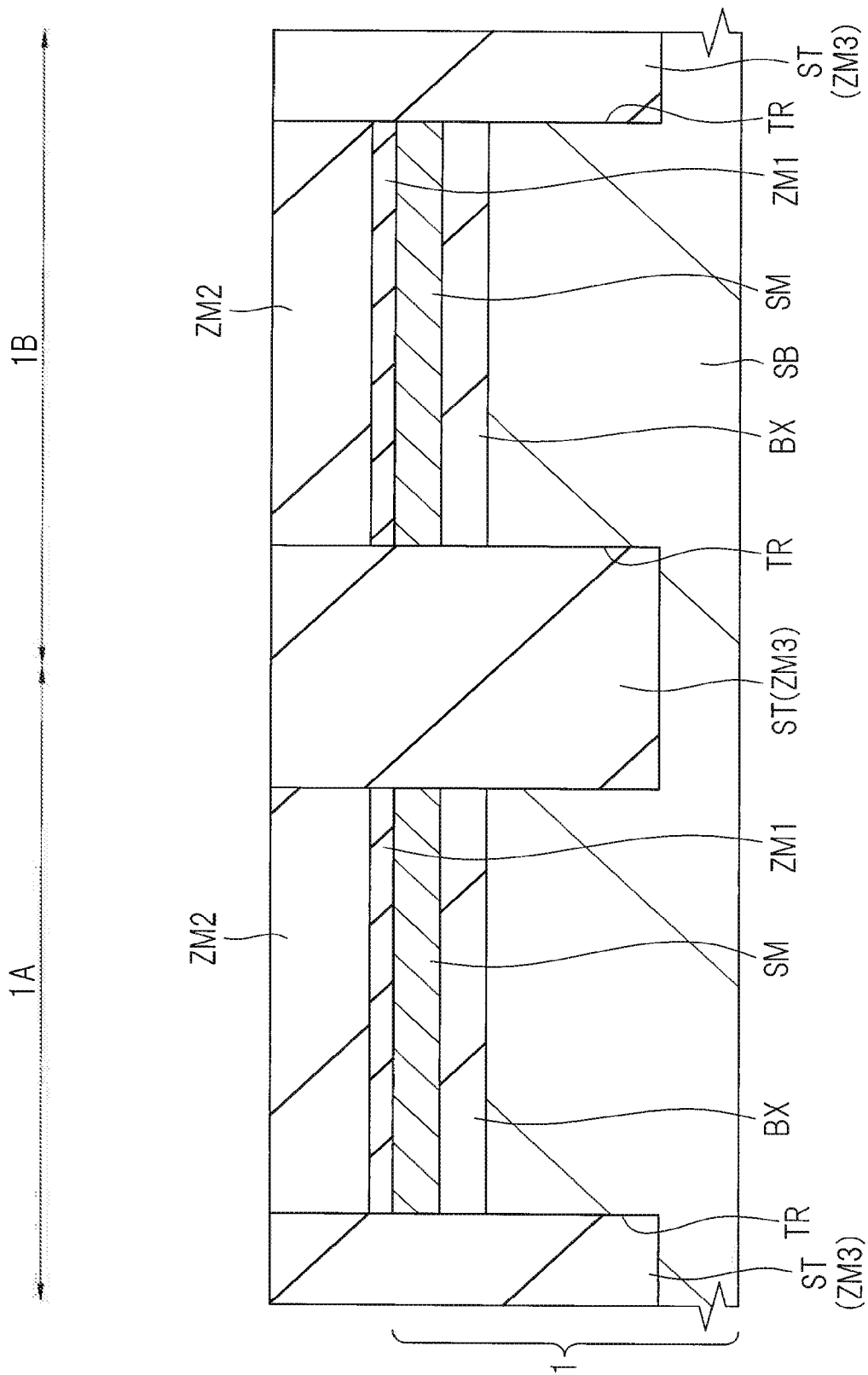
FIG. 7 is a cross-sectional view showing a principal part of the semiconductor device in the manufacturing process continued from FIG. 6.

Next, as shown in FIG. 7, the insulating film ZM3 is polished by the CMP (Chemical Mechanical Polishing) method or the like, thereby removing the insulating film ZM3 outside the trench TR and leaving the insulating film ZM3 in the trench TR (step S6 of FIG. 1). In this manner, the element isolation region ST made of the insulating film ZM3 embedded in the trench TR can be formed as shown in FIG. 7. The element isolation region ST is formed in the trench TR.

In this polishing process in the step S6, the insulating film ZM2 can function as a polishing stopper film. Namely, it is possible to make the insulating film ZM2 function as a polishing stopper film by performing the polishing process under the condition that the insulating film ZM2 is hard to be polished (etching rate thereof is lower) compared with the insulating film ZM3 in the step S6. In order to make the insulating film ZM2 function as a polishing stopper film, it is necessary that the insulating film ZM2 is formed of a material different from that of the insulating film ZM3. When the insulating film ZM3 is made of silicon oxide, the insulating film ZM2 is preferably made of silicon nitride. At the stage when the polishing process in the step S6 is finished, the upper surface of the insulating film ZM2 is exposed and the element isolation region ST is embedded in the trench TR. Also, as shown in FIG. 7, the upper surface of the element isolation region ST is located at approximately the same height position as the upper surface of the insulating film ZM2.

Figure 8:
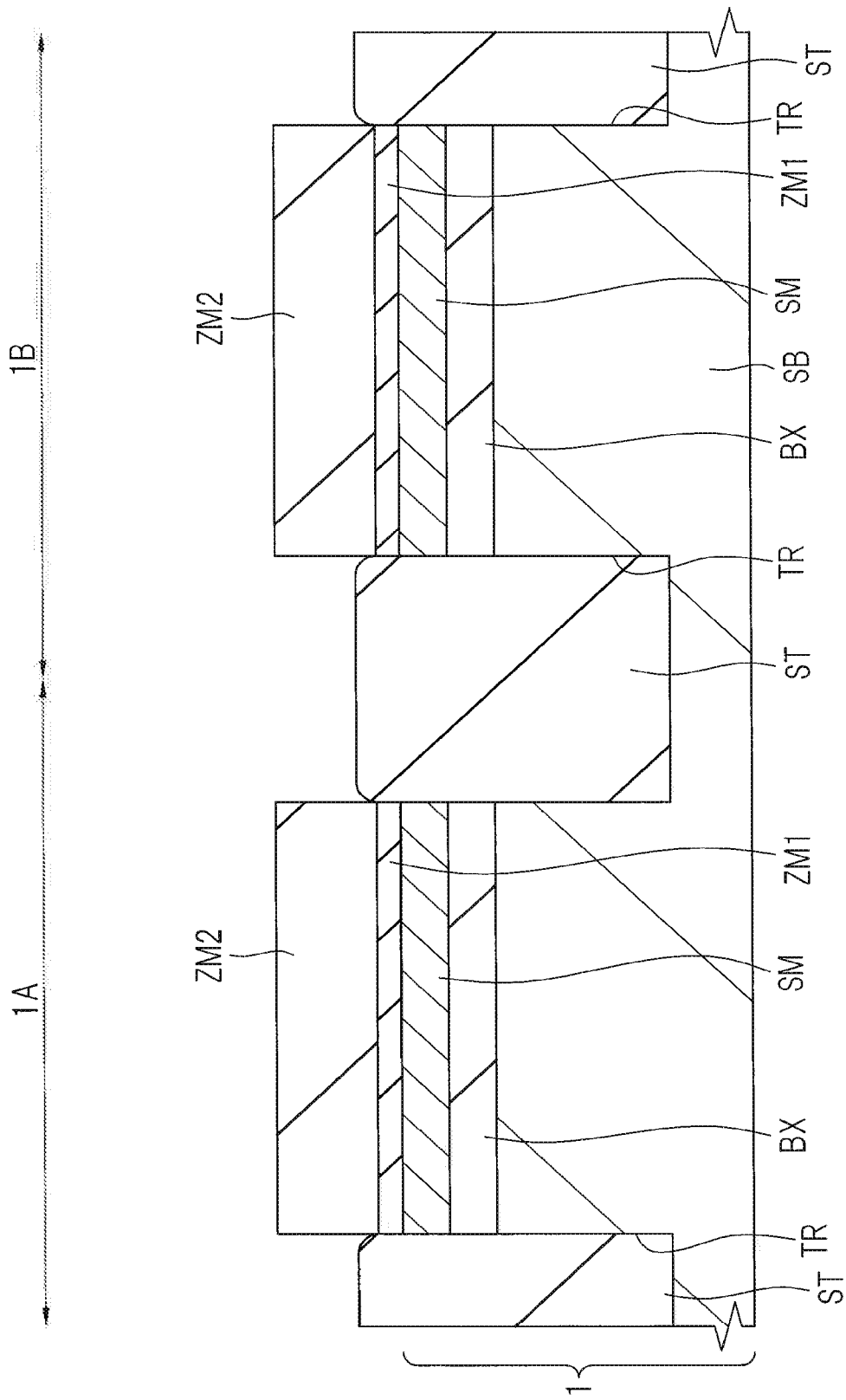
FIG. 8 is a cross-sectional view showing a principal part of the semiconductor device in the manufacturing process continued from FIG. 7.

Next, as shown in FIG. 8, an upper surface of the element isolation region ST is wet-etched to lower the height position of the upper surface of the element isolation region ST (step S7 of FIG. 1). Consequently, the height position of the upper surface of the element isolation region ST becomes lower than that of the upper surface of the insulating film ZM2 by a predetermined distance (distance in height direction). Hydrofluoric acid (Hf) can be suitably used for the wet etching in this case. At the stage when the wet etching is finished, the height position of the upper surface of the element isolation region ST is lower than that of the upper surface of the insulating film ZM2 and is almost equal to or higher than that of the upper surface of the insulating film ZM1, and it is preferable that the height position of the upper surface of the element isolation region ST is higher than that of the upper surface of the insulating film ZM1. Note that, when mentioning "hydrofluoric acid" in the present application, it includes diluted hydrofluoric acid.

Figure 9:
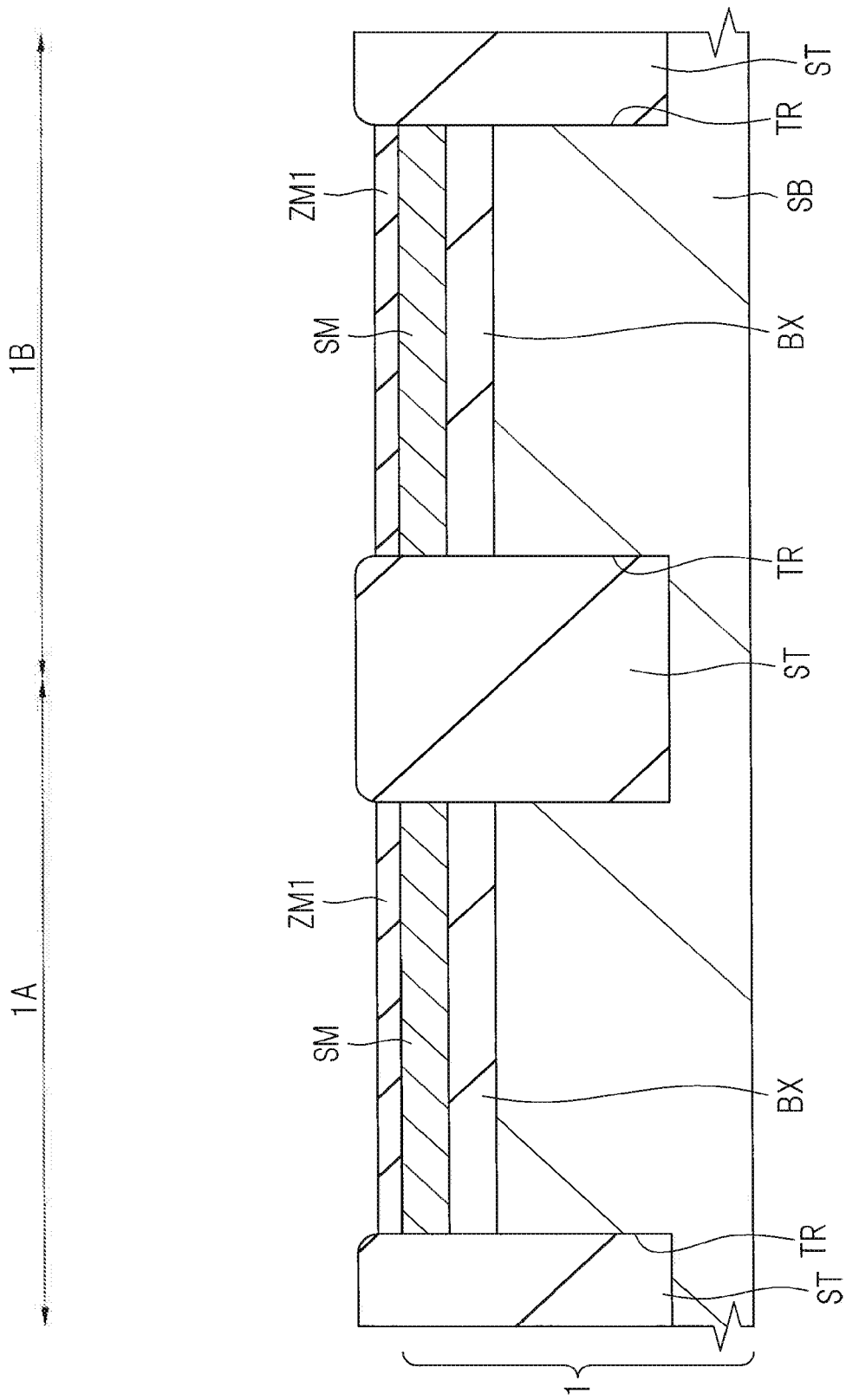
FIG. 9 is a cross-sectional view showing a principal part of the semiconductor device in the manufacturing process continued from FIG. 8.

Next, as shown in FIG. 9, the insulating film ZM2 is removed by etching (step S8 of FIG. 1). At this time, the insulating film ZM1 can be made to function as an etching stopper film. In the step S8, it is preferable that the insulating film ZM2 is removed by etching under the condition that the insulating film ZM1 and the element isolation region ST are hard to be etched compared with the insulating film ZM2. In other words, it is preferable that the insulating film ZM2 is removed by etching under the condition that the etching rate of each of the insulating film ZM1 and the element isolation region ST is lower than the etching rate of the insulating film ZM2. In this manner, the insulating film ZM2 can be selectively removed by etching while suppressing or preventing the insulating film ZM1 and the element isolation region ST from being etched.

Note that the low etching rate means that the etching is slow and has the same meaning as the small etching rate. Also, the high etching rate means that the etching is fast and has the same meaning as the large etching rate. The etching rate is high when easy to etch, and the etching rate is low when hard to etch.

Also, the wet etching can be suitably used for the etching in the step S8. When the insulating film ZM2 is made of silicon nitride and the insulating film ZM1 and the element isolation region ST are made of silicon oxide, hot phosphoric acid (heated phosphoric acid) can be suitably used as the etching solution for the wet etching in the step S8. When the insulating film ZM2 has been removed by etching in the step S8, the upper surface of the insulating film ZM1 is exposed. Namely, the insulating film ZM2 is removed and the upper surface of the insulating film ZM1 is exposed in both of the SOI region 1A and the bulk region 1B in the step S8.

In this manner, the element isolation region ST having the STI structure is formed by the STI (Shallow Trench Isolation) method. At the stage when the SOI substrate 1 is prepared, the semiconductor layer SM is formed over the entire upper surface of the semiconductor substrate SB via the insulating layer BX, but the semiconductor layer SM is separated into a plurality of regions (active regions) each surrounded by the element isolation region ST when the element isolation region ST has been formed.

The trench TR and the element isolation region ST that fills the trench TR penetrate the insulating film ZM1, the semiconductor layer SM and the insulating layer BX to reach the semiconductor substrate SB, and a lower part of the element isolation region ST is located inside the semiconductor substrate SB. Namely, the element isolation region ST is embedded in the trench TR that is formed from the insulating film ZM1 through the semiconductor layer SM and the insulating layer BX to the semiconductor substrate SB. Therefore, a part of the element isolation region ST is located below the lower surface of the insulating layer BX. Namely, the bottom surface (lower surface) of the element isolation region ST is located at a position deeper than the lower surface of the insulating layer BX, and a part (lower part) of the element isolation region ST protrudes from the lower surface of the insulating layer BX toward the lower side.

At this stage, the SOI region 1A and the bulk region 1B have the same structure. Namely, the SOI region 1A and the bulk region 1B have the structure in which the insulating layer BX, the semiconductor layer SM and the insulating film ZM1 are sequentially stacked from below over the semiconductor substrate SB. The element isolation region ST is interposed (disposed) between the SOI region 1A and the bulk region 1B in a plan view. In other words, the element isolation region ST is disposed at the boundary between the SOI region 1A and the bulk region 1B in a plan view.

Figure 10:
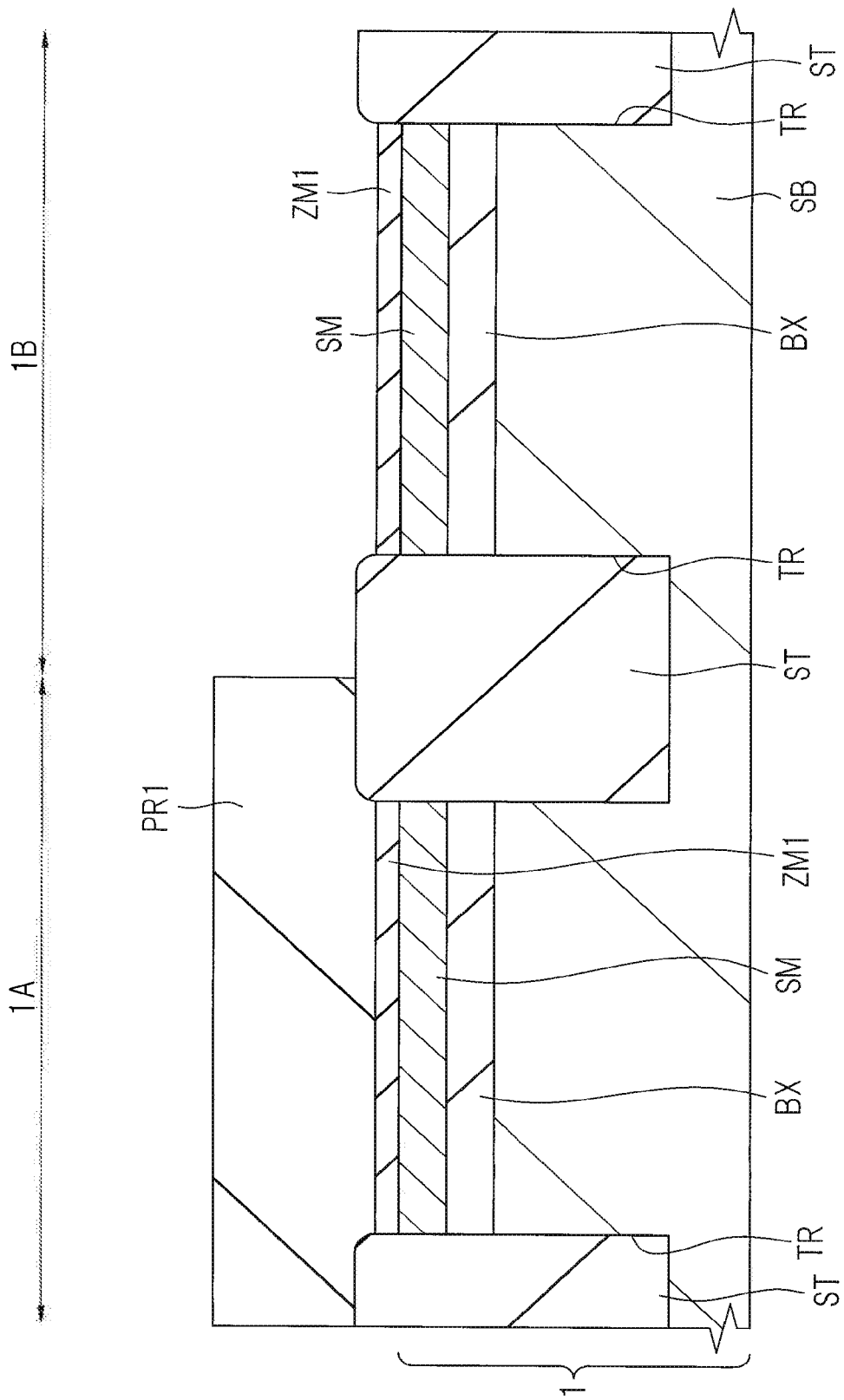
FIG. 10 is a cross-sectional view showing a principal part of the semiconductor device in the manufacturing process continued from FIG. 9.

Next, as shown in FIG. 10, a photoresist pattern (resist pattern, mask layer) PR1 which covers the SOI region 1A and exposes the bulk region 1B is formed as a mask layer over the insulating film ZM1 by the photolithography technique. The insulating film ZM1 in the SOI region 1A is covered with the photoresist pattern PR1, while the insulating film ZM1 in the bulk region 1B is exposed without being covered with the photoresist pattern PR1. An end portion (side surface) of the photoresist pattern PR1 is located on the element isolation region ST provided between the SOI region 1A and the bulk region 1B. Thus, the photoresist pattern PR1 is formed on the element isolation region ST and on the insulating film ZM1 in the SOI region 1A.

Note that the photolithography technique is a technique for obtaining a desired photoresist pattern by forming a photoresist film over the entire main surface of the substrate by a coating method or the like and then patterning the photoresist film through exposure and development.

Figure 11:
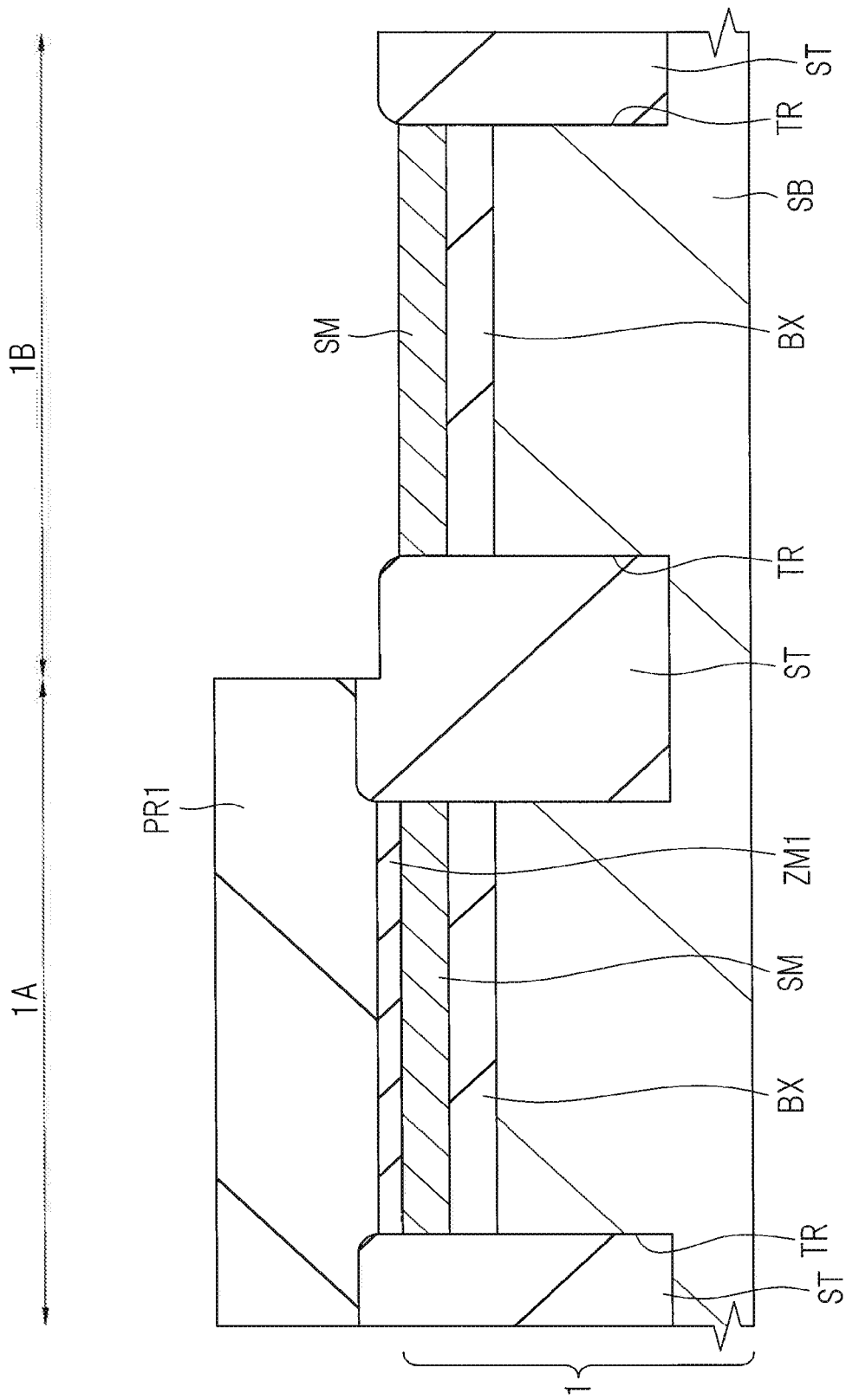
FIG. 11 is a cross-sectional view showing a principal part of the semiconductor device in the manufacturing process continued from FIG. 10.

Next, as shown in FIG. 11, the insulating film ZM1 in the bulk region 1B is removed by etching with using the photoresist pattern PR1 as an etching mask (step S9 of FIG. 2). Dry etching is used for the etching in the step S9. When the insulating film ZM1 has been removed by etching in the bulk region 1B, the upper surface of the semiconductor layer SM is exposed. Meanwhile, in the SOI region 1A, the insulating film ZM1 is covered with the photoresist pattern PR1, and thus remains without being etched. Also, a part of the element isolation region ST covered with the photoresist pattern PR1 is not etched, but another part of the element isolation region ST exposed without being covered with the photoresist pattern PR1 is etched to an extent similar to the etching thickness (etching amount) of the insulating film ZM1 in the bulk region 1B.

It is preferable that the insulating film ZM1 is removed by etching under the condition that the semiconductor layer SM is hard to be etched compared with the insulating film ZM1 in the step S9. In other words, it is preferable that the insulating film ZM1 is removed by etching under the condition that the etching rate of the semiconductor layer SM is lower than the etching rate of the insulating film ZM1 in the step S9. In this manner, the insulating film ZM1 in the bulk region 1B can be removed by etching, and the semiconductor layer SM can be made to function as an etching stopper.

Figure 12:
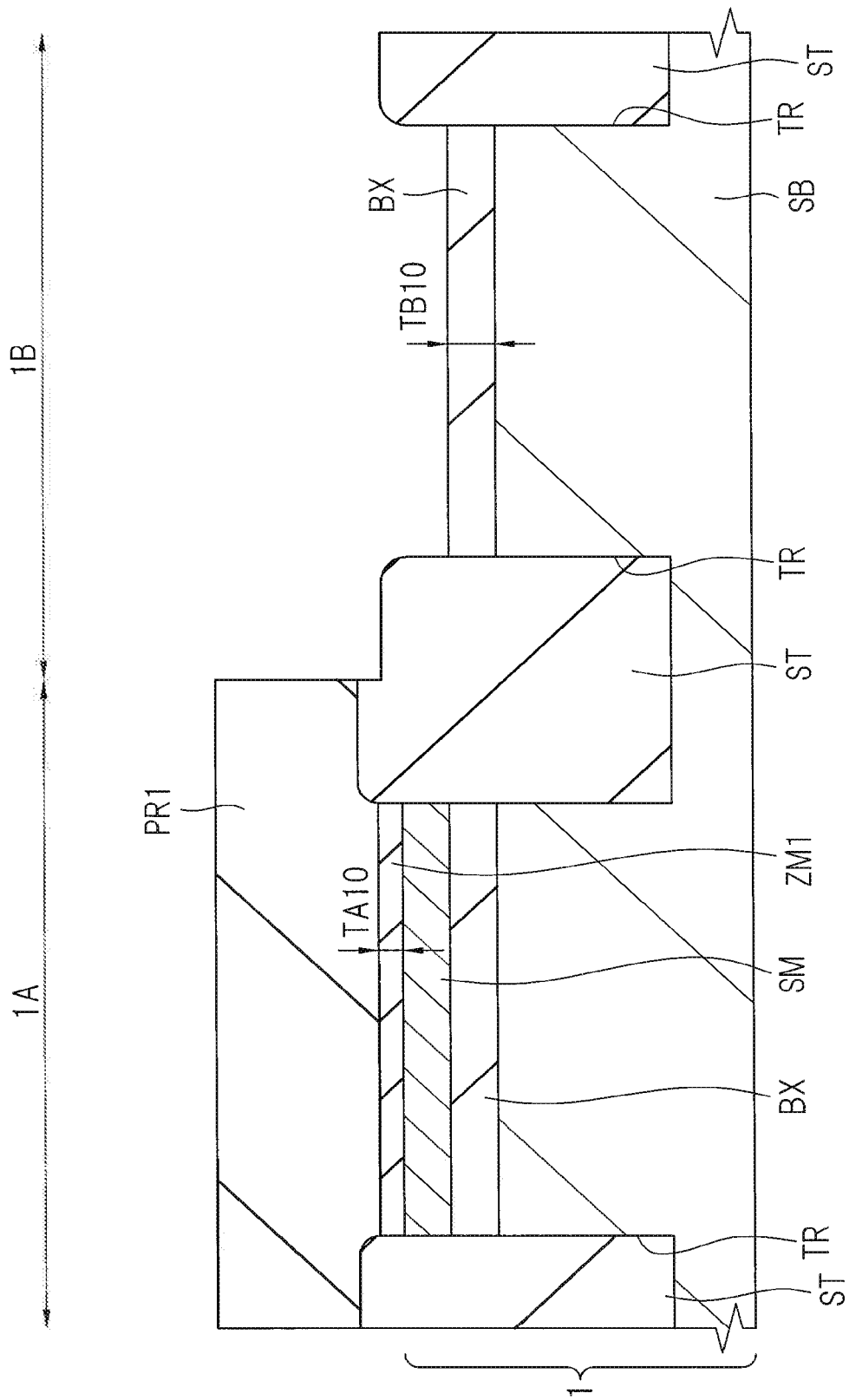
FIG. 12 is a cross-sectional view showing a principal part of the semiconductor device in the manufacturing process continued from FIG. 11.

Next, as shown in FIG. 12, the semiconductor layer SM in the bulk region 1B is removed by etching with using the photoresist pattern PR1 as an etching mask (step S10 of FIG. 2). Dry etching is used for the etching in the step S10. When the semiconductor layer SM has been removed by etching in the bulk region 1B, the upper surface of the insulating layer BX is exposed. Meanwhile, the insulating film ZM1 and the semiconductor layer SM are covered with the photoresist pattern PR1 in the SOI region 1A, and thus remain without being etched.

It is preferable that the semiconductor layer SM in the bulk region 1B is removed by etching under the condition that the insulating layer BX and the element isolation region ST are hard to be etched compared with the semiconductor layer SM in the step S10. In other words, it is preferable that the semiconductor layer SM in the bulk region 1B is removed by etching under the condition that the etching rate of each of the insulating layer BX and the element isolation region ST is lower than the etching rate of the semiconductor layer SM in the step S10. In this manner, the semiconductor layer SM in the bulk region 1B can be removed by etching and the insulating layer BX in the bulk region 1B can be made to function as an etching stopper, and it is possible to suppress or prevent the element isolation region ST from being etched.

Since the objects to be etched are different in the step S9 and the step S10, the etching gas used in the step S10 is different from the etching gas used in the step S9. Namely, the step S9 is the process of positively (intentionally) etching the insulating film ZM1 in the bulk region 1B, and the step S10 is the process of positively (intentionally) etching the semiconductor layer SM in the bulk region 1B. When the semiconductor layer SM is made of silicon and the insulating film ZM1, the insulating layer BX and the element isolation region ST are made of silicon oxide, mixed gas of $CF_4$ gas and $CHF_3$ gas or the like is suitably used as the etching used in the step S9, and $SF_6$ gas or the like is suitably used as the etching used in the step S10.

Figure 13:
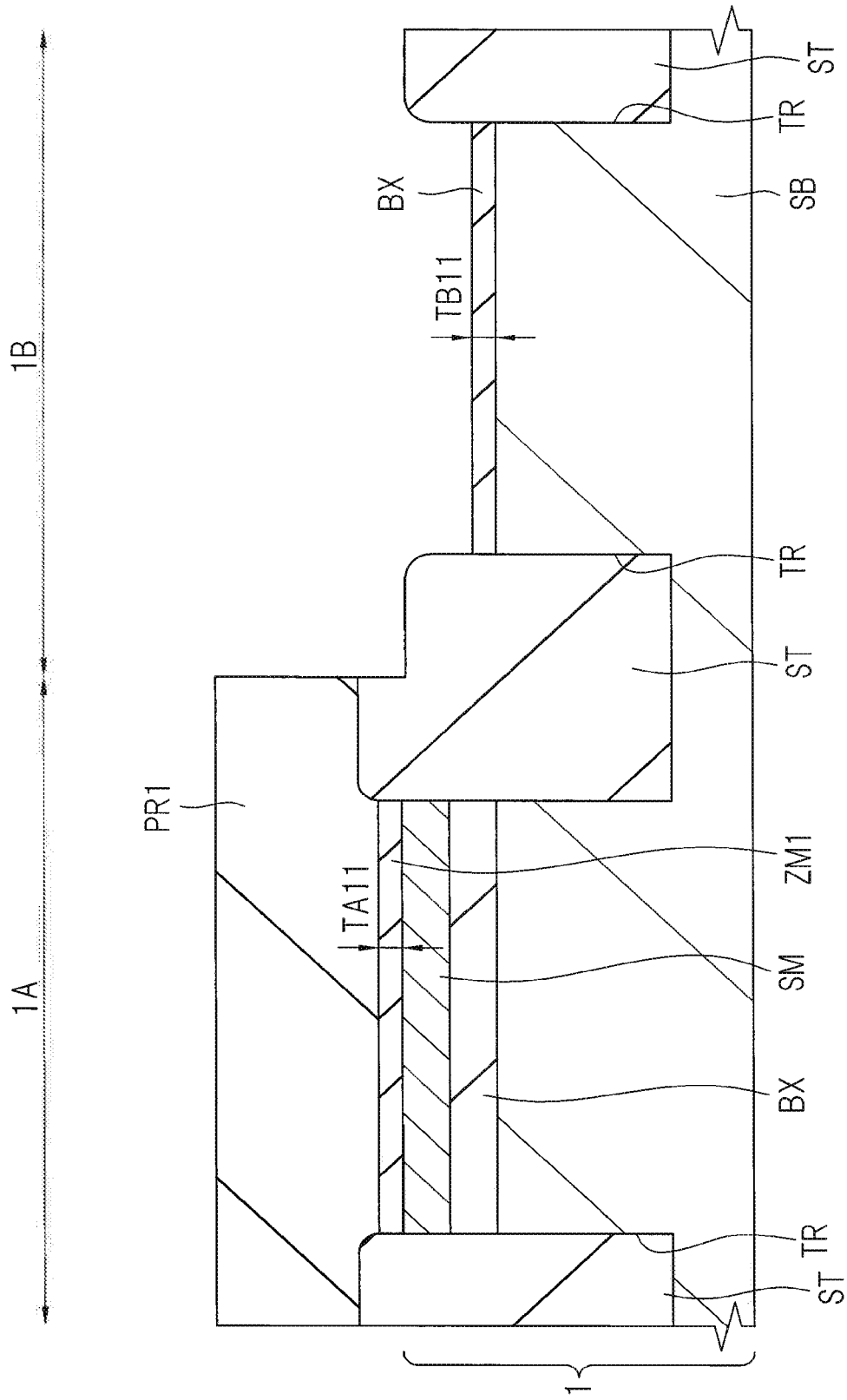
FIG. 13 is a cross-sectional view showing a principal part of the semiconductor device in the manufacturing process continued from FIG. 12.

Next, as shown in FIG. 13, the thickness of the insulating layer BX in the bulk region 1B is reduced by etching the insulating layer BX in the bulk region 1B with using the photoresist pattern PR1 as an etching mask (step S11 of FIG. 2). Dry etching is used for the etching in the step S11.

Note that FIG. 12 shows the stage after the etching in the step S10 is finished and before the etching process in the step S11 is performed, and FIG. 13 shows the stage when the etching process in the step S11 is finished.

When the etching process in the step S11 has been performed, the insulating layer BX is etched and the thickness thereof is reduced in the bulk region 1B. Meanwhile, in the SOI region 1A, the insulating film ZM1, the semiconductor layer SM and the insulating layer BX are covered with the photoresist pattern PR1, and thus remain without being etched.

Since the objects to be etched are different in the step S10 and the step S11, the etching gas used in the step S11 is different from the etching gas used in the step S10. Namely, the step S10 is the process of positively (intentionally) etching the semiconductor layer SM in the bulk region 1B, and the step S11 is the process of positively (intentionally) etching the insulating layer BX in the bulk region 1B. When the insulating layer BX is made of silicon oxide, mixed gas of $CF_4$ gas and HBr gas or the like is suitably used as the etching used in the dry etching in the step S11.

Since the semiconductor layer SM is the object to be etched in the step S10, the etching condition that the semiconductor layer SM is easy to be etched (etching gas or the like), that is, the etching condition that the etching rate of the semiconductor layer SM is high to some extent (etching gas or the like) is used. Meanwhile, since the insulating layer BX is the object to be etched in the step S11, the etching condition that the insulating layer BX is easy to be etched (etching gas or the like), that is, the etching condition that the etching rate of the insulating layer BX is high to some extent (etching gas or the like) is used.

Therefore, the etching rate of the insulating layer BX in the case of using the etching condition (etching gas or the like) used in the step S11 is higher than the etching rate of the insulating layer BX in the case of using the etching condition (etching gas or the like) used in the step S10. Namely, the etching rate of the insulating layer BX in the bulk region 1B in the etching process in the step S11 is higher than the etching rate of the insulating layer BX in the bulk region 1B in the etching process in the step S10.

Also, since the etching condition that the semiconductor layer SM is easy to be etched compared with the insulating layer BX (etching gas or the like) is used in the etching process in the step S10, the etching rate of the insulating layer BX is lower than the etching rate of the semiconductor layer SM. Meanwhile, since the purpose of the etching process in the step S11 is to etch the insulating layer BX, the etching condition that the insulating layer BX is easy to be etched compared with the semiconductor layer SM (etching gas or the like), that is, the etching condition that the etching rate of the insulating layer BX is higher than the etching rate of the semiconductor layer SM (etching gas or the like) is used. However, the semiconductor layer SM in the bulk region 1B has already been removed in the step S10, and is thus not etched in the step S11 in practice.

The etching in the step S11 is performed to reduce the thickness of the insulating layer BX in the bulk region 1B. Therefore, a surface layer portion of the insulating layer BX in the bulk region 1B is removed by etching in the step S11. Namely, the etching in the step S11 is finished before the thickness of the insulating layer BX is all removed and the semiconductor substrate SB is exposed in the bulk region 1B. The etching amount (etching thickness) of the insulating layer BX in the bulk region 1B in the step S11 is smaller than a thickness TB10 of the insulating layer BX in the bulk region 1B immediately before performing the step S11. Therefore, the insulating layer BX remains in the form of a layer in the bulk region 1B not only immediately before performing the etching in the step S11 but also immediately after performing the etching in the step S11. Accordingly, the semiconductor substrate SB is not exposed in the bulk region 1B not only immediately before performing the etching in the step S11 but also immediately after performing the etching in the step S11. In addition, in the step S11, a part of the element isolation region ST covered with the photoresist pattern PR1 is not etched, but another part of the element isolation region ST exposed without being covered with the photoresist pattern PR1 is etched to an extent similar to the etching thickness (etching amount) of the insulating layer BX in the bulk region 1B.

A thickness TB11 of the insulating layer BX in the bulk region 1B immediately after the etching in the step S11 is finished is smaller than the thickness TB10 of the insulating layer BX in the bulk region 1B immediately before performing the etching in the step S11 (that is, 0<TB11<TB10).

In addition, even after the etching process in each of the steps S9, S10 and S11 is performed, the insulating film ZM1 in the SOI region 1A is not etched, and the thickness of the insulating film ZM1 in the SOI region 1A does not change. Therefore, a thickness TA11 of the insulating film ZM1 in the SOI region 1A immediately after the etching in the step S11 is finished is equal to a thickness TA10 of the insulating film ZM1 in the SOI region 1A immediately before performing the etching in the step S11 (that is, TA11=TA10).

The thickness TB11 of the insulating layer BX in the bulk region 1B is preferably almost equal to the thickness TA11 of the insulating film ZM1 in the SOI region 1A at the stage when the etching in the step S11 is finished, and can be set to, for example, about 3 to 15 nm.

Note that the structure immediately before performing the etching in the step S11 (that is, structure immediately after the etching in the step S10 is finished) corresponds to FIG. 12, and the structure immediately after the etching in the step S11 is finished corresponds to FIG. 13. Therefore, the thickness TB10 of the insulating layer BX in the bulk region 1B and the thickness TA10 of the insulating film ZM1 in the SOI region 1A immediately before performing the etching in the step S11 are shown in FIG. 12, and the thickness TB11 of the insulating layer BX in the bulk region 1B and the thickness TA11 of the insulating film ZM1 in the SOI region 1A immediately after the etching in the step S11 is finished are shown in FIG. 13. Also, the thickness TB10 of the insulating layer BX in the bulk region 1B immediately before performing the step S11 is substantially equal to the thickness of the insulating layer BX in the bulk region 1B immediately after the etching in the step S10 is finished. In addition, the thickness TA10 of the insulating film ZM1 in the SOI region 1A immediately before performing the step S11 is substantially equal to the thickness of the insulating film ZM1 in the SOI region 1A immediately after the etching in the step S10 is finished.

The etching process in the step S9, the etching process in the step S10 and the etching process in the step S11 can be successively performed without exposing the SOI substrate 1 to atmosphere.

Figure 14:
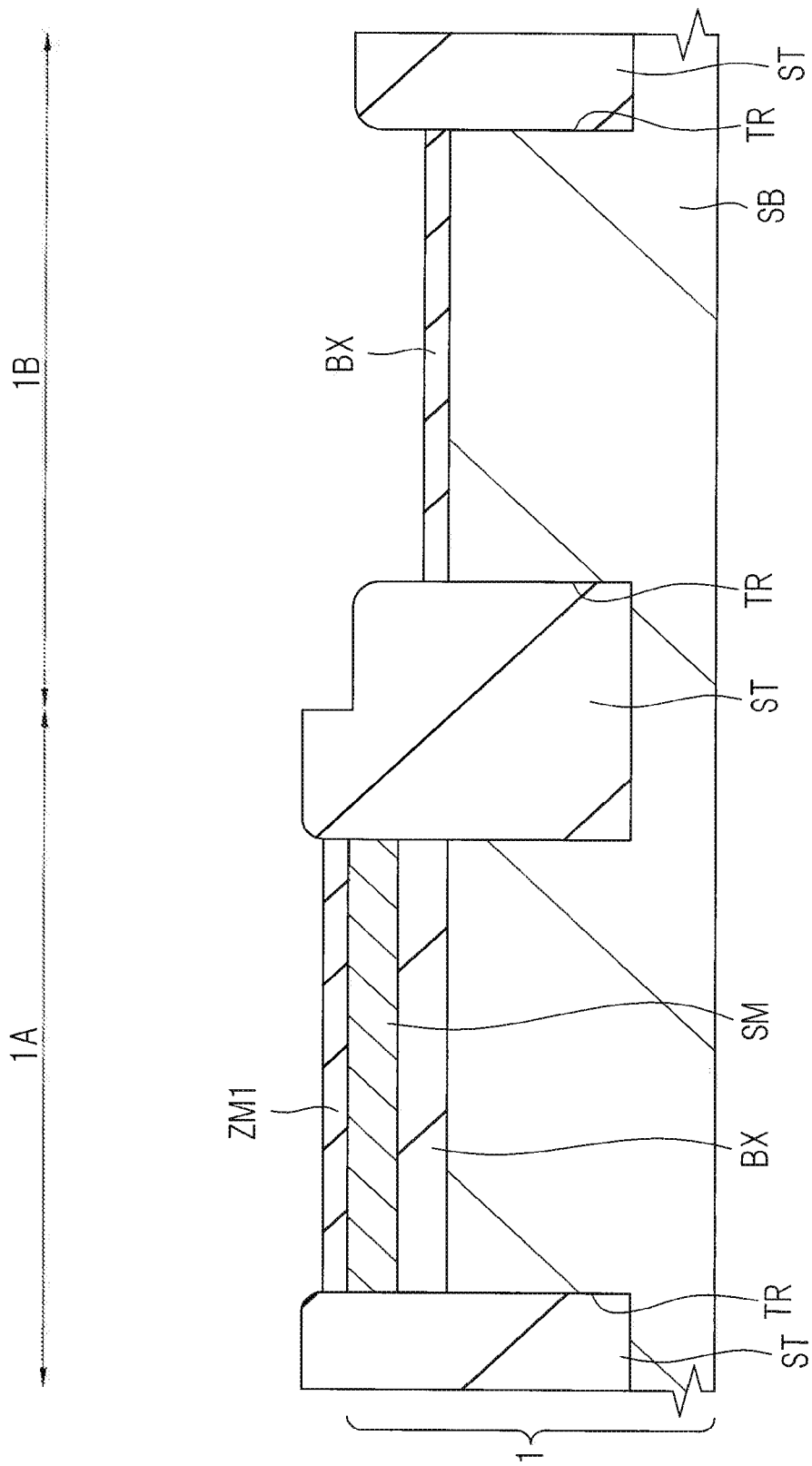
FIG. 14 is a cross-sectional view showing a principal part of the semiconductor device in the manufacturing process continued from FIG. 13.

After the etching process in the step S11 is performed, the photoresist pattern PR1 is removed by ashing or the like as shown in FIG. 14.

At this stage, the insulating film ZM1 remains and the upper surface of the insulating film ZM1 is exposed in the SOI region 1A, while the upper surface of the insulating layer BX is exposed in the bulk region 1B as shown in FIG. 14.

Figure 15:
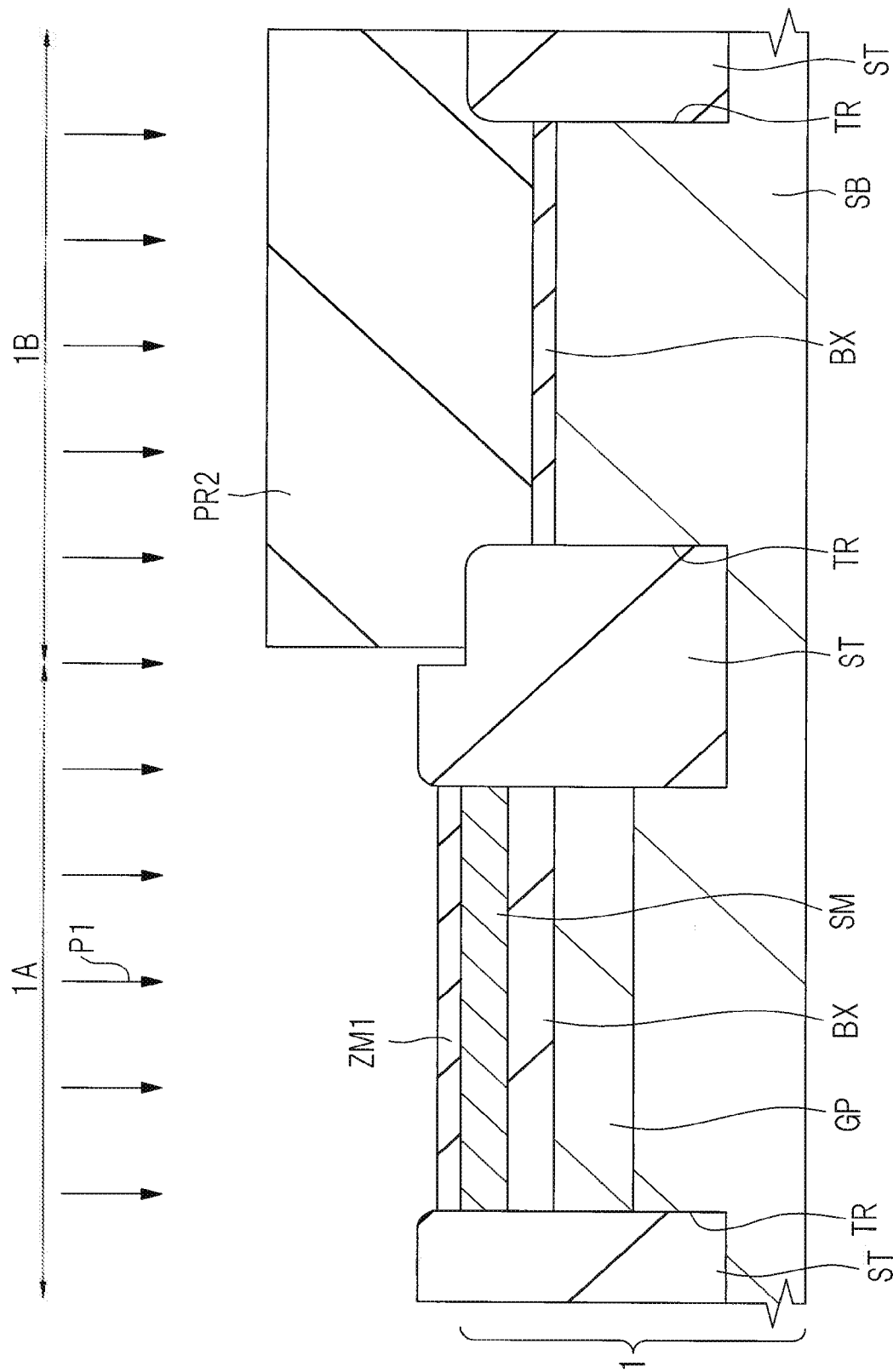
FIG. 15 is a cross-sectional view showing a principal part of the semiconductor device in the manufacturing process continued from FIG. 14.

Next, as shown in FIG. 15, a photoresist pattern (resist pattern, mask layer) PR2 which covers the bulk region 1B and exposes the SOI region 1A is formed as a mask layer over the SOI substrate 1 by the photolithography technique. The insulating layer BX in the bulk region 1B is covered with the photoresist pattern PR2, while the insulating film ZM1 in the SOI region 1A is exposed without being covered with the photoresist pattern PR2. An end portion (side surface) of the photoresist pattern PR2 is located on the element isolation region ST provided at the boundary between the SOI region 1A and the bulk region 1B. Thus, the photoresist pattern PR2 is formed on the element isolation region ST and on the insulating layer BX in the bulk region 1B.

Next, ion implantation for adjusting a threshold value is performed to the semiconductor substrate SB in the SOI region 1A with using the photoresist pattern PR2 as a mask (ion implantation blocking mask) (step S12 of FIG. 2). This ion implantation performed in the step S12 is schematically indicated by arrows in FIG. 15, and is hereinafter referred to as ion implantation P1. Also, in FIG. 15, the region in which an impurity has been introduced by the ion implantation P1 is denoted by a reference character GP and is illustrated as a semiconductor region (impurity diffusion layer) GP. The impurity is introduced into the semiconductor substrate SB in the SOI region 1A by the ion implantation P1 in the step S12, thereby forming the semiconductor region GP. Also, since the photoresist pattern PR2 functions as the ion implantation blocking mask in the ion implantation P1, the impurity is not introduced into the SOI substrate 1 in the bulk region 1B (semiconductor substrate SB in the bulk region 1B).

The ion implantation P1 is performed for controlling the threshold voltage of the MISFET to be formed later in the SOI region 1A, and the semiconductor region GP is formed to control the threshold voltage of the MISFET formed in the SOI region 1A. In the manufactured semiconductor device, the threshold voltage of the MISFET formed in the SOI region 1A can be controlled by applying a predetermined voltage to the semiconductor region GP formed in the semiconductor substrate SB in the SOI region 1A.

In the ion implantation P1, impurity ions are introduced into the semiconductor substrate SB of the SOI substrate 1 in the SOI region 1A, but it is desirable that impurity ions are not introduced into the semiconductor layer SM of the SOI substrate 1. This is because the impurity ions implanted into the semiconductor layer SM in the SOI region 1A by the ion implantation P1 cause the variation in electrical characteristics of the MISFET to be formed later in the SOI region 1A. Therefore, it is preferable that the ion implantation P1 is performed at the high implantation energy capable of passing the impurity ions through the semiconductor layer SM. The implantation energy of the ion implantation P1 is adjusted depending on the thickness of the insulating film ZM1, the thickness of the semiconductor layer SM and the thickness of the insulating layer BX, and is preferably set such that the range (distance) of the impurity ions reaches at least the inside of the semiconductor substrate SB. Accordingly, it is possible to implant the impurity ions into the semiconductor substrate SB in the SOI region 1A by the ion implantation P1 without implanting the impurity ions into the semiconductor layer SM in the SOI region 1A.

Also, in the ion implantation P1, an impurity is ion-implanted into the semiconductor substrate SB below the insulating layer BX in the SOI region 1A, and it is preferable that impurity ions are implanted also into a region close to the insulating layer BX (region adjacent to the insulating layer BX) in the semiconductor substrate SB. Namely, it is preferable that the semiconductor region GP formed in the semiconductor substrate SB is in contact with (adjacent to) the insulating layer BX. The threshold value of the MISFET to be formed later in the SOI region 1A can be controlled by adjusting the impurity concentration of the semiconductor region GP by the implantation amount (dose amount) of the ion implantation P1. Therefore, in the manufactured semiconductor device, an impurity is introduced into the region (corresponding to the semiconductor region GP) adjacent to the insulating layer BX in the semiconductor substrate SB in the SOI region 1A. The photoresist pattern PR2 is removed after the ion implantation P1.

It is preferable to prevent the impurity ions from being implanted into the semiconductor layer SM of the SOI substrate 1 as much as possible in the ion implantation P1 in the step S12. For this purpose, however, considerably high ion implantation energy is needed. Also, the dose amount of the ion implantation P1 is considerably large, and is about ten times as large as the dose amount of the standard channel-dope ion implantation. One example of the dose amount of the ion implantation P1 is about $1 \times 10^{12}$ to $1 \times 10^{14}/cm^2$. Therefore, in the ion implantation P1, impurity ions are considerably implanted also into a part of the element isolation region ST that is not covered with the photoresist pattern PR2. Namely, in the ion implantation P1, impurity ions are considerably implanted also into the element isolation region ST in the region adjacent to the semiconductor layer SM in the SOI region 1A in a plan view. When impurity ions are implanted by ion implantation into the element isolation region ST, the element isolation region ST becomes susceptible to etching, and the etching rate thereof is likely to be high in the etching process performed later in the step S14. However, in the present embodiment, the thickness of the insulating layer BX in the bulk region 1B is reduced by the etching process in the step S11, and it is thus possible to suppress the etching amount in the step S14 described later. Accordingly, it is possible to suppress or prevent the element isolation region ST from being excessively etched. Therefore, it is possible to suppress or prevent a divot DT described later from being formed in the element isolation region ST in the step S14 described later.

Note that, after the element isolation region ST is formed in the step S6, the ion implantation process is not performed to the SOI substrate 1 until the etching process in the step S11 is finished. Therefore, the etching process in each of the steps S9, S10 and S11 is performed in the state where an impurity is not ion-implanted into the element isolation region ST. Meanwhile, since the ion implantation process (steps S12 and S13) is performed to the SOI substrate 1 after the etching process in the step S11 is finished and before the etching in the step S14 is performed, the etching process in the step S14 is performed in the state where an impurity has been ion-implanted into the element isolation region ST.

Also, a p type impurity (for example, boron) or an n type impurity (for example, phosphorus or arsenic) is ion-implanted in the ion implantation P1. When a p type impurity is ion-implanted in the ion implantation P1, the semiconductor region GP is a p type semiconductor region into which the p type impurity has been introduced. Also, when an n type impurity is ion-implanted in the ion implantation P1, the semiconductor region GP is an n type semiconductor region into which the n type impurity has been introduced. When the MISFET formed in the SOI region 1A is an n channel MISFET, the impurity implanted in the ion implantation P1 is preferably a p type impurity. Consequently, even when impurity ions are implanted into not only the semiconductor substrate SB but also the semiconductor layer SM in the ion implantation P1, the failure associated therewith is less likely to occur.

Further, it is not desirable that a photoresist pattern is directly formed over the surface of the semiconductor layer SM (silicon surface) and over the surface of the semiconductor substrate SB (silicon surface). In the present embodiment, the photoresist patterns PR1 and PR2 and a photoresist pattern PR3 describe later are formed in the state where the semiconductor layer SM and the semiconductor substrate SB are not exposed, and it is thus possible to prevent the photoresist patterns PR1, PR2 and PR3 from being in contact with the surface of the semiconductor substrate SB (silicon surface) and the surface of the semiconductor layer SM (silicon surface).

Even at the stage when the step S12 is finished, the state where the insulating film ZM1 remains in the form of a layer and the upper surface of the insulating film ZM1 is exposed is maintained in the SOI region 1A. Also, in the bulk region 1B, the state where the insulating layer BX remains in the form of a layer and the upper surface of the insulating layer BX is exposed is maintained. The semiconductor layer SM is not exposed in the SOI region 1A, and the semiconductor substrate SB is not exposed in the bulk region 1B.

Figure 16:
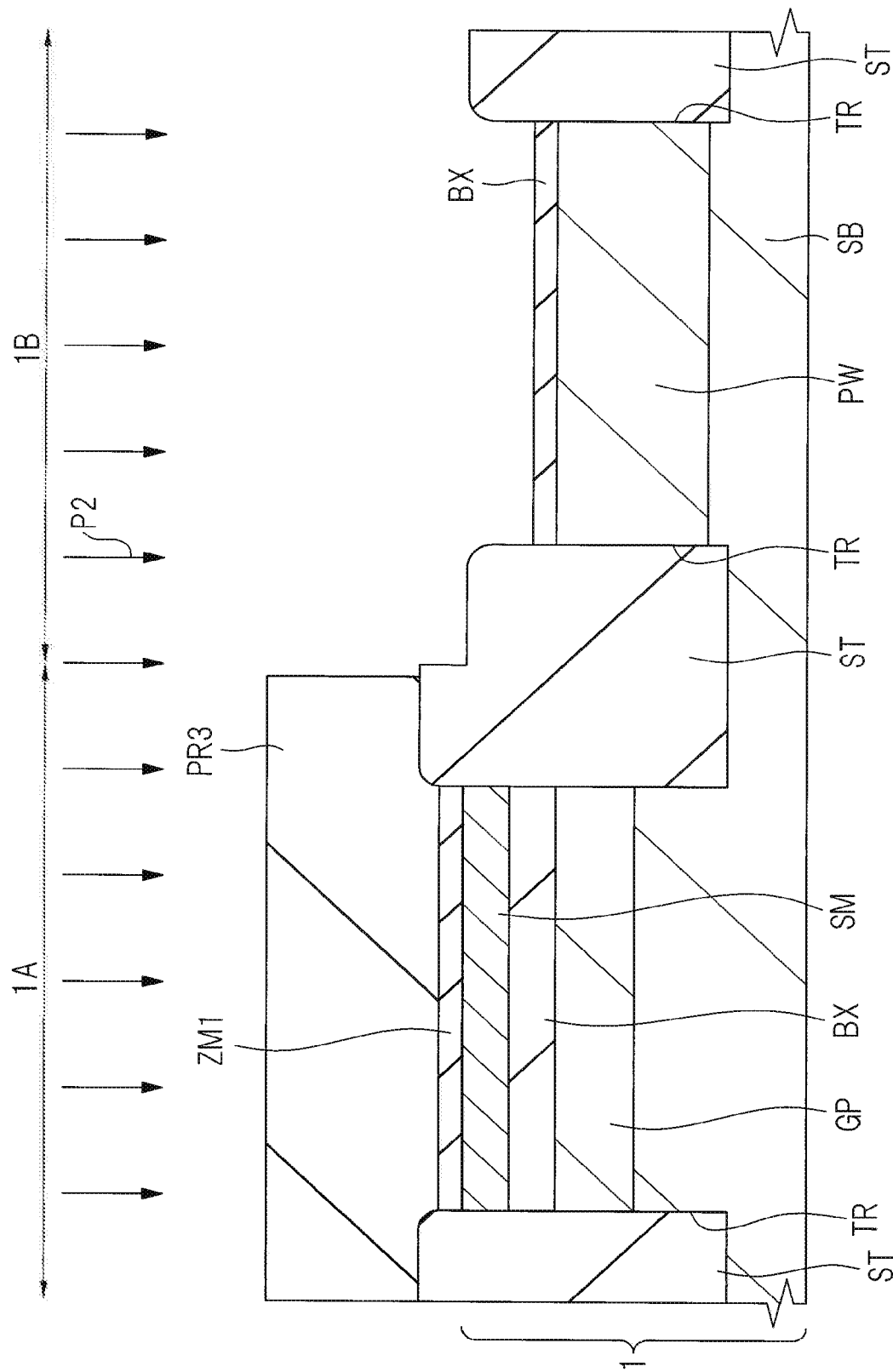
FIG. 16 is a cross-sectional view showing a principal part of the semiconductor device in the manufacturing process continued from FIG. 15.

Next, as shown in FIG. 16, a photoresist pattern (resist pattern, mask layer) PR3 which covers the SOI region 1A and exposes the bulk region 1B is formed as a mask layer over the SOI substrate 1 by the photolithography technique. The insulating film ZM1 in the SOI region 1A is covered with the photoresist pattern PR3, but the insulating layer BX in the bulk region 1B is exposed without being covered with the photoresist pattern PR3. An end portion (side surface) of the photoresist pattern PR3 is located on the element isolation region ST. Thus, the photoresist pattern PR3 is formed on the element isolation region ST and on the insulating film ZM1 in the SOI region 1A.

Next, a p type impurity (for example, boron) is ion-implanted into the semiconductor substrate SB in the bulk region 1B with using the photoresist pattern PR3 as a mask (ion implantation blocking mask), thereby forming a p type well (p type semiconductor region) PW (step S13 of FIG. 2). This ion implantation performed in the step S13 is schematically indicated by arrows in FIG. 16, and is hereinafter referred to as ion implantation P2. The p type well PW is a p type semiconductor region into which a p type impurity has been introduced.

Figure 17:
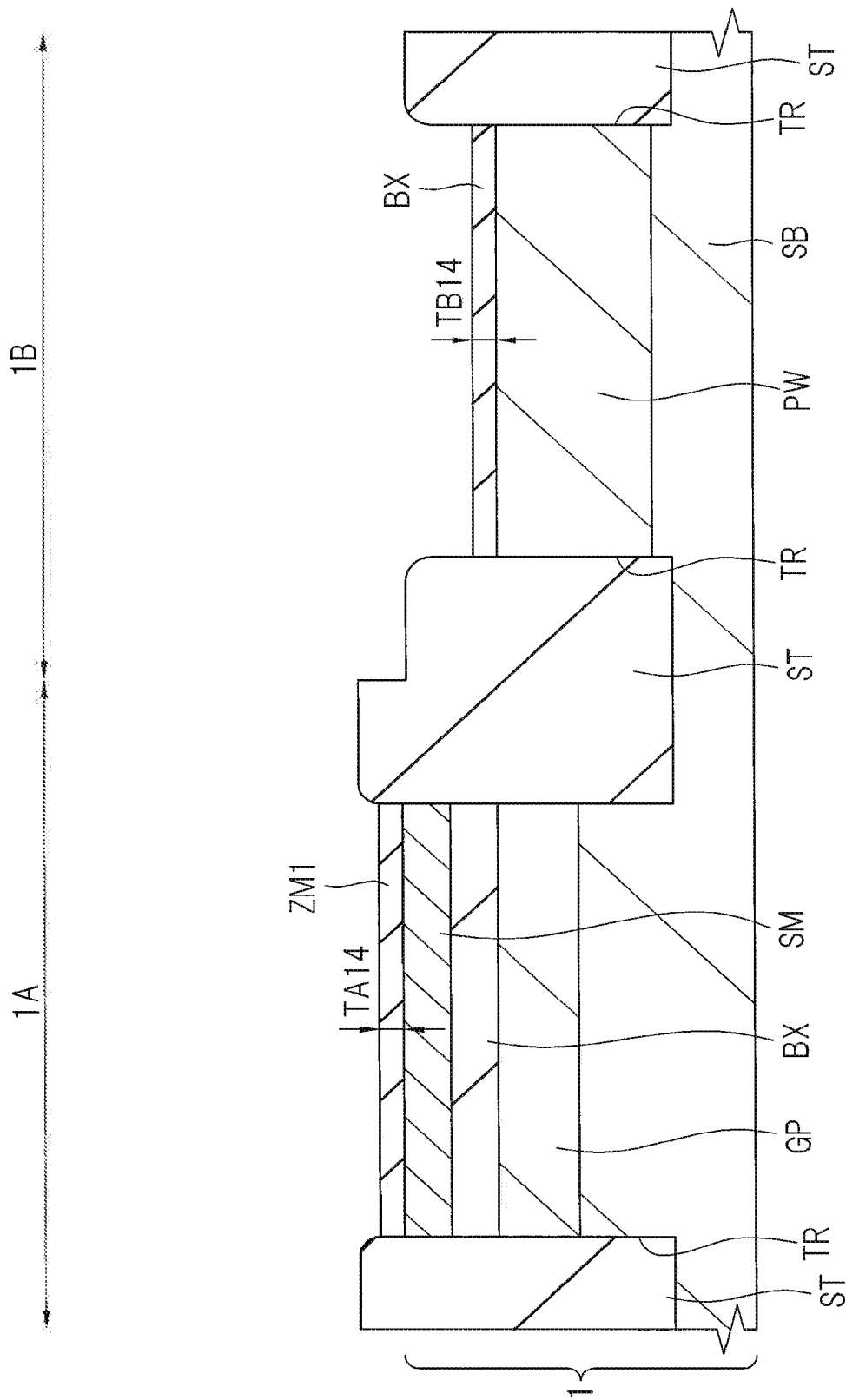
FIG. 17 is a cross-sectional view showing a principal part of the semiconductor device in the manufacturing process continued from FIG. 16.

Since the photoresist pattern PR3 functions as the ion implantation blocking mask in the ion implantation P2 for forming the p type well PW, the impurity is not introduced into the SOI substrate 1 in the SOI region 1A, and thus the impurity is not introduced into the semiconductor layer SM and the semiconductor substrate SB in the SOI region 1A. The p type well is formed in the semiconductor substrate SB in the bulk region 1B. After the ion implantation P2 in the step S13, the photoresist pattern RP3 is removed as shown in FIG. 17.

In addition, before or after the ion implantation P2 for forming the p type well PW, the channel doped ion implantation may be performed to the semiconductor substrate SB in the bulk region 1B with using the photoresist pattern PR3 as a mask (ion implantation blocking mask).

Although the case where the step S13 is performed after the step S12 has been described here, the order of the step S12 and the step S13 may be exchanged as another embodiment, and it is also possible to perform the step S13 first and then perform the step S12.

Figure 18:
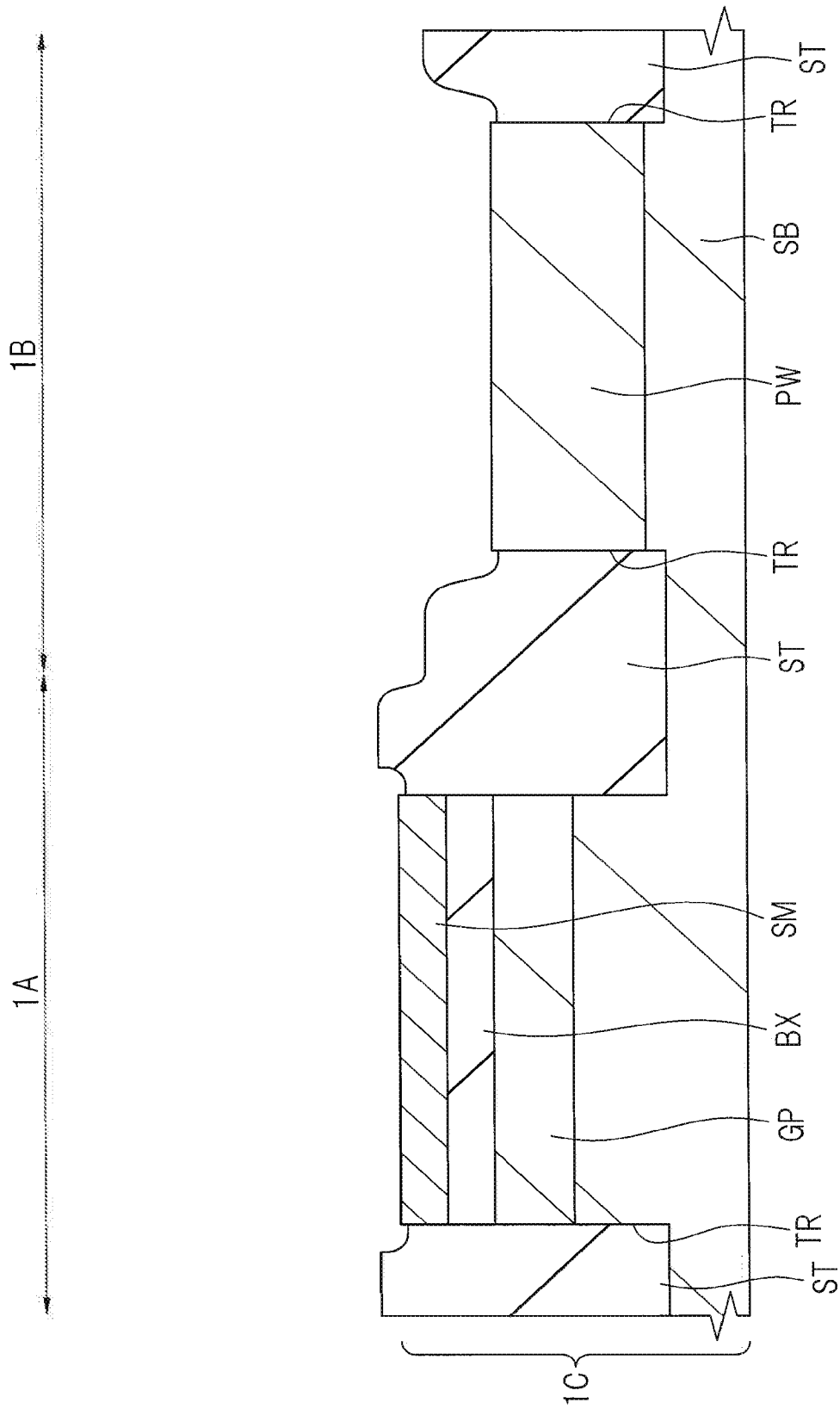
FIG. 18 is a cross-sectional view showing a principal part of the semiconductor device in the manufacturing process continued from FIG. 17.

Next, as shown in FIG. 18, the insulating film ZM1 in the SOI region 1A and the insulating layer BX in the bulk region 1B are removed by etching (step S14 of FIG. 2). Wet etching is used for the etching in the step S14.

In the step S14, it is preferable that the insulating film ZM1 in the SOI region 1A and the insulating layer BX in the bulk region 1B are removed by etching under the condition that the semiconductor layer SM and the semiconductor substrate SB are hard to be etched compared with the insulating film ZM1 and the insulating layer BX. In other words, it is preferable that the insulating film ZM1 in the SOI region 1A and the insulating layer BX in the bulk region 1B are removed by etching under the condition that the etching rate of the semiconductor layer SM and the etching rate of the semiconductor substrate SB are lower than the etching rate of the insulating film ZM1 and the etching rate of the insulating layer BX in the step S14. In this manner, the insulating film ZM1 in the SOI region 1A and the insulating layer BX in the bulk region 1B can be removed by etching, and the semiconductor layer SM in the SOI region 1A and the semiconductor substrate SB in the bulk region 1B can be made to function as an etching stopper, so that it is possible to suppress or prevent the semiconductor layer SM in the SOI region 1A and the semiconductor substrate SB in the bulk region 1B from being etched. When the insulating film ZM1 and the insulating layer BX are made of silicon oxide, hydrofluoric acid can be suitably used as an etching solution in the step S14.

Since the etching in the step S14 is performed in the state where the upper surface of the element isolation region ST, the upper surface of the insulating film ZM1 in the SOI region 1A, and the upper surface of the insulating layer BX in the bulk region 1B are exposed, the surface layer portion of the element isolation region ST, the insulating film ZM1 in the SOI region 1A, and the insulating layer BX in the bulk region 1B are removed by etching in the step S14. The etching in the step S14 is finished at the stage when the insulating film ZM1 is removed to expose the upper surface of the semiconductor layer SM in the SOI region 1A and the insulating layer BX is removed to expose the upper surface of the semiconductor substrate SB in the bulk region 1B. In addition, in the step S14, the element isolation region ST may also be etched to an extent similar to the etching amount (etching thickness) of the insulating film ZM1 in the SOI region 1A and the insulating layer BX in the bulk region 1B.

At the stage when the step S14 is finished, as shown in FIG. 18, the insulating film ZM1 is removed to expose the upper surface of the semiconductor layer SM in the SOI region 1A, and the insulating layer BX is removed to expose the upper surface of the semiconductor substrate SB (p type well PW) in the bulk region 1B. Since wet etching is used instead of dry etching in the step S14, it is possible to prevent the semiconductor layer SM and the semiconductor substrate SB from being damaged even if etching is performed until the semiconductor layer SM and the semiconductor substrate SB are exposed.

In this manner, the element isolation region ST is formed in the SOI substrate 1, the semiconductor layer SM and the insulating layer BX are removed to expose the upper surface of the semiconductor substrate SB in the bulk region 1B (the SOI structure disappears), and the semiconductor layer SM and the insulating layer BX remain and the SOI structure is maintained in the SOI region 1A. The SOI substrate 1 at this stage will be referred to as a substrate 1C. Hereinafter, the main surface of the substrate 1C is synonymous with the main surface of the semiconductor layer SM in the SOI region 1A and the main surface of the semiconductor SB in the bulk region 1B.

Although the substrate 1C includes the SOI region 1A and the bulk region 1B, the SOI region 1A can be regarded as the region having the SOI structure in which the insulating layer BX is buried, and the bulk region 1B can be regarded as the region not having the SOI structure due to the absence of the insulating layer BX. Specifically, the SOI region 1A of the substrate 1C is a region having a stacked structure (SOI structure) in which the semiconductor substrate SB, the insulating layer BX on the semiconductor substrate SB and the semiconductor layer SM on the insulating layer BX are stacked, and the bulk region 1B of the substrate 1C is a region comprised of the semiconductor substrate SB throughout the whole thickness thereof. However, the SOI region 1A and the bulk region 1B may include a region in which the element isolation region ST is present. In the bulk region 1B, a part of the element isolation region ST (part located below the lower surface of the insulating layer BX) remains in the state of being embedded in the semiconductor substrate SB even after the removal of the semiconductor layer SM and the insulating layer BX, and this serves as the element isolation region ST in the bulk region 1B.

Next, a semiconductor element such as MISFET (transistor) is formed in each the SOI region 1A and the bulk region 1B (step S15 of FIG. 2).

In the SOI region 1A of the substrate 1C, the semiconductor layer SM is partitioned into a plurality of regions (active regions) surrounded by the element isolation region ST in a plan view, and a MISFET is formed on the semiconductor layer SM in each active region. In the SOI region 1A of the substrate 1C, the semiconductor layer SM in each active region is surrounded, by the element isolation region ST in a plan view, and the lower surface thereof is adjacent to the insulating layer BX. Therefore, the semiconductor layer SM in each active region is surrounded by the element isolation region ST and the insulating layer BX. Also, in the bulk region 1B of the substrate 1C, the semiconductor substrate SB is partitioned into a plurality of regions (active regions) surrounded by the element isolation region ST in a plan view, and a MISFET is formed on the semiconductor substrate SB in each active region. In the bulk region 1B of the substrate 1C, each active region is surrounded by the element isolation region ST in a plan view.

An example of the step S15 will be specifically described below.

Figure 19:
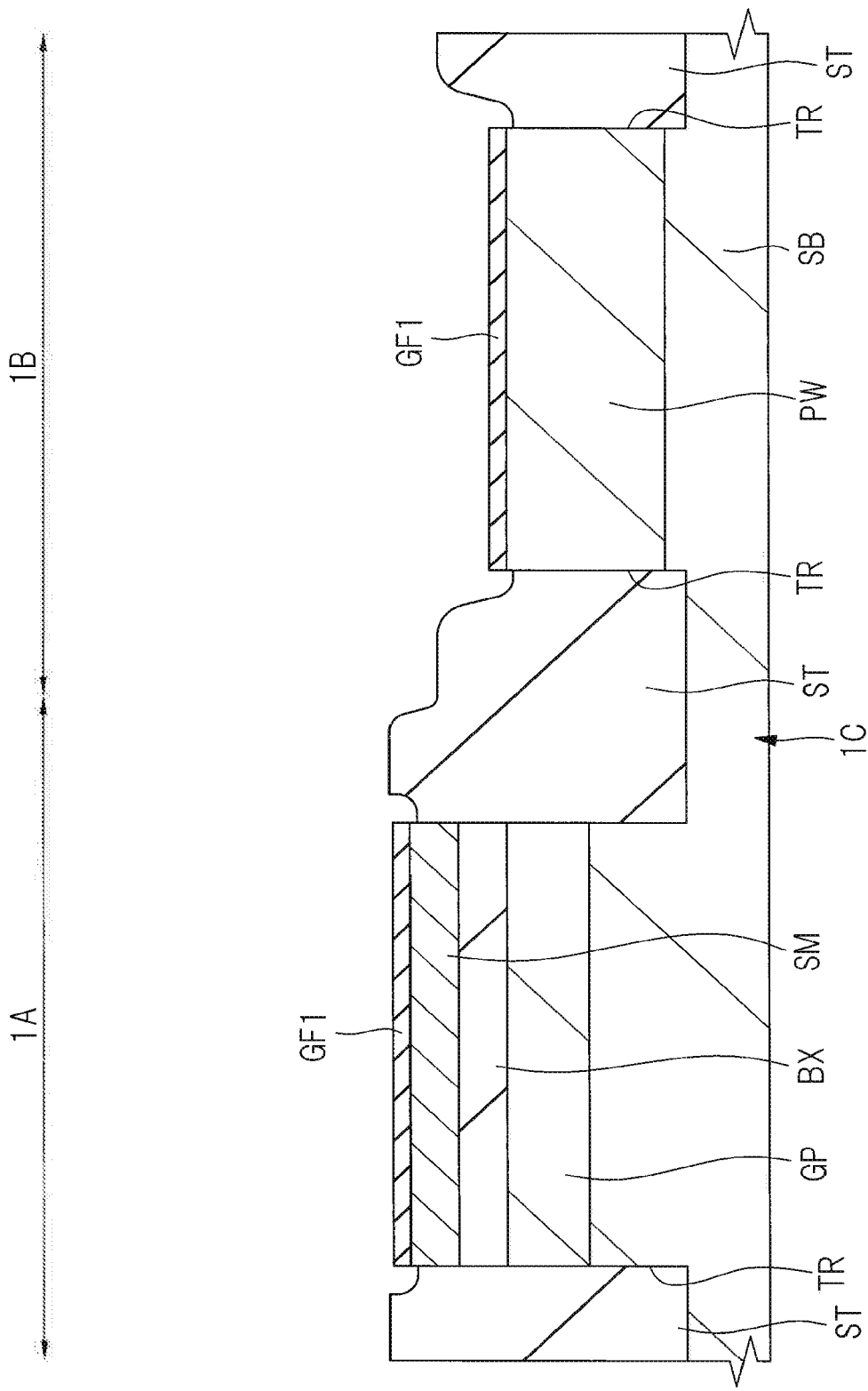
FIG. 19 is a cross-sectional view showing a principal part of the semiconductor device in the manufacturing process continued from FIG. 18.

First, as shown in FIG. 19, a gate insulating film GF1 is formed over the upper surface of the semiconductor layer SM in the SOI region 1A and the upper surface of the semiconductor substrate SB in the bulk region 1B. The gate insulating film GF1 is made of, for example, a silicon oxide film and can be formed by the thermal oxidation method or the like.

Figure 20:
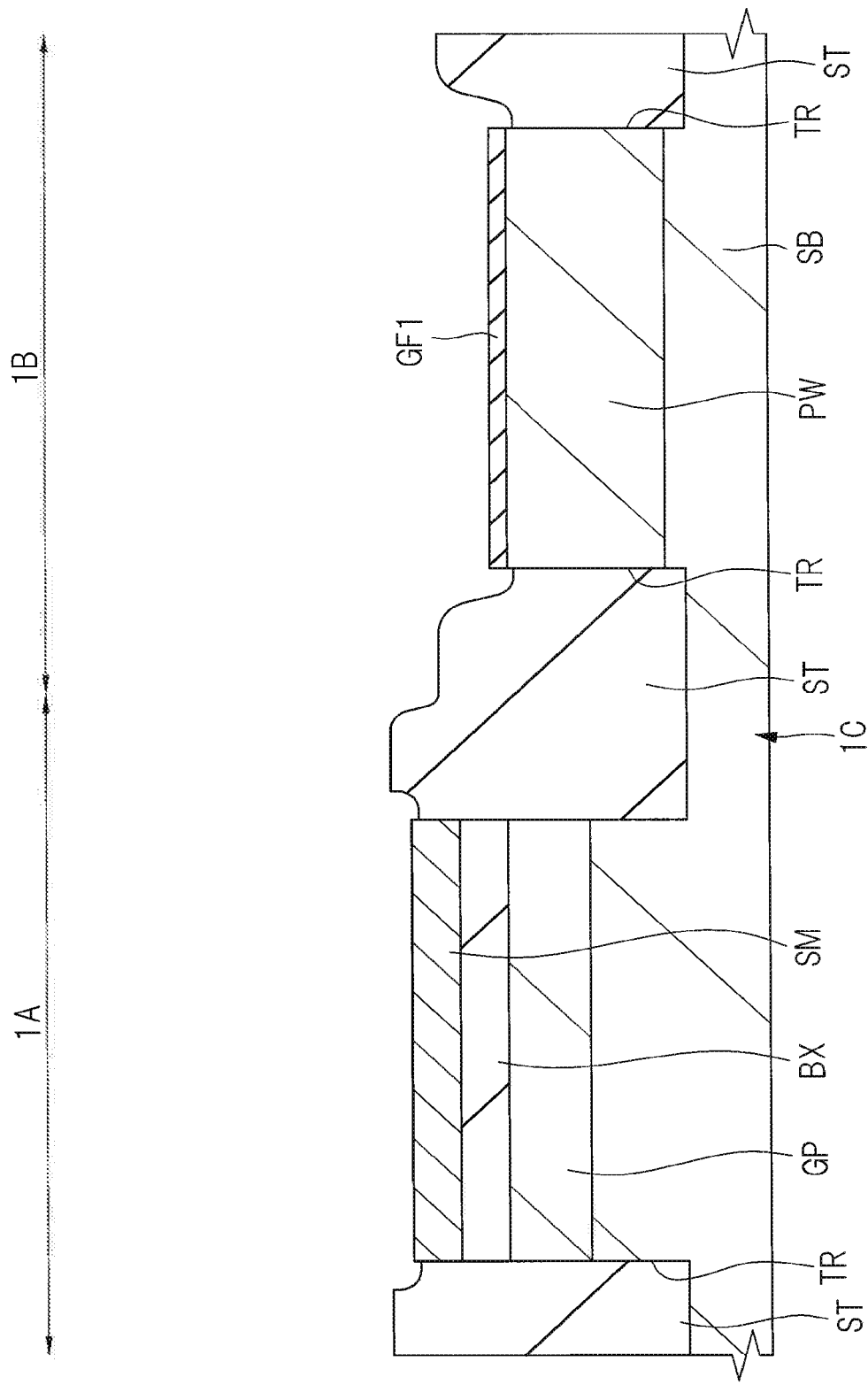
FIG. 20 is a cross-sectional view showing a principal part of the semiconductor device in the manufacturing process continued from FIG. 19.

Next, a photoresist pattern (not shown) which covers the gate insulating film GF1 in the bulk region 1B and exposes the gate insulating film GF1 in the SOI region 1A is formed over the SOI substrate 1 by the photolithography technique. Then, the gate insulating film GF1 in the SOI region 1A is removed by etching with using the photoresist pattern as an etching mask. At this time, the gate insulating film GF1 in the bulk region 1B remains without being etched because it is covered with the photoresist pattern. Thereafter, the photoresist pattern is removed. FIG. 20 shows this stage.

Figure 21:
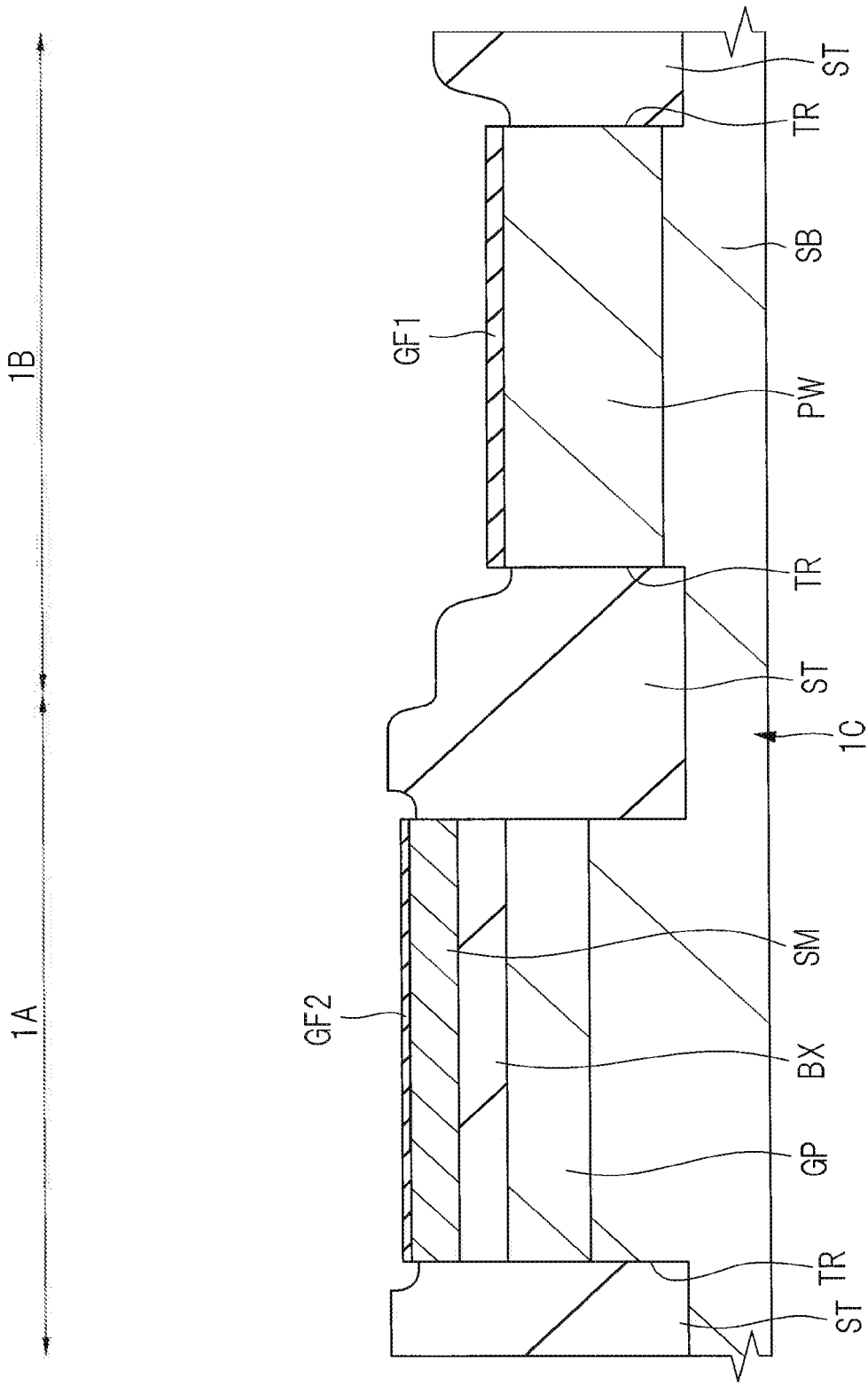
FIG. 21 is a cross-sectional view showing a principal part of the semiconductor device in the manufacturing process continued from FIG. 20.

Next, as shown in FIG. 21, a gate insulating film GF2 is formed over the upper surface of the semiconductor layer SM in the SOI region 1A. The gate insulating film GF2 is made of, for example, a silicon oxide film and can be formed by the thermal oxidation method or the like. There may be a case where the thickness of the gate insulating film GF1 in the bulk region 1B increases during the thermal oxidation process for forming the gate insulating film GF2.

In this manner, a state in which the gate insulating film GF2 is formed over the upper surface of the semiconductor layer SM in the SOI region 1A and the gate insulating film GF1 is formed over the upper surface of the semiconductor substrate SB in the bulk region 1B is obtained. At this stage, the gate insulating film GF1 is thicker than the gate insulating film GF2.

Figure 22:
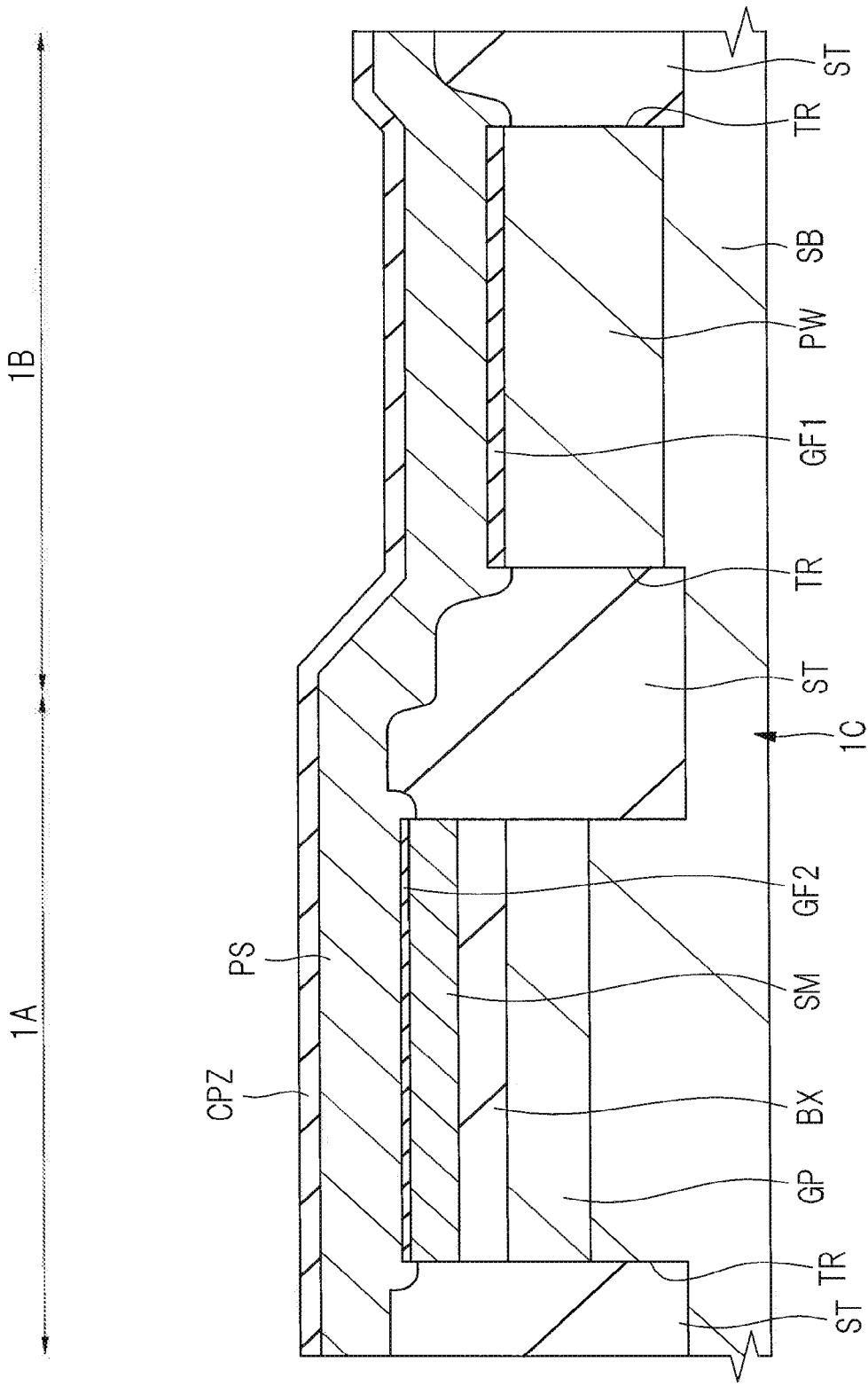
FIG. 22 is a cross-sectional view showing a principal part of the semiconductor device in the manufacturing process continued from FIG. 21.

Next, as shown in FIG. 22, a silicon film PS such as a doped polysilicon film is formed as a conductive film for forming a gate electrode over the main surface of the substrate 1C, that is, over the gate insulating films GF1 and GF2 and the element isolation region ST, and an insulating film CPZ such as a silicon nitride film is then formed over the silicon film PS. Thereafter, as shown in FIG. 23, the insulating film CPZ is patterned by using the photolithography method and the dry etching method, and then the silicon film PS is patterned by dry etching with using the patterned insulating film CPZ as an etching mask.

Figure 23:
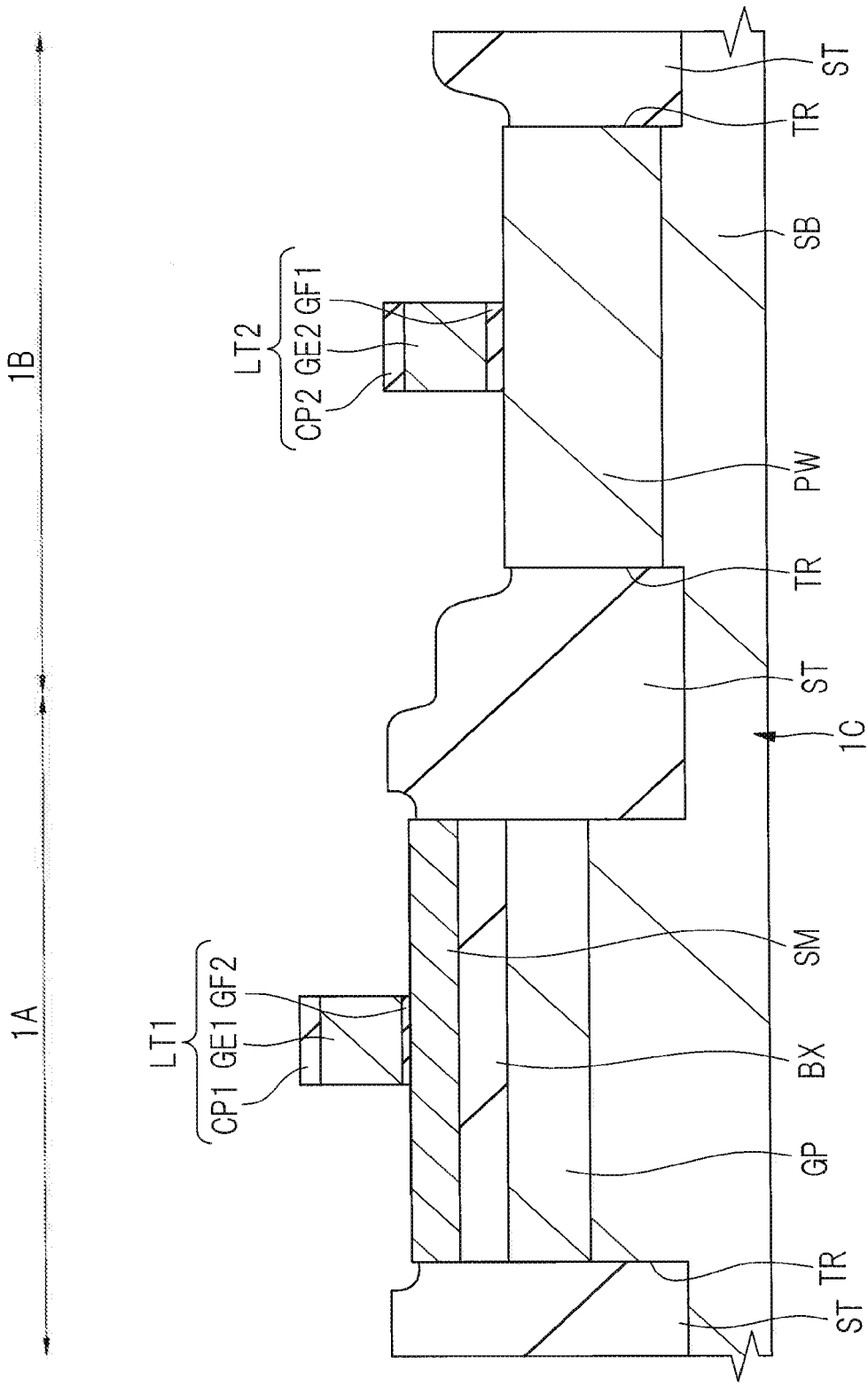
FIG. 23 is a cross-sectional view showing a principal part of the semiconductor device in the manufacturing process continued from FIG. 22.

As shown in FIG. 23, each of gate electrodes GE1 and GE2 is formed of the patterned silicon film PS. The gate electrode GE1 is formed on the semiconductor layer SM via the gate insulating film GF2 in the SOI region 1A. Further, the gate electrode GE2 is formed on the semiconductor substrate SB (p type well PW) via the gate insulating film GF1 in the bulk region 1B. A cap insulating film CP1 made of the patterned insulating film CPZ is formed on the gate electrode GE1, and a cap insulating film CP2 made of the patterned insulating film CPZ is formed on the gate electrode GE2. The cap insulating film CP1 has approximately the same planar shape as the gate electrode GE1, and the cap insulating film CP2 has approximately the same planar shape as the gate electrode GE2. The portions of the gate insulating films GF1 and GF2 which are not covered with the gate electrodes GE1 and GE2 can be removed by dry etching for patterning the silicon film PS, subsequent wet etching or the like.

Here, the stacked structure of the gate insulating film GF2, the gate electrode GE1, and the cap insulating film CP1 formed in the SOI region 1A is referred to as a stacked body LT1 in the following description. Also, the stacked structure of the gate insulating film GF1, the gate electrode GE2, and the cap insulating film CP2 formed in the bulk region 1B is referred to as a stacked body LT2 in the following description.

FIG. 24 and FIG. 25 are plan views showing principal parts in the same process step as FIG. 23. Specifically, FIG. 24 shows the SOI region 1A and FIG. 25 shows the bulk region 1B. As can be seen from FIGS. 24 and 25, both end portions of each of the stacked bodies LT1 and LT2 in the gate width direction are located on the element isolation region ST. Note that, in the process of FIG. 19 and the process of FIG. 21, the gate insulating films GF1 and GF2 are not formed on the element isolation region ST. Therefore, each portion of the stacked body LT1 located on the element isolation region ST does not include the gate insulating film GF2 and has a stacked structure of the gate electrode GE1 and the cap insulating film CP1, and each portion of the stacked body LT2 located on the element isolation region ST does not include the gate insulating film GF1 and has a stacked structure of the gate electrode GE2 and the cap insulating film CP2.

Next, sidewall spacers SW1 are formed as side wall insulating films on the side surfaces of the stacked body LT1, The process of forming the sidewall spacer SW1 can be performed as follows.

Figure 26:
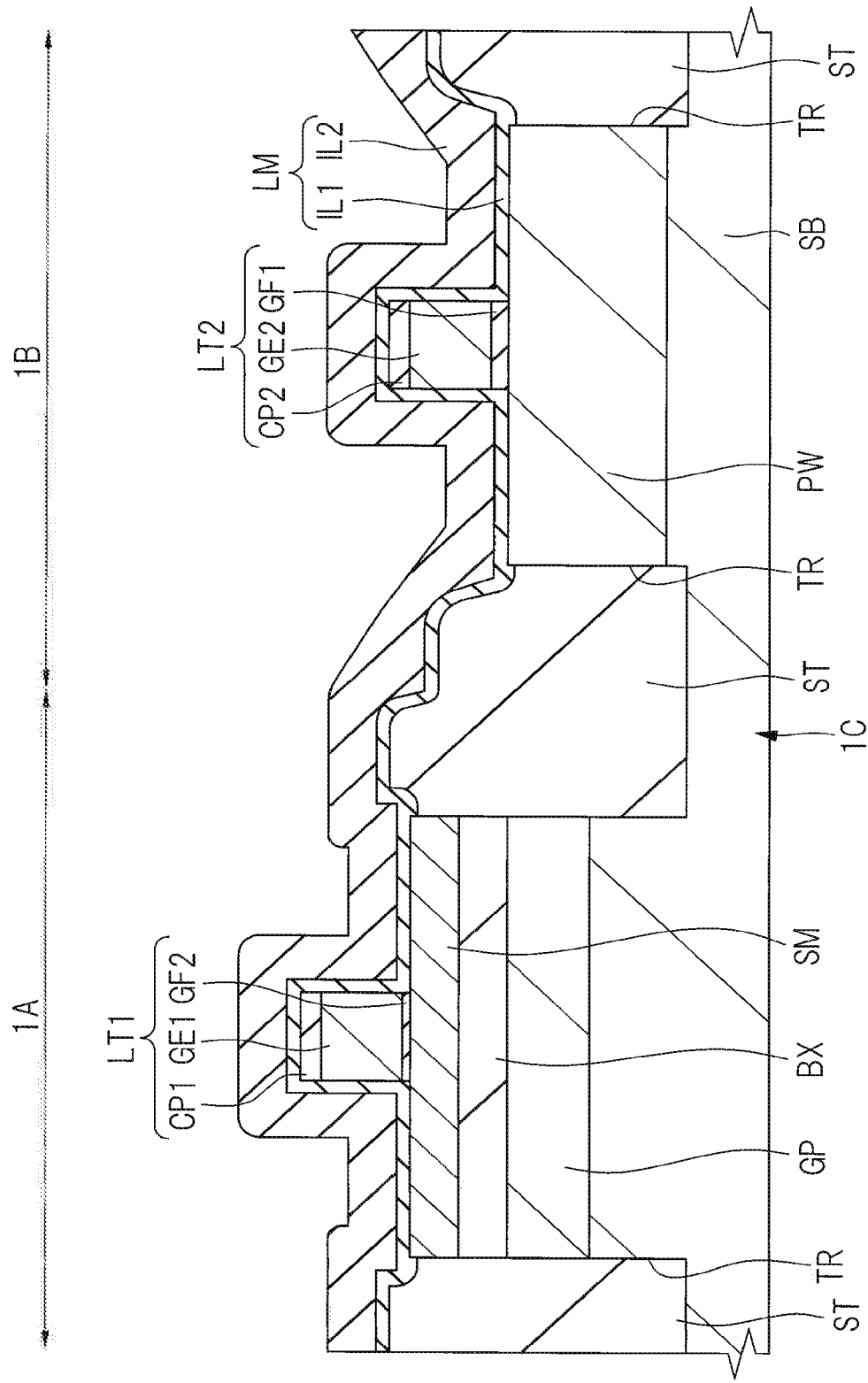
FIG. 26 is a cross-sectional view showing a principal part of the semiconductor device in the manufacturing process continued from FIG. 23.
Figure 27:
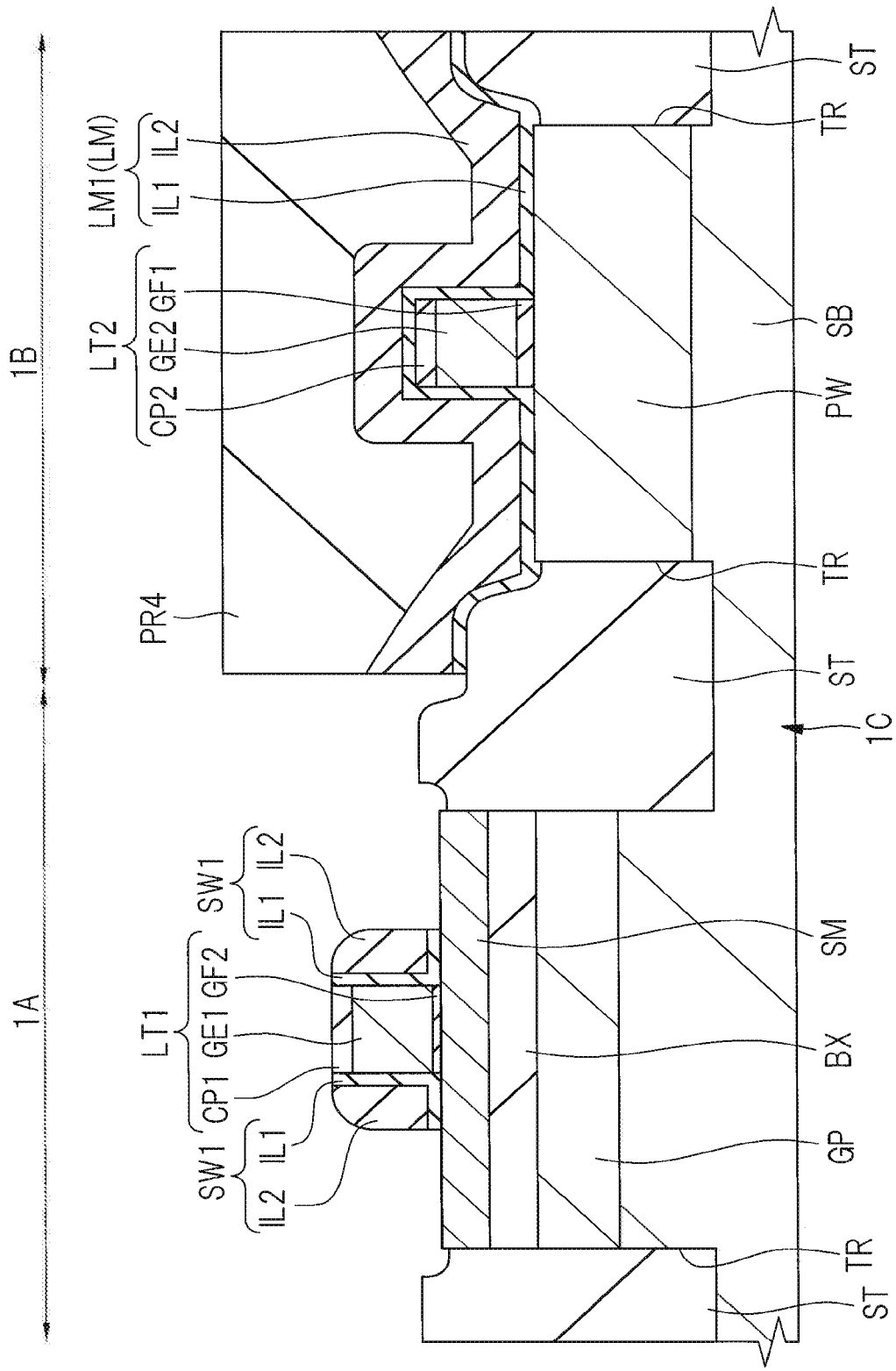
FIG. 27 is a cross-sectional view showing a principal part of the semiconductor device in the manufacturing process continued from FIG. 26.

First, as shown in FIG. 26, a stacked film LM comprised of an insulating film IL1 and an insulating film IL2 thereon is formed over the entire main surface of the substrate 1C so as to cover the stacked bodies LT1 and LT2. The insulating film IL1 is made of, for example, a silicon oxide film, and the insulating film IL2 is made of, for example, a silicon nitride film. Then, a photoresist pattern PR4 which covers the stacked film LM in the bulk region 1B and exposes the stacked film LM in the SOI region 1A is formed over the stacked film LM. Thereafter, the sidewall spacers SW1 are formed on both side surfaces of the stacked body LT1 by etching back the stacked film LM by an anisotropic etching technique. FIG. 27 shows this stage. Since the stacked film LM in the bulk region 1B is covered with the photoresist pattern PR4, it remains without being etched. The stacked film LM remaining in the bulk region 1B is hereinafter referred to as a stacked film LM1. Thereafter, the photoresist pattern PR4 is removed. The sidewall spacer SW1 is formed of the insulating film IL1 continuously extending on the upper surface of the semiconductor layer SM and the side surface of the stacked body LT1 and having an approximately uniform thickness and the insulating film IL2 separated from the semiconductor layer SM and the stacked body LT1 via the insulating film IL1.

Figure 28:
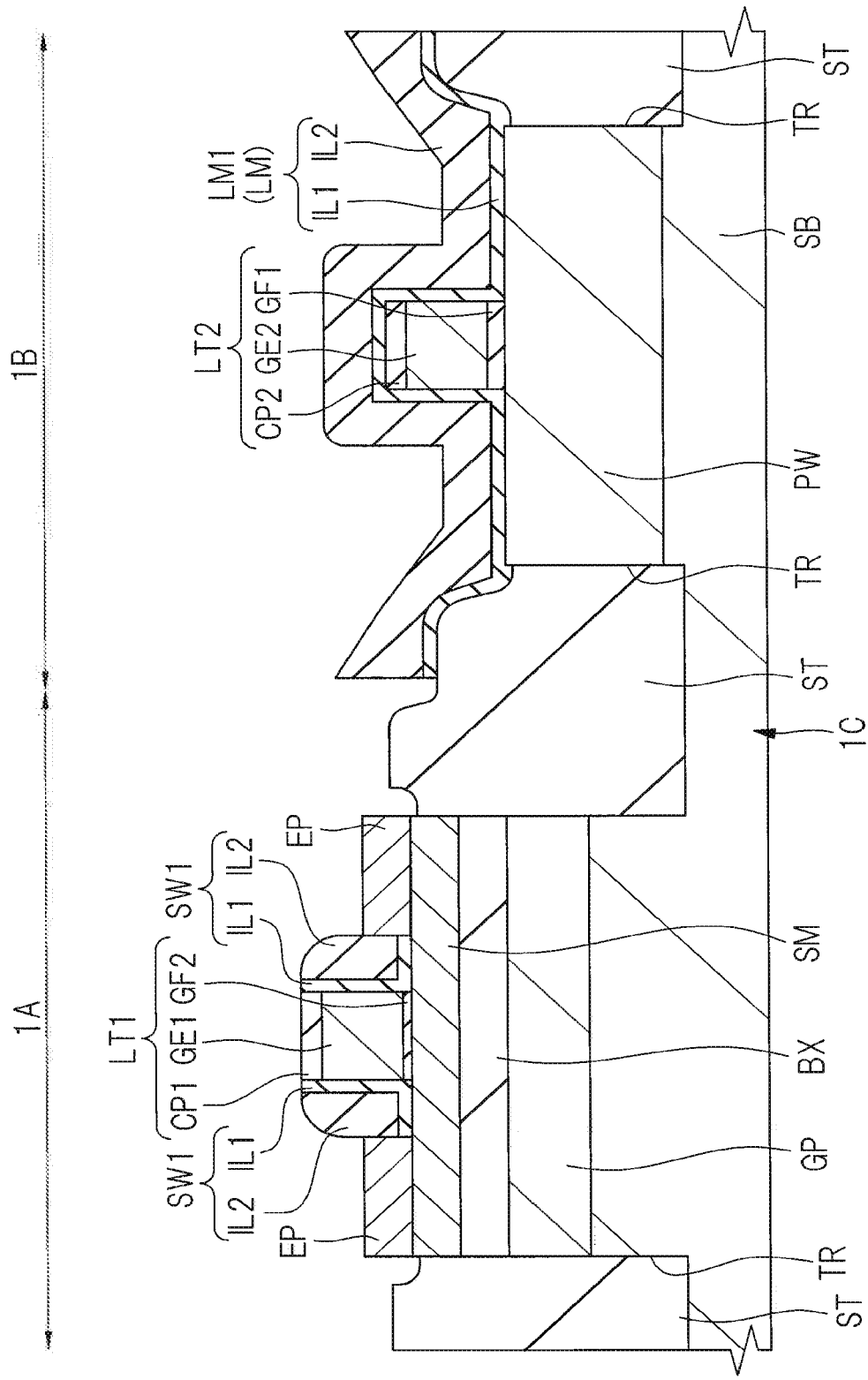
FIG. 28 is a cross-sectional view showing a principal part of the semiconductor device in the manufacturing process continued from FIG. 27.

Next, as shown in FIG. 28, a semiconductor layer EP is formed by epitaxial growth on the semiconductor layer SM in the SOI region 1A. The semiconductor layer EP is made of, for example, single crystal silicon.

Since the semiconductor layer EP is formed by the epitaxial growth, the epitaxial layer (semiconductor layer EP) selectively grows on the exposed surface of the semiconductor layer SM (Si surface), and the epitaxial layer does not grow on the insulating film. Therefore, the semiconductor layer EP selectively grows on a region (exposed surface) not covered with the stacked body LT1 and the sidewall spacer SW1 on the surface of the semiconductor layer SM in the SOI region 1A. Therefore, in the SOI region 1A, the semiconductor layer EP is formed on both sides of the structure comprised of the stacked body LT1 and the sidewall spacer SW1. In the bulk region 1B, since the semiconductor substrate SB is covered with the stacked film LM1, the epitaxial layer (semiconductor layer EP) is not formed.

Note that a combination of the semiconductor layer SM and the semiconductor layer EP formed on the semiconductor layer SM in the SOI region 1A is hereinafter referred to as a semiconductor layer SM1.

Figure 29:
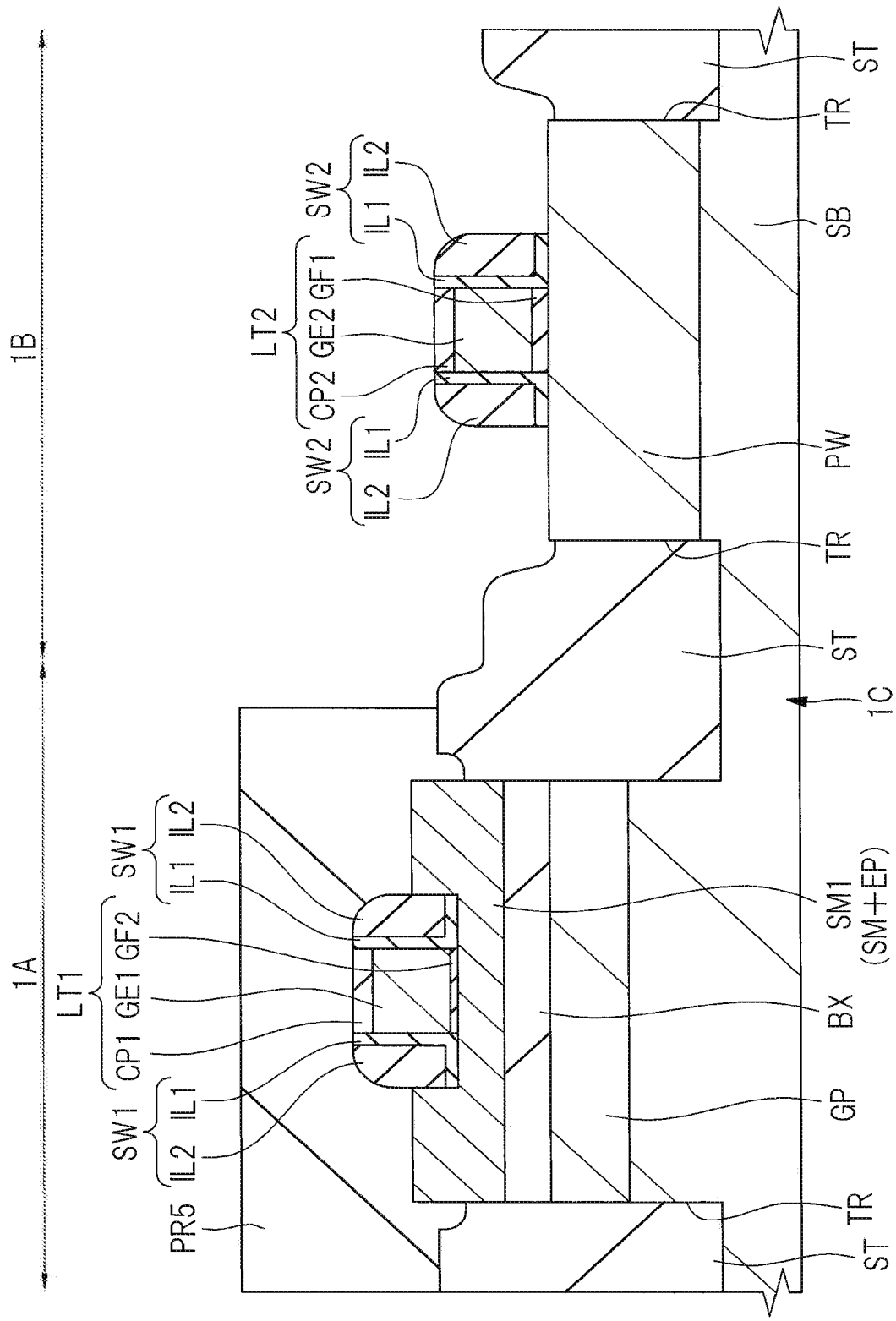
FIG. 29 is a cross-sectional view showing a principal part of the semiconductor device in the manufacturing process continued from FIG. 28.
Figure 30:
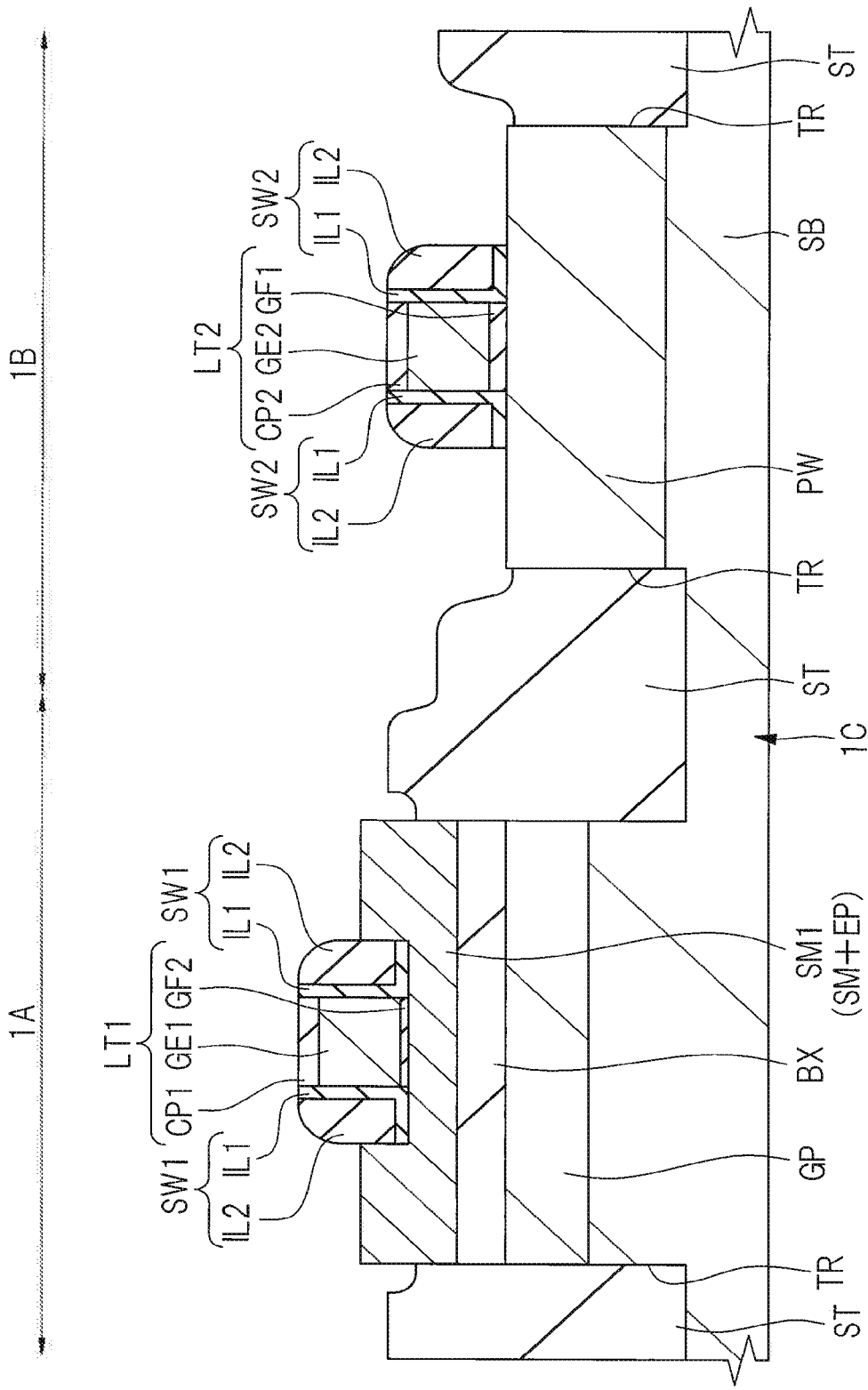
FIG. 30 is a cross-sectional view showing a principal part of the semiconductor device in the manufacturing process continued from FIG. 29.

Next, as shown in FIG. 29, a photoresist pattern PR5 which covers the SOI region 1A and exposes the bulk region 1B is formed. Then, sidewall spacers SW2 are formed on both side surfaces of the stacked body LT2 by etching back the stacked film LM1 in the bulk region 1B by an anisotropic etching technique. Since the stacked body LT1 and the sidewall spacer SW1 in the SOI region 1A are covered with the photoresist pattern PR5, they remain without being etched. Thereafter, the photoresist pattern PR5 is removed, and FIG. 30 shows this stage. The sidewall spacer SW2 has basically the same configuration as that of the sidewall spacer SW1, and is formed of a stacked film of the insulating film IL1 and the insulating film IL2.

Figure 31:
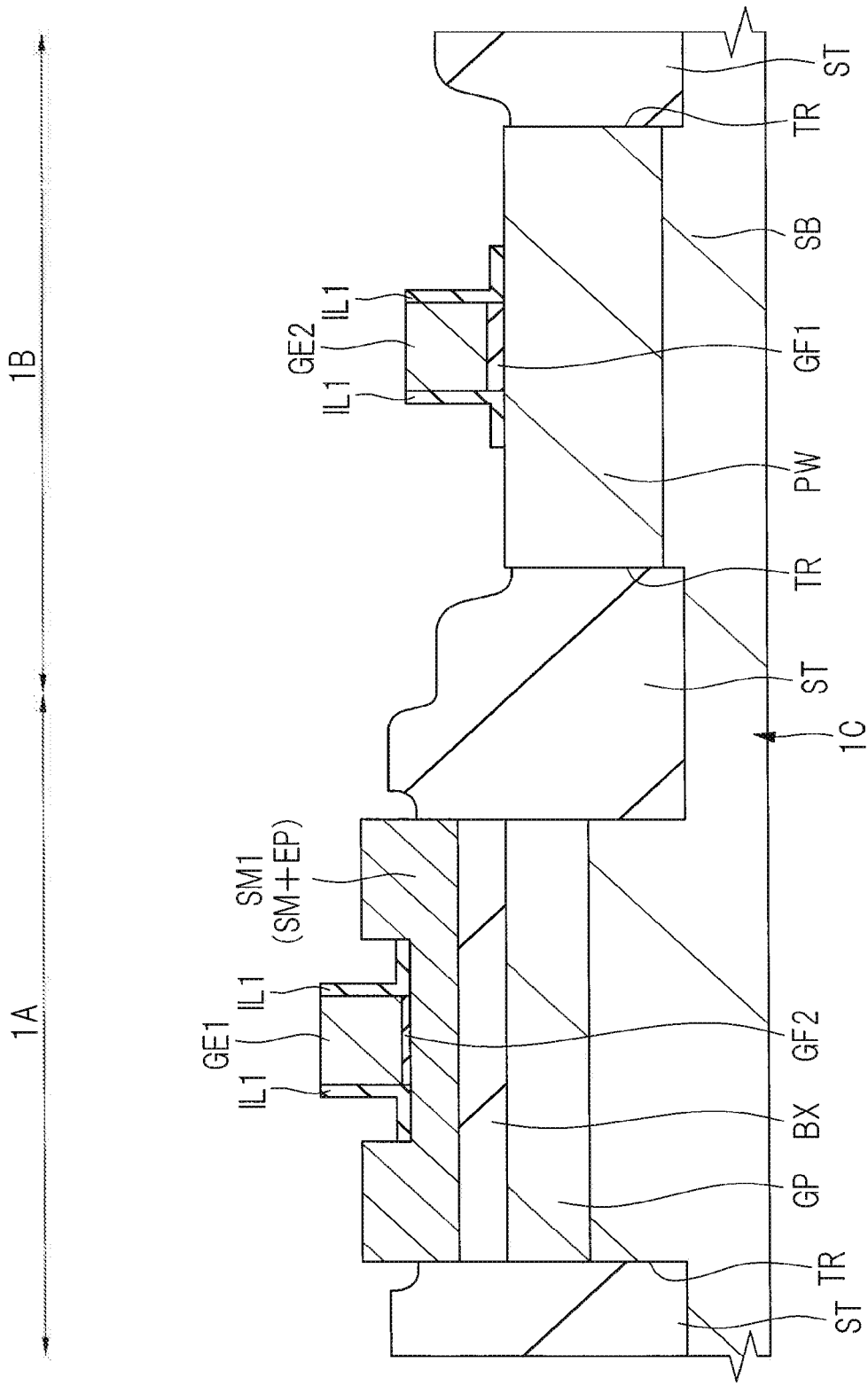
FIG. 31 is a cross-sectional view showing a principal part of the semiconductor device in the manufacturing process continued from FIG. 30.

Next, in FIG. 31, the insulating film IL2 constituting the sidewall spacers SW1 and SW2 is removed by etching. At this time, since the insulating film IL2 is removed by etching under the condition that the insulating film IL1 is hard to be etched compared with the insulating film IL2, the insulating film IL1 constituting the sidewall spacers SW1 and SW2 is hardly etched and remains. In addition, since the insulating film IL2 is made of the same material as the cap insulating films CP1 and CP2, the cap insulating films CP1 and CP2 can also be removed, by the etching at this time. By removing the cap insulating films CP1 and CP2, it becomes possible to form, a metal silicide layer SL described later on the gate electrodes GE1 and GE2.

Figure 32:
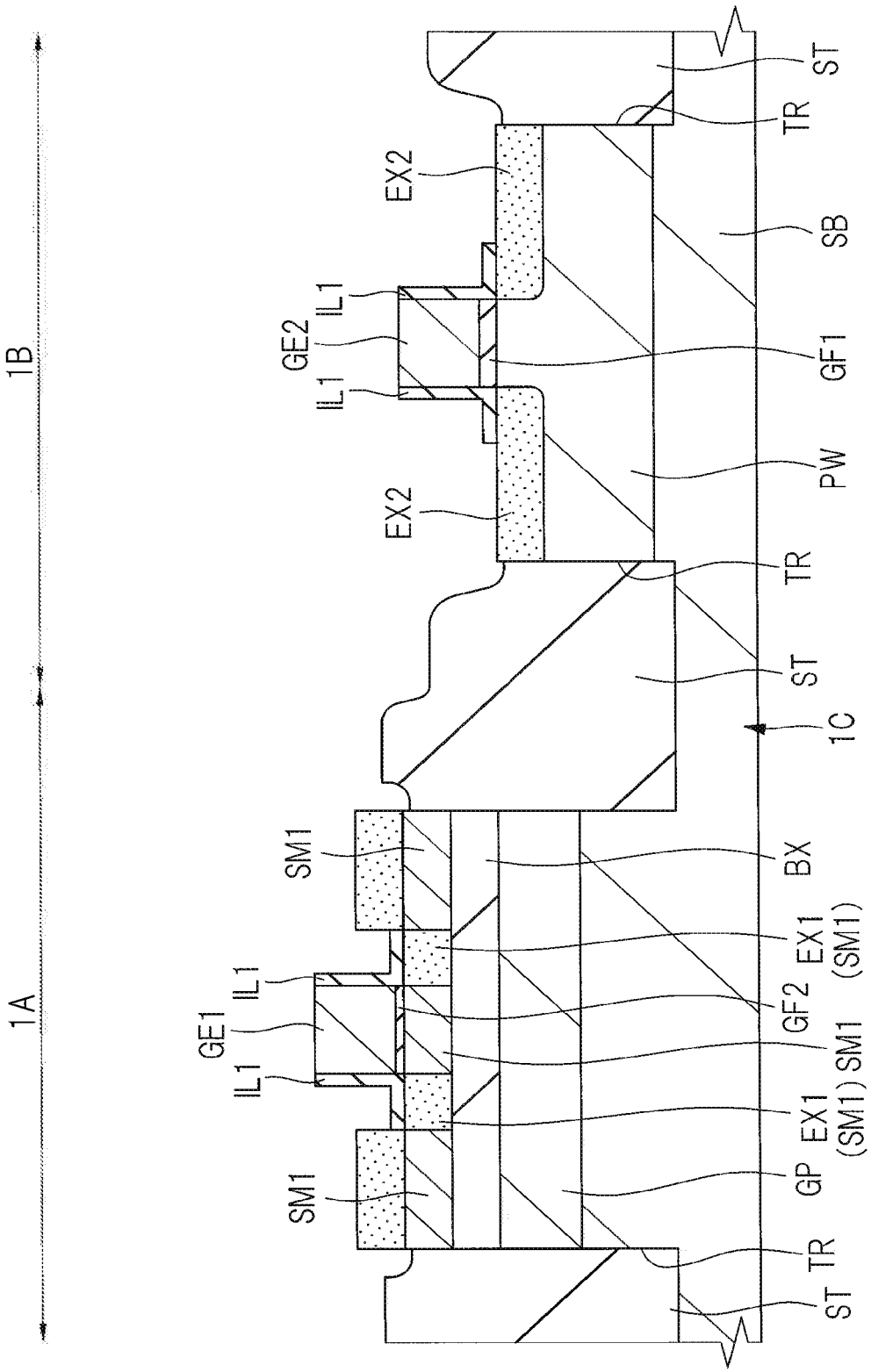
FIG. 32 is a cross-sectional view showing a principal part of the semiconductor device in the manufacturing process continued from FIG. 31.

Next, as shown in FIG. 32, an n type impurity such as phosphorus (P) or arsenic (As) is ion-implanted into the regions on both sides of the gate electrode GE1 in the semiconductor layer SM1 in the SOI region 1A, thereby forming $n^-$ type semiconductor regions (extension regions) EX1. Also, an n type impurity such as phosphorus (P) or arsenic (As) is ion-implanted into the regions on both sides of the gate electrode GE2 in the semiconductor substrate SB (p type well PW) in the bulk region 1B, thereby forming $n^-$ type semiconductor regions (extension regions) EX2. In FIG. 32, the regions where the impurity is implanted by the ion implantation at this time are indicated by dot hatching.

In the ion implantation for forming the $n^-$ type semiconductor regions EX1, the gate electrode GE1 and the portions of the insulating films IL1 extending on the side surfaces thereof can function as an ion implantation blocking mask. Also, in the ion implantation for forming the $n^-$ type semiconductor regions EX2, the gate electrode GE2 and the portions of the insulating films IL1 extending on the side surfaces thereof can function as an ion implantation blocking mask. The $n^-$ type semiconductor region EX1 and the $n^-$ type semiconductor region EX2 may be formed by the same ion implantation process or different ion implantation processes.

Figure 33:
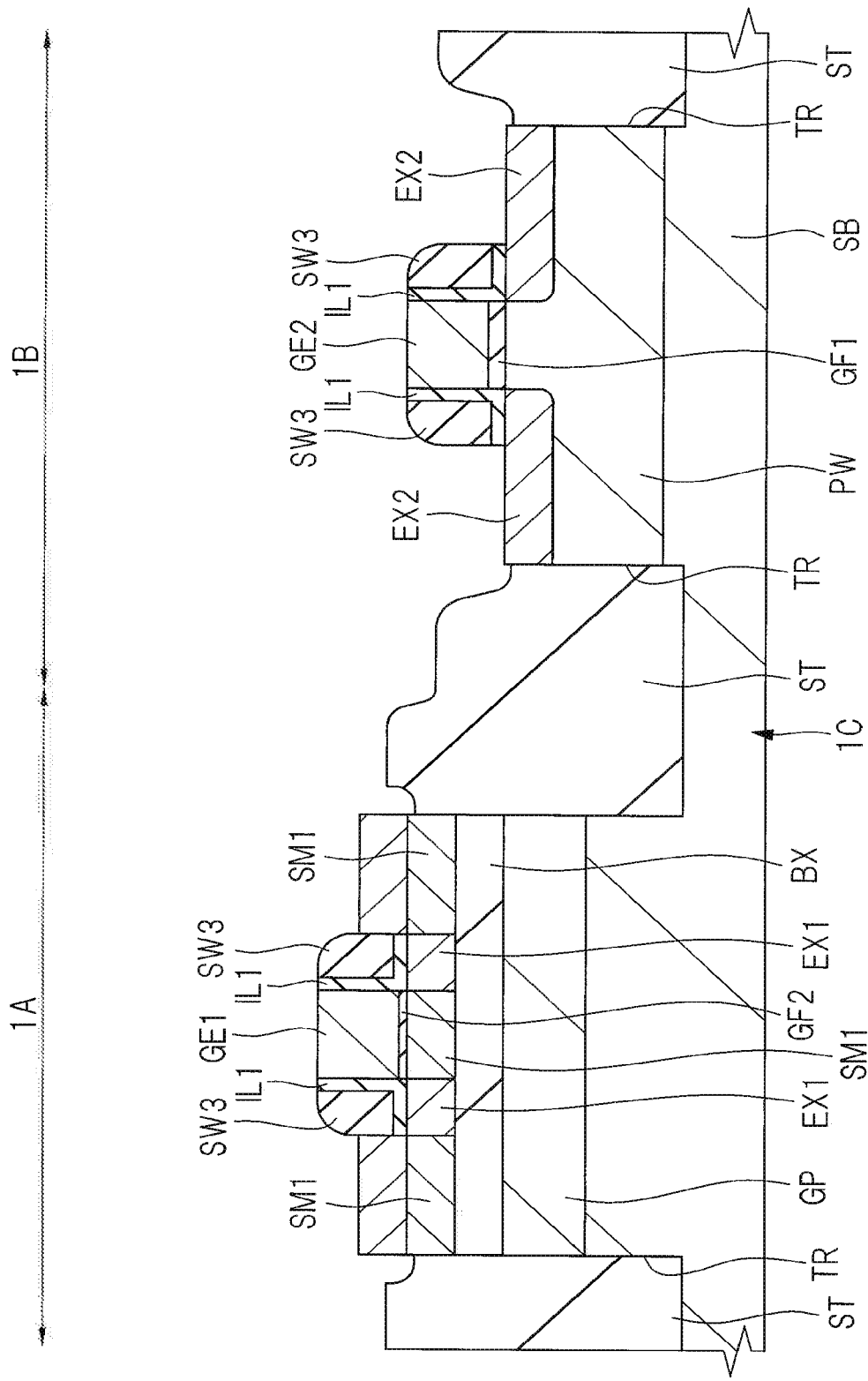
FIG. 33 is a cross-sectional view showing a principal part of the semiconductor device in the manufacturing process continued from FIG. 32.

Next, as shown in FIG. 33, sidewall spacers SW3 are formed as side wall insulating films on side surfaces of the gate electrodes GE1 and GE2. The process of forming the sidewall spacer SW3 can be performed as follows.

Namely, an insulating film (for example, silicon nitride film) for forming the sidewall spacer SW3 is formed over the main surface of the substrate 1C so as to cover the gate electrodes GE1 and GE2 and the insulating film IL1, and then, this insulating film is etched back by an anisotropic etching technique, thereby forming the sidewall spacers SW3 on the side surfaces of the gate electrodes GE1 and GE2. The sidewall spacers SW3 are formed on the side surfaces of the gate electrode GE1 via the insulating films IL1 in the SOI region 1A, and the sidewall spacers SW3 are formed on the side surfaces of the gate electrode GE2 via the insulating films IL1 in the bulk region 1B.

Figure 34:
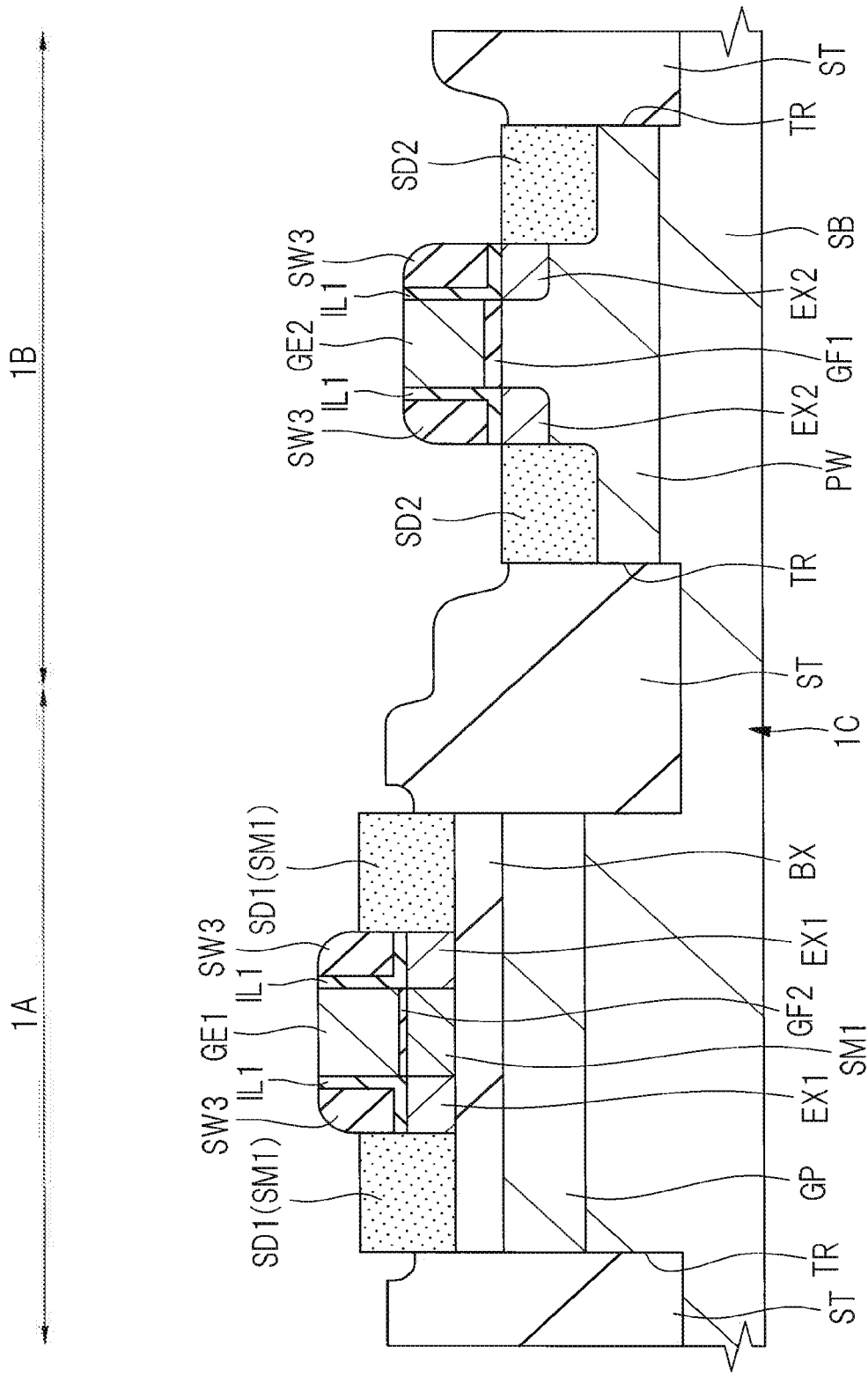
FIG. 34 is a cross-sectional view showing a principal part of the semiconductor device in the manufacturing process continued from FIG. 33.

Next, as shown in FIG. 34, an n type impurity such as phosphorus (P) or arsenic (As) is ion-implanted into the regions on both sides of the gate electrode GE1 and the sidewall spacers SW3 in the semiconductor layer SM1 in the SOI region 1A, thereby forming $n^+$ type semiconductor regions (source/drain regions) SD1. Further, an n type impurity such as phosphorus (P) or arsenic (As) is ion-implanted into the regions on both sides of the gate electrode GE2 and the sidewall spacers SW3 in the semiconductor substrate SB (p type well PW) in the bulk region 1B, thereby forming $n^+$ type semiconductor regions (source/drain regions) SD2. In FIG. 34, the regions where the impurity is implanted, by the ion implantation, at this time are indicated by dot hatching.

In the ion implantation for forming the $n^+$ type semiconductor regions SD1, the gate electrode GE1 and the sidewall spacers SW3 on both sides thereof can function as an ion implantation blocking mask. Also, in the ion implantation for forming the n$^+$ type semiconductor regions SD2, the gate electrode GE2 and the sidewall spacers SW3 on both sides thereof can function as an ion implantation blocking mask. The n$^+$ type semiconductor region SD1 has an impurity concentration higher than that of the n$^-$ type semiconductor region EX1, and the n$^+$ type semiconductor region SD2 has an impurity concentration higher than that of the n$^-$ type semiconductor region EX2. The n$^+$ type semiconductor region SD1 and the n$^+$ type semiconductor region SD2 may be formed by the same ion implantation process or different ion implantation processes.

In the semiconductor layer SM1 in the SOI region LA, source/drain regions of the LDD structure are formed of the n$^-$ type semiconductor regions EX1 and the n$^1$ type semiconductor regions SD1, and in the semiconductor substrate SB (p type well PW) in the bulk region 1B, source/drain regions of the LDD structure are formed of the n$^-$ type semiconductor regions EX2 and the n$^+$ type semiconductor regions SD2.

Next, activation annealing, which is heat treatment for activating impurities introduced into the n$^+$ type semiconductor regions SD1 and SD2 and the n$^-$ type semiconductor regions EX1 and EX2, is performed. When the ion implantation region has been amorphized, it can be crystallized in this activation annealing.

Figure 35:
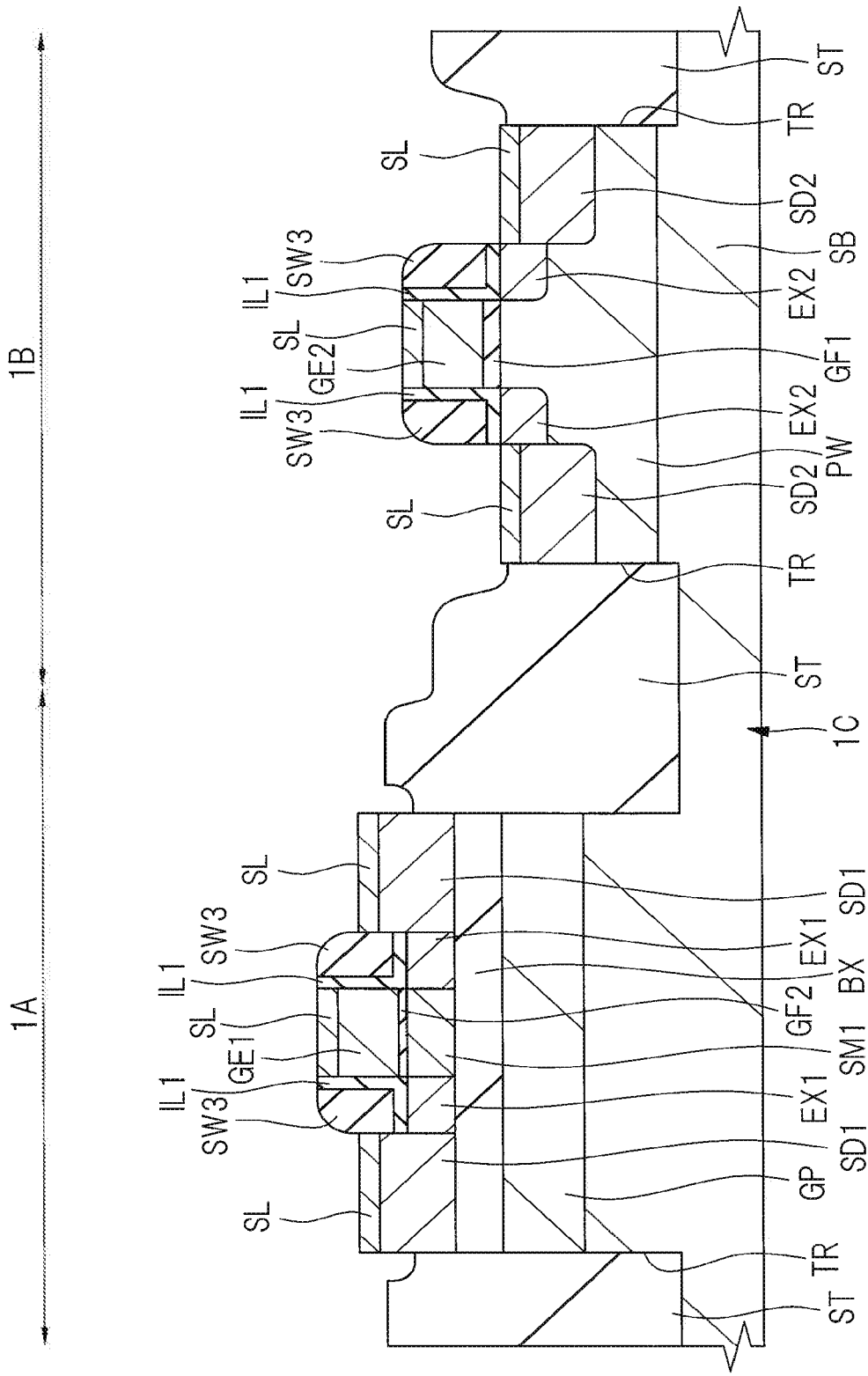
FIG. 35 is a cross-sectional view showing a principal part of the semiconductor device in the manufacturing process continued from FIG. 34.

Next, as shown in FIG. 35, a low-resistance metal silicide layer SL is formed on each of the n$^+$ type semiconductor regions SD1 and SD2 and the gate electrodes GE1 and GE2 (surface layer portions) by the salicide (Self Aligned Silicide) technique.

The metal silicide layer SL can be formed as follows. Namely, a metal film for forming the metal silicide layer SL is formed over the main surface of the substrate 1C so as to cover the gate electrodes GE1 and GE2 and the sidewall spacers SW3. This metal film is made of, for example, a cobalt film, a nickel film, or a nickel platinum alloy film. Then, heat treatment is applied to the substrate 1C to react the upper portions of the n$^+$ type semiconductor regions SD1 and SD2 and the gate electrodes GE1 and GE2 with the metal film. As a result, the metal silicide layer SL is formed on each upper portion of the n$^+$ type semiconductor regions SD1 and SD2 and the gate electrodes GE1 and GE2. Thereafter, the unreached metal film is removed, and FIG. 35 shows this stage. Since the metal silicide layer SL is formed, the diffusion resistance and the contact resistance of the gate electrodes GE1 and GE2 and the n$^-$ type semiconductor regions SD1 and SD2 can be reduced.

In the manner described above, the step S15 is performed, and a semiconductor element such as MISFET (transistor) can be formed in each of the SOI region 1A and the bulk region 1B.

Figure 36:
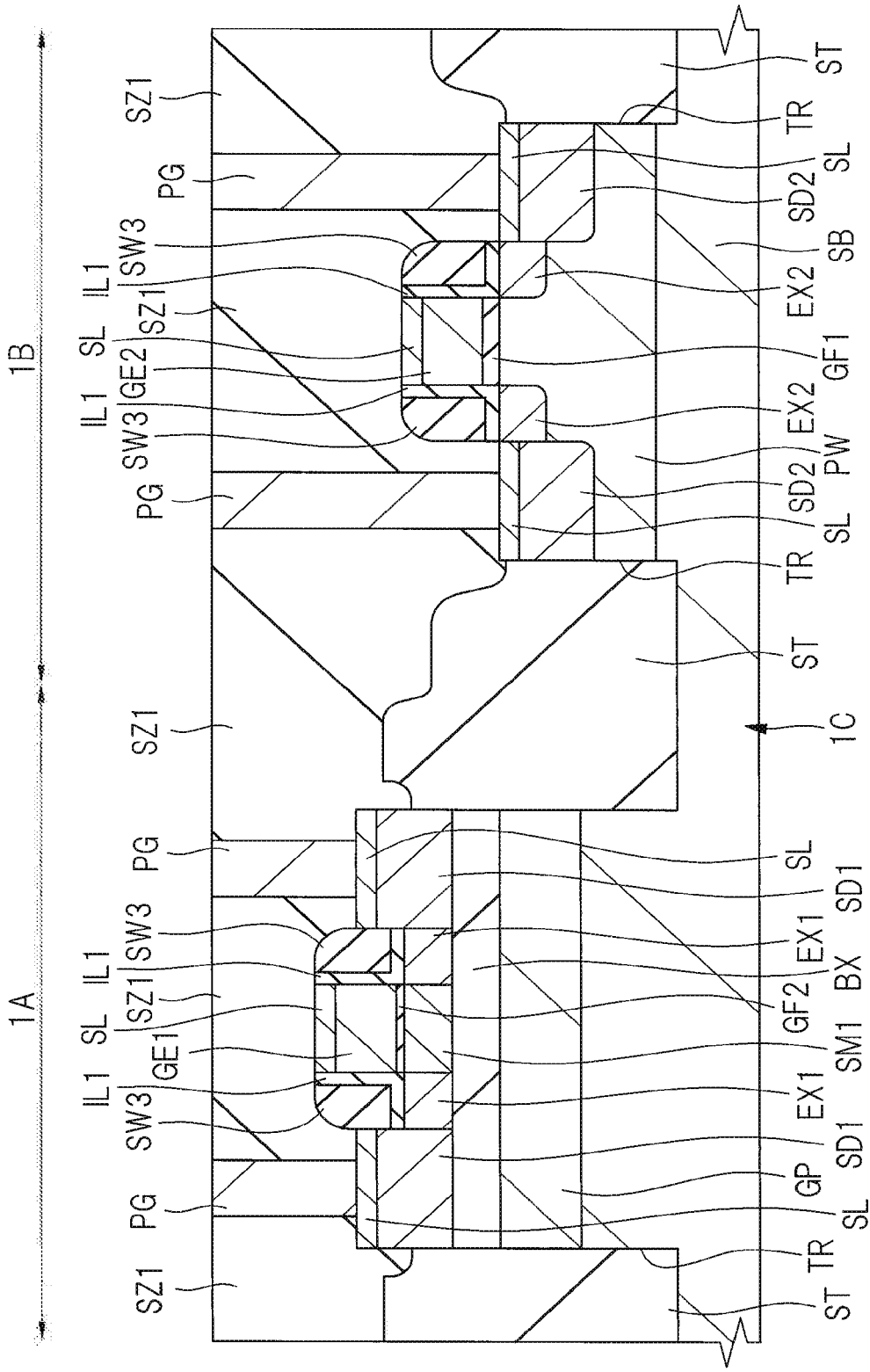
FIG. 36 is a cross-sectional view showing a principal part of the semiconductor device in the manufacturing process continued from FIG. 35.

Next, as shown in FIG. 36, an insulating film SZ1 as an interlayer insulating film is formed over the main surface of the substrate 1C so as to cover the gate electrodes GE1 and GE2 and the sidewall spacers SW3. A single film of a silicon oxide film or a stacked film of a silicon nitride film and a thick silicon oxide film thereon can be used as the insulating film SZ1. After the insulating film SZ1 is formed, the upper surface of the insulating film SZ1 may be polished by the CMP method as needed.

Next, the insulating film SZ1 is dry-etched with using a photoresist pattern (not shown) formed over the insulating film SZ1 as an etching mask, thereby forming contact holes (through holes) in the insulating film SZ1.

Figure 37:
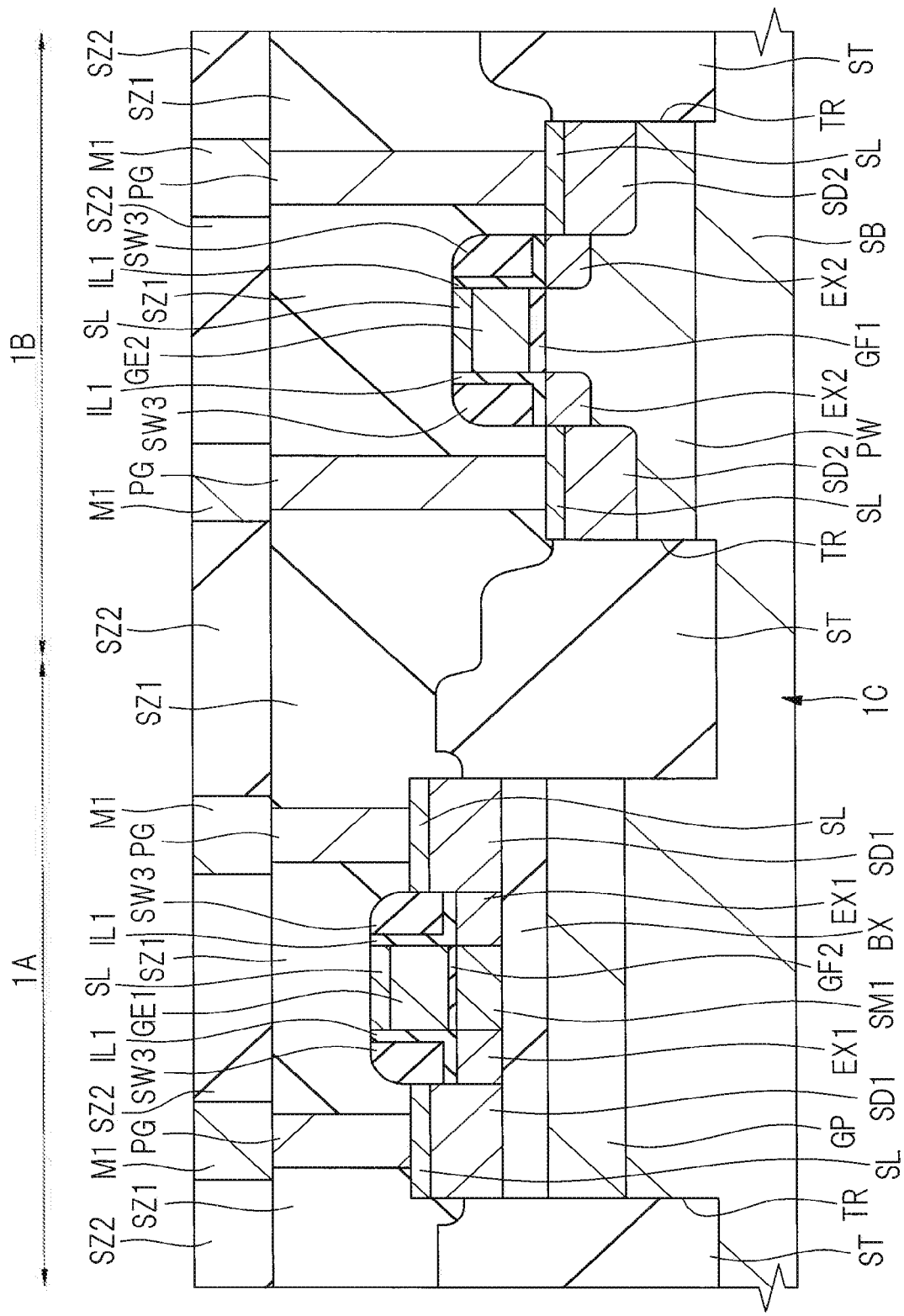
FIG. 37 is a cross-sectional view showing a principal part of the semiconductor device in the manufacturing process continued from FIG. 36.

Then, a conductive plug PG made of, for example, tungsten (W) is formed in each of the contact holes. For example, the plug PG can be formed by sequentially forming a barrier conductor film and a tungsten film over the insulating film SZ1 including the inside of the contact hole and then removing unnecessary main conductor film and barrier conductor film outside the contact hole by the CMP method or Next, as shown in FIG. 37, after an insulating film SZ2 is formed over the insulating film SZ1 in which the plugs PG have been embedded and wiring trenches are formed in a predetermined region of the insulating film SZ2, a wiring M1 is embedded in each of the wiring trenches by the single damascene method. The wiring M1 is, for example, a copper wiring (embedded copper wiring) made mainly of copper. The wiring M1 is electrically connected to the n$^+$ type semiconductor region SD1, the n$^+$ type semiconductor region SD2, the gate electrode GE1 or the gate electrode GE2 via the plug PG.

Then, wirings in second and subsequent layers are formed by the dual damascene method or the like, but the illustration and description thereof are omitted here. Also, the wiring M1 and the wirings in the upper layers thereof are not limited to the damascene wirings and can be formed by patterning a conductor film for wiring, and a tungsten wiring or an aluminum wiring may be formed as these wirings.

In the manner described above, the semiconductor device according to the present embodiment is manufactured.

Also, in the present embodiment, the case where the n channel MISFET is formed as a MISFET has been described, but it is also possible to form a p channel MISFET by reversing the conductivity type. In addition, either or both the n channel MISFET and the p channel MISFET can be formed in the SOI region 1A, and either or both the n channel MISFET and the p channel MISFET can be formed in the bulk region 1B.

Examined Example

Figure 38:
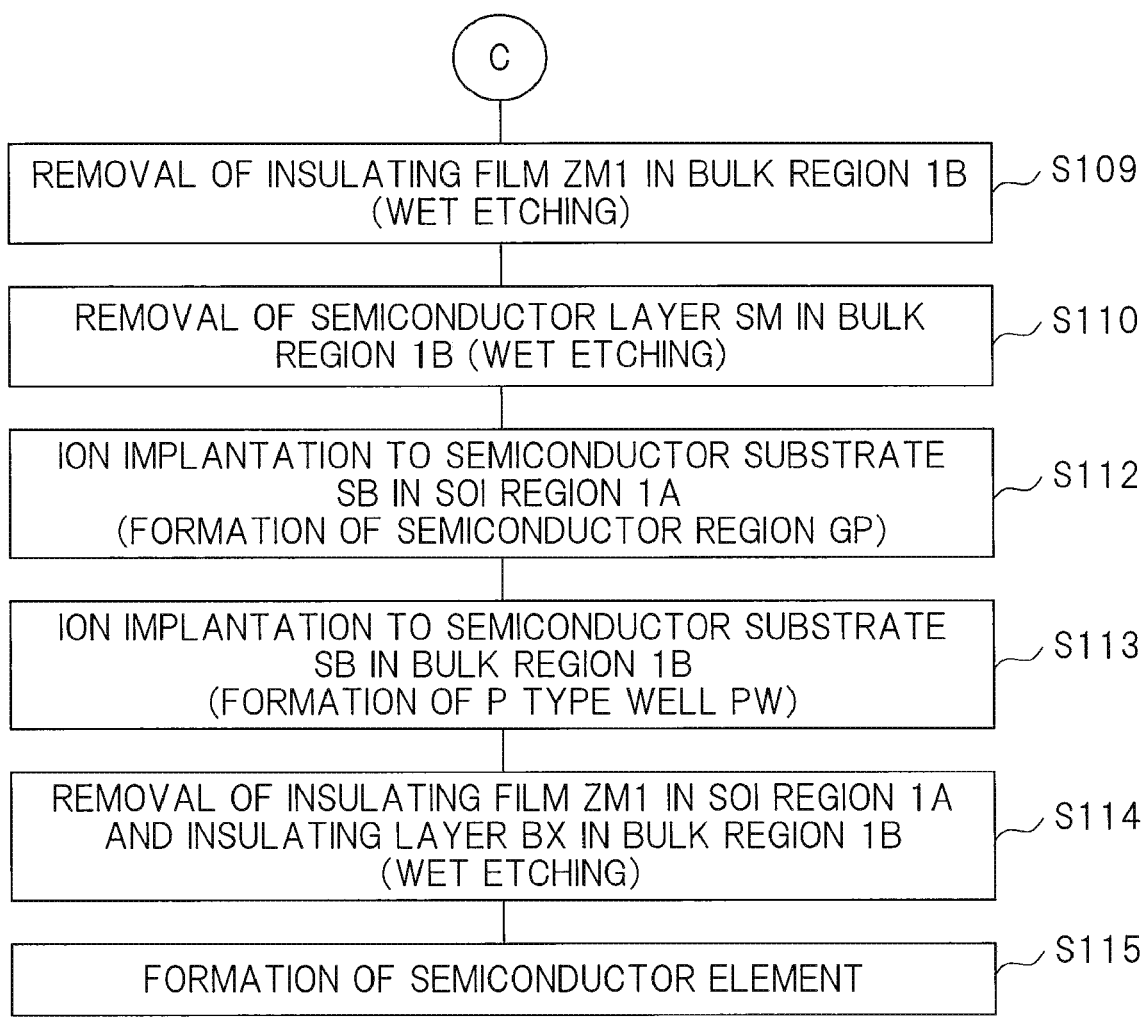
FIG. 38 is a process flow diagram showing a manufacturing process of a semiconductor device according to an examined example.

An examined example studied by the inventor of the present invention will be described with reference to FIGS. 38 to 45. FIG. 38 is a process flow diagram, showing a manufacturing process of a semiconductor device according to the examined example, and it corresponds to FIG. 2 described above. FIGS. 39 to 45 are cross-sectional views showing a principal part of the semiconductor device in the manufacturing process according to the examined example.

Figure 39:
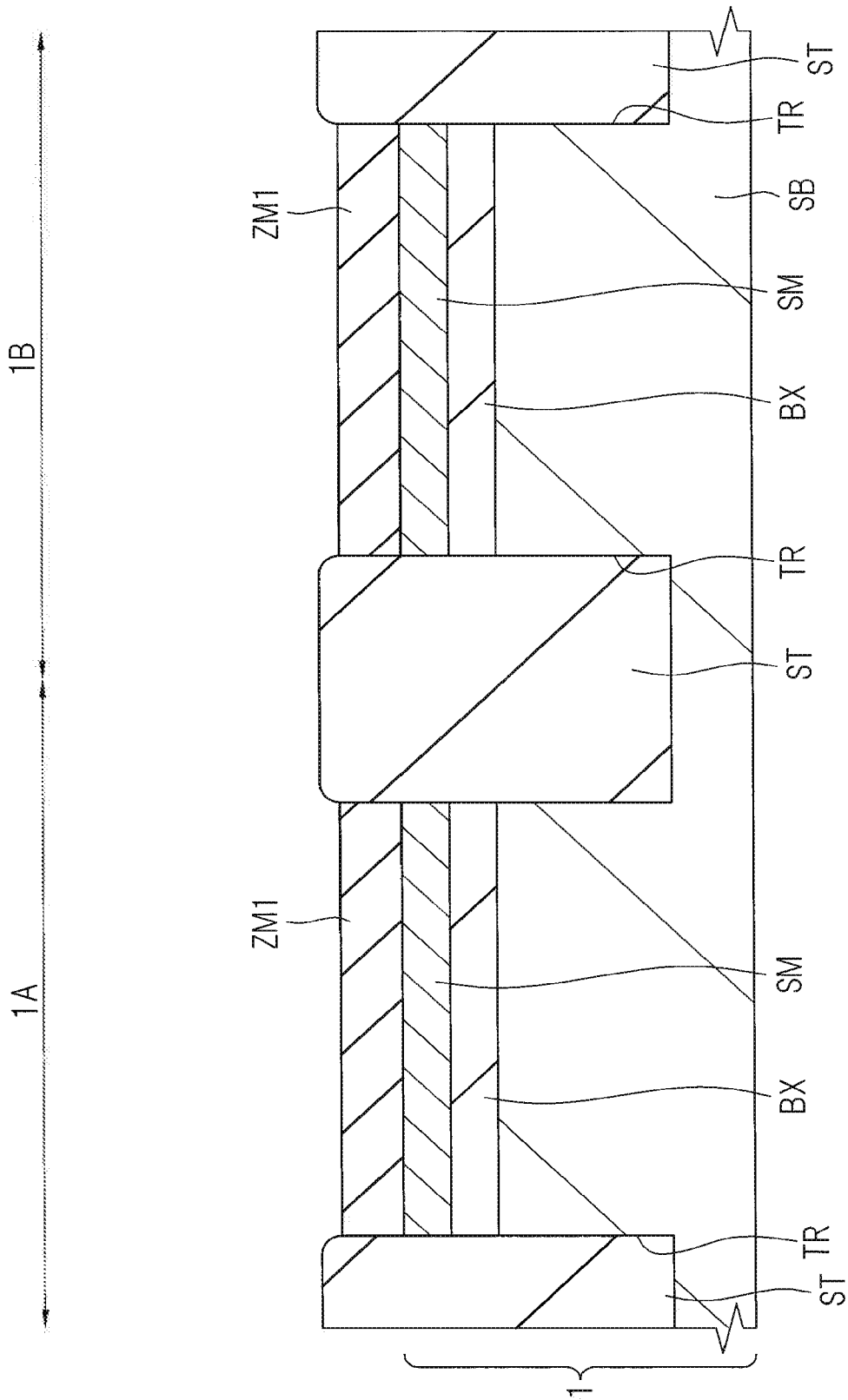
FIG. 39 is a cross-sectional view showing a principal part of the semiconductor device in the manufacturing process according to the examined example.

The structure of FIG. 39 corresponding to FIG. 9 described above is obtained by performing the process corresponding to the steps S1 to S8 described above. In FIG. 39, the SOI region 1A and the bulk region 1B have the same structure, in which the insulating layer BX, the semiconductor layer SM and the insulating film ZM1 are sequentially stacked in this order from below over the semiconductor substrate SB.

However, the examined example (FIG. 39) differs from the present embodiment (FIG. 9) in the thickness of the insulating film ZM1. Namely, the thickness of the insulating film ZM1 formed in the step S2 in the examined example needs to be larger than the thickness of the insulating film ZM1 formed in the step S2 in the present embodiment. This is because, since the examined example does not include the process corresponding to the step S11 described above, the formation thickness of the insulating film ZM1 needs to be set to approximately the same value as the thickness of the insulating layer BX in the bulk region 1B at the stage when the step S110 described later is finished.

Figure 40:
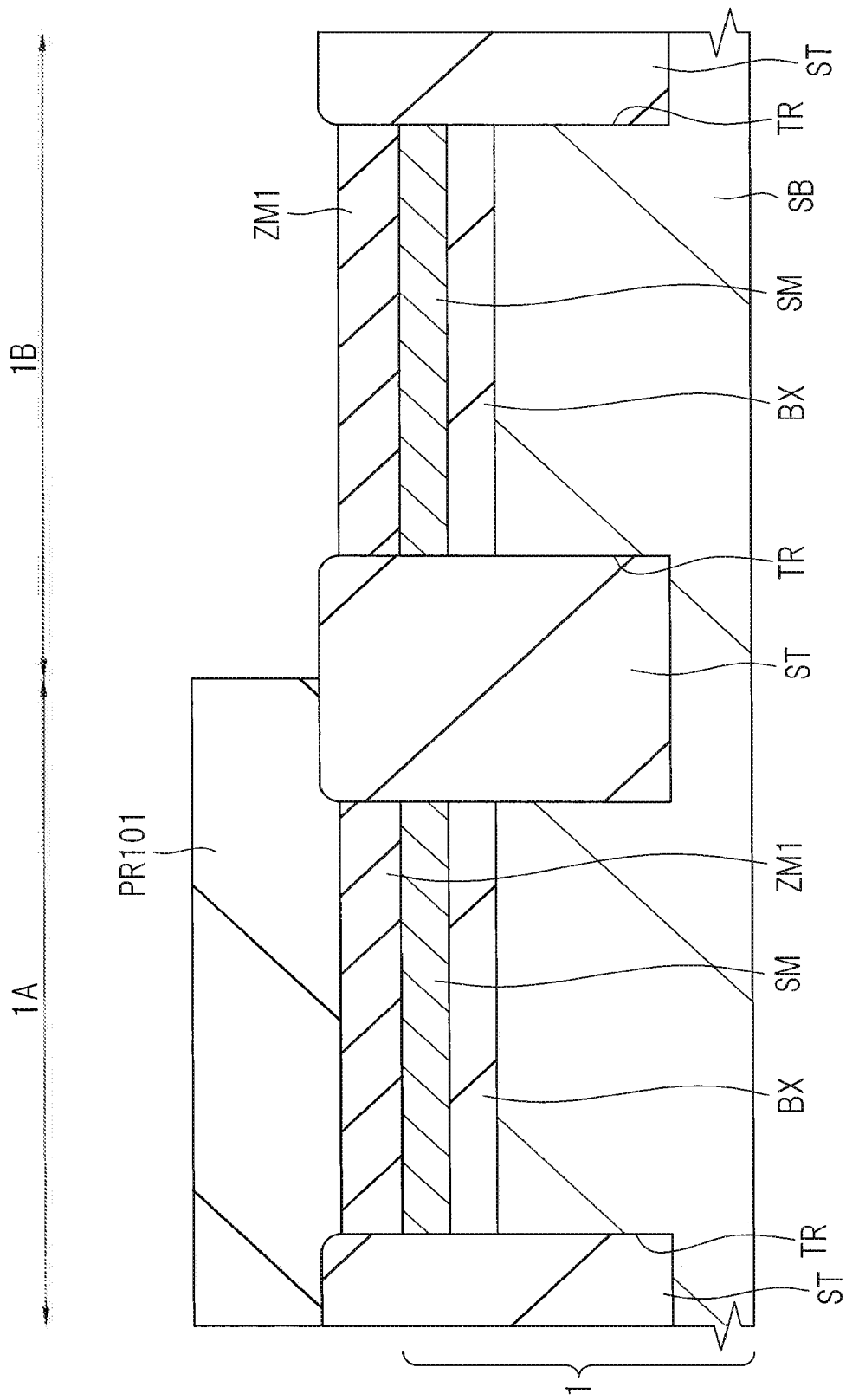
FIG. 40 is a cross-sectional view showing a principal part of the semiconductor device in the manufacturing process according to the examined example continued from FIG. 39.

In the case of the examined example, after the structure of FIG. 39 is obtained, a photoresist pattern PR101 which covers the SOI region 1A and exposes the bulk region 1B is formed as shown in FIG. 40. The insulating film ZM1 in the SOI region 1A is covered with the photoresist pattern PR101, but the insulating film ZM1 in the bulk region 1B is exposed without being covered with the photoresist pattern PR101. An end portion (side surface) of the photoresist pattern PR101 is located on the element isolation region ST provided between the SOI region 1A and the bulk region 1B.

Figure 41:
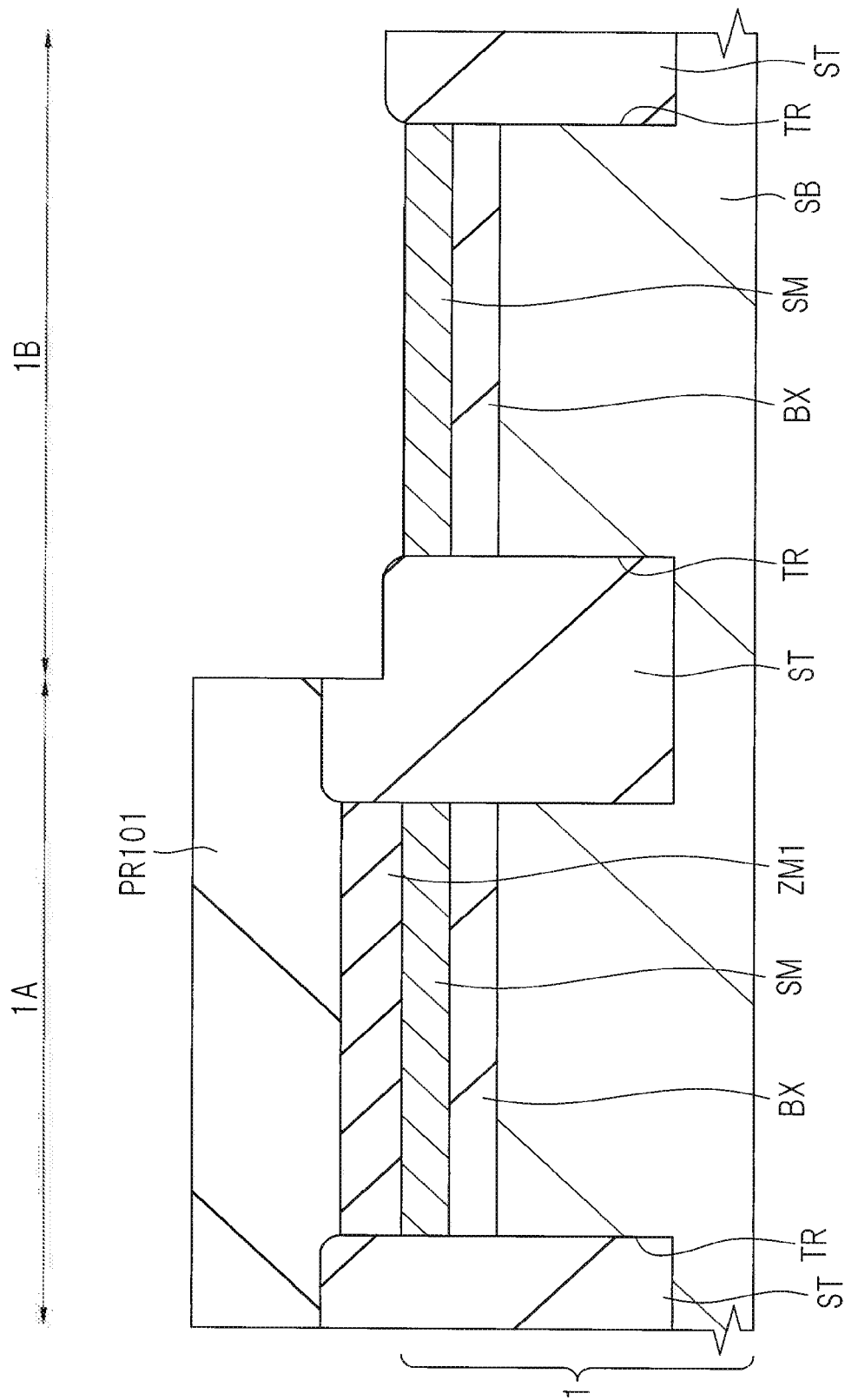
FIG. 41 is a cross-sectional view showing a principal part of the semiconductor device in the manufacturing process according to the examined example continued from FIG. 40.

Next, as shown in FIG. 41, the insulating film ZM1 in the bulk region 1B is removed by wet etching with using the photoresist pattern PR101 as an etching mask (step S109 of FIG. 38). At this time, the insulating film ZM1 is removed by wet etching under the condition that the semiconductor layer SM is hard to be etched compared with the insulating film ZM1. In this manner, the insulating film ZM1 in the bulk region 1B can be removed by etching, and the semiconductor layer SM can be made to function as an etching stopper. When the insulating film ZM1 is made of silicon oxide, hydrofluoric acid is used as etching solution in the step S109.

When the insulating film ZM1 has been removed by etching in the bulk region 1B, the upper surface of the semiconductor layer SM is exposed. Meanwhile, in the SOI region 1A, the insulating film ZM1 is covered with the photoresist pattern RP101, and thus remains without being etched. Also, a part of the element isolation region ST covered with the photoresist pattern PR101 is not etched, but another part of the element isolation region ST exposed without being covered with the photoresist pattern PR101 is etched to an extent similar to the etching thickness (etching amount) of the insulating film ZM1 in the bulk region 1B. Thereafter, as shown in FIG. 42, the photoresist pattern PR101 is removed by ashing or the like.

Figure 42:
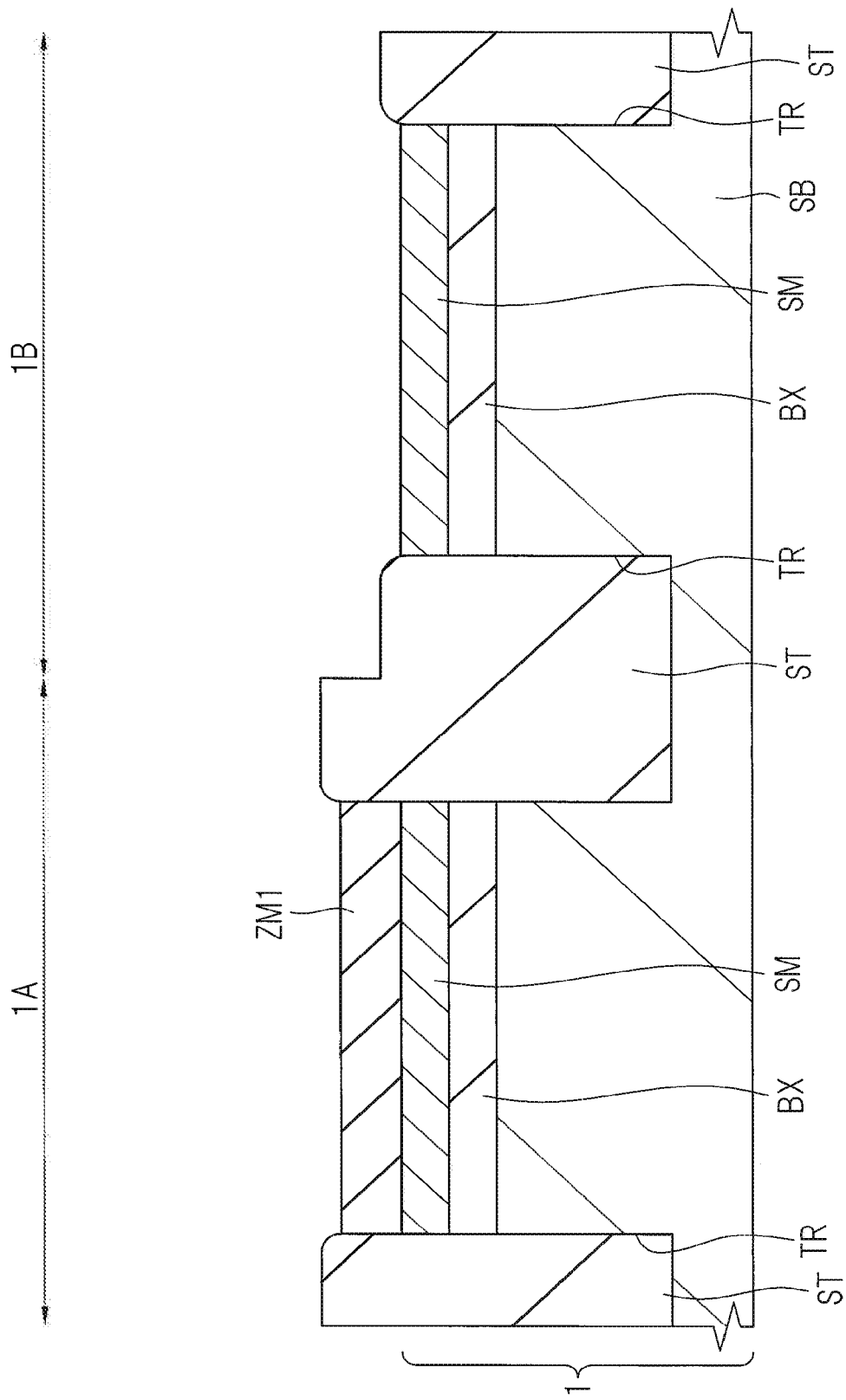
FIG. 42 is a cross-sectional view showing a principal part of the semiconductor device in the manufacturing process according to the examined example continued from FIG. 41.

At this stage, as shown in FIG. 42, the insulating film ZM1 remains and the upper surface of the insulating film ZM1 is exposed in the SOI region 1A, while the insulating film ZM1 is removed and the upper surface of the semiconductor layer SM is exposed in the bulk region 1B.

Figure 43:
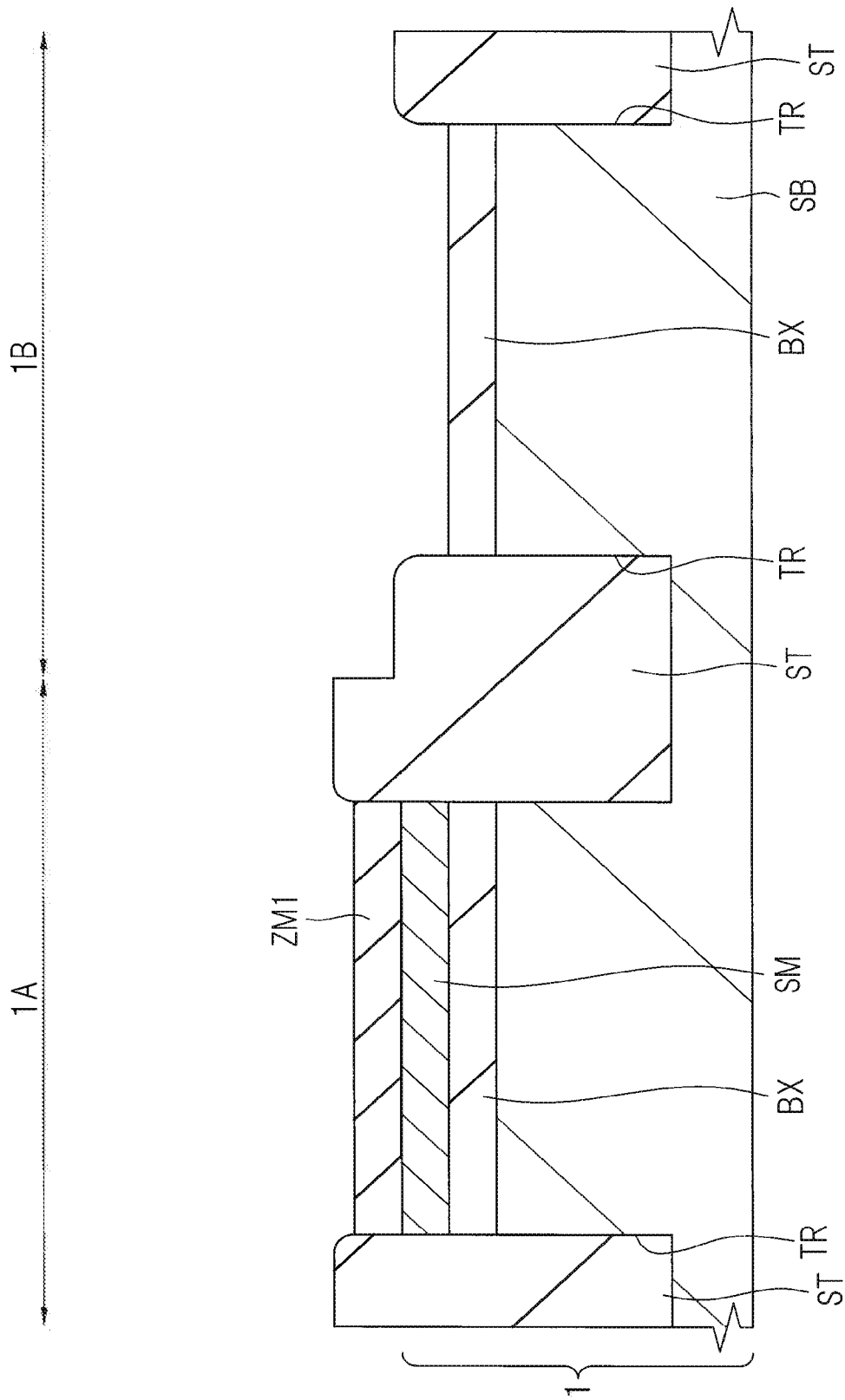
FIG. 43 is a cross-sectional view showing a principal part of the semiconductor device in the manufacturing process according to the examined example continued from FIG. 42.

Next, as shown in FIG. 43, the semiconductor layer SM in the bulk region 1B is removed by wet etching (step S110 of FIG. 38). At this time, it is preferable that the semiconductor layer SM in the bulk region 1B is removed by etching under the condition that the insulating layer BX, the insulating film ZM1 and the element isolation region ST are hard to be etched compared with the semiconductor layer SM. In this manner, the semiconductor layer SM in the bulk region 1B can be removed by etching, and the insulating layer BX in the bulk region 1B can be made to function as an etching stopper. APM solution (Ammonium Hydrogen-Peroxide Mixture) can be suitably used for the wet etching in this case. APM solution corresponds to mixture of ammonia water and hydrogen peroxide solution. When the semiconductor layer SM has been removed by wet etching in the bulk region 1B, the upper surface of the insulating layer BX is exposed. Meanwhile, in the SOI region 1A, the semiconductor layer SM is covered with the insulating film ZM1, and thus remains without being etched.

Also, the wet etching in the step S110 is performed in the state where the upper surface of the semiconductor layer SM in the bulk region 1B, the upper surface of the insulating film ZM1 in the SOI region 1A, and the upper surface of the element isolation region ST are exposed. Therefore, the surface layer portion of the insulating film. ZM1 in the SOI region 1A and the surface layer portion of the element isolation region ST are wet-etched to some extent when the semiconductor layer SM in the bulk region 1B is wet-etched. However, at the stage when the wet etching is finished, the insulating film ZM1 in the SOI region 1A remains in the form of a layer and the semiconductor layer SM in the SOI region 1A is not exposed.

At this stage, as shown in FIG. 43, the insulating film ZM1 remains in the form of a layer and the upper surface of the insulating film ZM1 is exposed in the SOI region 1A. Meanwhile, in the bulk region 1B, the insulating film ZM1 and the semiconductor layer SM are removed and the upper surface of the insulating layer BX is exposed.

Next, the process similar to the step S12 described above (step S112 of FIG. 38) and the process similar to the step S13 described above (step S113 of FIG. 38) are performed to form the semiconductor region GP and the p type well PW as shown in FIG. 44.

Then, as shown in FIG. 45, the insulating film ZM1 in the SOI region 1A and the insulating layer BX in the bulk region 1B are removed by wet etching (step S114 of FIG. 38). At this time, it is preferable that the insulating film ZM1 in the SOI region 1A and the insulating layer BX in the bulk region 1B are removed by etching under the condition that the semiconductor layer SM and the semiconductor substrate SB are hard to be etched compared with the insulating film ZM1 and the insulating layer BX. In this manner, the insulating film ZM1 in the SOI region 1A and the insulating layer BX in the bulk region 1B can be removed by etching, and the semiconductor layer SM in the SOI region 1A and the semiconductor substrate SB in the bulk region 1B can be made to function as an etching stopper. When the insulating film ZM1 and the insulating layer BX are made of silicon oxide, hydrofluoric acid can be used as etching solution in the step S114.

Since the wet etching in the step S114 is performed in the state where the upper surface of the element isolation region ST, the upper surface of the insulating film ZM1 in the SOI region 1A, and the upper surface of the insulating layer BX in the bulk region 1B are exposed, the surface layer portion of the element isolation region ST, the insulating film ZM1 in the SOI region 1A, and the insulating layer BX in the bulk region 1B are removed by wet etching. The element isolation region ST is also wet-etched to an extent similar to the etching amount (etching thickness) of the insulating film ZM1 in the SOI region 1A and the insulating layer BX in the bulk region 1B.

In the case of the manufacturing process of the examined example, the etching process corresponding to the step S11 described above is not performed. Therefore, the thickness of the insulating layer BX in the bulk region 1B and the thickness of the insulating film ZM1 in the SOI region 1A at a stage immediately before performing the etching process in the step S114 are considerably thick. Accordingly, it is necessary to set the etching amount (etching thickness) in the step S114 to an etching amount capable of reliably removing the thick insulating layer BX and insulating film ZM1.

In this manner, the semiconductor layer SM and the insulating layer BX are removed and the upper surface of the semiconductor substrate SB is exposed (SOI structure disappears) in the bulk region 1B, and the semiconductor layer SM and the insulating layer BX remain and the SOI structure is maintained in the SOI region 1A (see FIG. 45).

Thereafter, also in the case of the examined example, the process similar to the step S15 described above is performed (step S115 of FIG. 38) to form the MISFET in each of the SOI region 1A and the bulk region 1B, but illustration and description thereof are omitted here.

In the case of the manufacturing process of the examined example (FIGS. 38 to 45), the etching process of the steps S109 and S110 corresponding to the steps S9 and S10 described above is performed by wet etching unlike the present embodiment. Namely, in the case of the examined example, the insulating film ZM1 in the bulk region 1B is removed by wet etching in the process of the step S109 (FIG. 41) corresponding to the step S9 described above. In addition, in the case of the examined example, the semiconductor layer SM in the bulk region 1B is removed by wet etching in the process of the step S101 (FIG. 43) corresponding to the step S10 described above. Further, in the case of the examined example, the etching process (etching process for reducing the thickness of the insulating layer BX in the bulk region 1B) corresponding to the step S11 described above is not performed.

In the case of the examined example, after the structure of FIG. 44 is obtained by performing the steps S112 and S113 corresponding to the steps S12 and S13 described above, the insulating film ZM1 in the SOI region 1A and the insulating layer BX in the bulk region 1B are removed by performing the etching process in the step S114 (FIG. 45) corresponding to the step S14, whereby the upper surface of the semiconductor layer SM in the SOI region 1A and the upper surface of the semiconductor substrate SB in the bulk region 1B are exposed. However, if this etching process of the step S114 is performed, there is a possibility that divots (recesses, hollow parts) DT are formed in the element isolation region ST as shown in FIG. 45. The divot DT is likely to be formed at the end portion (end portion adjacent to the semiconductor layer SM) of the element isolation region ST. The divot DT of the element isolation region ST is formed when the element isolation region ST is excessively etched by the solution (etching solution) used in the wet etching process.

When the divot DT of the element isolation region ST is formed at a position adjacent to the semiconductor layer SM in the SOI region 1A as shown in FIG. 45, various failures may occur, and one example of the failures will be described below.

It is assumed that the divot DT of the element isolation region ST is formed at a position adjacent to the semiconductor layer SM in the SOI region 1A, the divot DT reaches the insulating layer BX in the SOI region 1A, and the insulating layer BX exposed from the divot DT is side-etched as shown in FIG. 45. In this case, when the silicon film PS is formed and the gate electrodes GE1 and GE2 are then formed by patterning the silicon film PS, a residual part of the silicon film PS (hereinafter referred to as "residual part of silicon film PS") is left in the divot DT. When the residual part of the silicon film PS is left in the divot DT, the residual part of the silicon film PS is adjacent to the semiconductor layer SM via a thin insulating film, and is thus adjacent to the $n^+$ type semiconductor region SD1 (source/drain region) via the thin insulating film. The thin insulating film interposed between, the residual part of the silicon film PS in the divot DT and the semiconductor layer SM ($n^1$ type semiconductor region SD1) is the insulating film in the same layer formed by the same process as the gate insulating film GF2. In addition, since the end portion of the gate electrode GE1 in the gate width direction is located on the element isolation region ST, the residual part of the silicon film PS in the divot DT is in a state of being integrally connected to the gate electrode GE1, and thus the residual part of the silicon film PS in the divot DT is electrically connected to the gate electrode GE1. Accordingly, the formation of the residual part of the silicon film PS in the divot DT results in that the residual part of the silicon film, PS in the divot DT electrically connected to the gate electrode GE1 is adjacent to the source/drain region ($n^+$ type semiconductor region SD1) via a thin insulating film, so that there is a fear of generating a leakage current between the gate electrode GE1 and the source/drain region ($n^+$ type semiconductor region SD1). This leads to the decrease in the reliability of the semiconductor device.

As described above, since the formation of the divot DT in the element isolation region ST and the deep depth of the divot DT lead to the decrease in the reliability of the semiconductor device, it is desirable for the improvement in the reliability of the semiconductor device that the formation of the divot DT in the element isolation region ST is suppressed or the depth of the divot DT is made shallower even if the divot DT is formed. Further, since the divot DT formed before the process of forming the gate insulating films GF1 and GF2 tends to lead to the decrease in the reliability of the semiconductor device, it is desirable that the formation of the divot DT in the element isolation region ST is suppressed before the process of forming the gate insulating films GF1 and GF2.

The divot DT of the element isolation region ST is formed when the element isolation region ST is excessively etched by the solution (etching solution) used in the wet etching. The wet etching process that may cause the divot DT includes the wet etching process in the step S110 and the wet etching process in the step S114.

The reason why the element isolation region ST is etched in the wet etching process of the step S110 will be described.

In the wet etching process, depending on the type of etching solution to be used, wet etching may be difficult to perform in a state where a photoresist pattern is formed. Although the semiconductor layer SM is wet-etched in the step S110, it is hard to use an etching solution suitable for the wet etching of the semiconductor layer SM such as APM solution in a state where a photoresist pattern is formed. Therefore, since the wet etching process of the step S110 for removing the semiconductor layer SM in the bulk region 1B is performed in a state where no photoresist pattern is formed, the wet etching process is inevitably performed in a state where the surface of the element isolation region ST is exposed. In the step S110, the etching solution which easily etches the semiconductor layer SM, for example, APM solution is used, but since the photoresist pattern is not formed, the insulating film ZM1 in the SOI region 1A and the element isolation region ST are also etched to some extent. For this reason, the element isolation region ST is wet-etched in the step S110, and this is one of the causes that the divot DT is likely to be formed in the element isolation region ST.

Next, the wet etching process in the step S114 will be described. In the wet etching process in the step S114, the element isolation region ST is excessively etched and the divot DT is likely to be formed due to a first factor and a second factor. The first factor is that the ion implantation process is performed before the wet etching process in the step S114 and impurity ions are implanted also into the element isolation region ST during the ion implantation. The second factor is that the etching amount in the wet etching process in the step S114 is large.

When impurity ions have been implanted into the element isolation region ST before the wet etching process in the step S114, the element isolation region ST becomes susceptible to etching, and the etching rate in the wet etching process in the step S114 is likely to be high.

Therefore, it is conceivable to suppress the formation of the divot DT by preventing the implantation of the impurity ions into the element isolation region ST before the wet etching process in the step S114 so as to prevent the element isolation region ST from being excessively etched in the wet etching process in the step S114. However, it is sometimes desired that the semiconductor region GP is formed in the semiconductor substrate SB in the SOI region 1A so as to control the threshold voltage of the MISFET formed in the SOI region 1A. In such a case, it is desirable that the semiconductor region GP is formed by performing the ion implantation before the wet etching process in the step S114 is performed. This is because, if the semiconductor region GP is to be formed by the ion implantation after the wet etching process in the step S114 and before the formation of the gate insulating film, a photoresist pattern corresponding to the photoresist pattern PR2 described above is formed directly on the exposed surface of the semiconductor substrate SB (silicon surface) in the bulk region 1B, and this is not desirable. However, if the semiconductor region GP is to be formed by the ion implantation after the gate insulating film is formed or after the silicon film PS is formed, the gate insulating film and the silicon film PS are affected by the ion implantation and the characteristics of the MISFET may be affected, and this is also not desirable. Further, if the semiconductor region GP is to be formed by the ion implantation after the gate electrode is formed, there is a fear that the semiconductor region GP cannot be correctly formed due to the hindrance of the gate electrode. Consequently, it is desirable that the semiconductor region GP is formed by performing the ion implantation before the wet etching process in the step S114 is performed.

When the semiconductor region GP is formed by performing the ion implantation, the ion implantation is performed in the state where a photoresist pattern (PR2) is formed in order to prevent the ion implantation into the semiconductor substrate SB in the bulk region 1B, but impurity ions to be implanted are implanted not only into the semiconductor substrate SB in the SOI region 1A but also into a part of the element isolation region ST, which is not covered with the photoresist pattern (PR2). Namely, impurity ions are implanted also into a part of the element isolation region ST adjacent to the semiconductor layer SM in the SOI region 1A in a plan view. Therefore, after the semiconductor region GP is formed by performing the ion implantation and immediately before the wet etching process in the step S114 is performed, impurity ions are considerably implanted into the element isolation region ST at a position (region) adjacent to the semiconductor layer SM in the SOI region 1A in a plan view. When impurity ions have been implanted by the ion implantation into the element isolation region ST, the element isolation region ST becomes susceptible to etching, and the etching rate thereof is likely to be high. Namely, in the element isolation region ST, the region through which impurity ions implanted by the ion implantation have passed and the region in which impurity ions implanted by the ion implantation are present become susceptible to etching (etching rate thereof is likely to be high). Accordingly, when impurity ions are considerably implanted into the element isolation region ST at a position (region) adjacent to the semiconductor layer SM in the SOI region 1A in a plan view, there is a fear that the divot DT is formed at the position adjacent to the semiconductor layer SM in the SOI region 1A when the wet etching process of the step S114 is performed.

Therefore, it is conceivable that the thickness of the insulating layer BX at the stage when the SOI substrate 1 is prepared in the step S1 and the thickness of the insulating film ZM1 at the stage when the insulating film ZM1 is formed in the step S2 are reduced in advance. By this means, since the thickness of the insulating film ZM1 in the SOI region 1A and the insulating layer BX in the bulk region 1B to be etched in the wet etching process in the step S114 are reduced, so that the etching amount in the step S114 can be reduced and the etching amount of the element isolation region ST in the step S114 can be reduced. Consequently, since it is possible to prevent the element isolation region ST from being excessively etched in the wet etching process in the step S114, the formation of the divot DT can be suppressed or the depth of the divot DT can be made shallower even if the divot DT is formed.

However, it is not easy to reduce the thickness of the insulating layer BX at the stage when the SOI substrate 1 is prepared in the step S1. This is because, if the thickness of the insulating layer BX at the stage when the SOI substrate 1 is prepared in the step S1 is reduced, the thickness of the insulating layer BX in the SOI region 1A inevitably becomes small in the manufactured semiconductor device, but the thickness of the insulating layer BX in the SOI region 1A should be set to the optimum thickness in accordance with the required characteristics of the semiconductor device or the like. Note that, as the thickness of the insulating layer BX in the SOI region 1A in the manufactured semiconductor device, the thickness of the insulating layer BX at the stage when the SOI substrate 1 is prepared in the step S1 is maintained. There is a fear that the characteristics of the semiconductor device are adversely affected if the thickness of the insulating layer BX in the SOI region 1A is reduced. In addition, in the case of the examined example, even when the thickness of the insulating film ZM1 is reduced at the stage when the insulating film ZM1 is formed in the step S2, the etching amount in the wet etching process in the step S114 cannot always be reduced. This is because, even when the thickness of the insulating film ZM1 at the stage when the insulating film ZM1 is formed in the step S2 is reduced in the case of the examined example, if the insulating layer BX has a large thickness, the etching amount in the wet etching process in the step S114 needs to be set to the etching amount sufficient to remove the insulating layer BX in the bulk region 1B.

Also, in the case where the threshold voltage of the MISFET in the SOI region 1A is controlled by applying a voltage to the semiconductor region GP, if the thickness of the insulating layer BX in the SOI region 1A is too small, the reliability of the insulating layer BX, for example, TDDB (Time Dependence on Dielectric Breakdown) lifetime may be lowered, and it is thus desirable to secure the thickness of the insulating layer BX in the SOI region 1A to some extent.

As described above, since it is necessary to set the thickness of the insulating layer BX in the SOI region 1A in consideration of the required characteristics of the semiconductor device, it is not easy to reduce the thickness of the insulating layer BX at the stage when the SOI substrate 1 is prepared in the step S1. Therefore, in the case of the manufacturing process of the examined example, the insulating film ZM1 in the SOI region 1A and the insulating layer BX in the bulk region 1B at the stage immediately before performing the wet etching process in the step S114 are considerably thick, and thus the etching amount in the wet etching process in the step S114 becomes considerably large. Further, in the case of the manufacturing process of the examined example, the ion implantation for forming the semiconductor region GP in the semiconductor substrate SB in the SOI region 1A has been performed before performing the wet etching process in the step S114, and thus impurity ions have been considerably implanted also into the element isolation region ST during the ion implantation.

Therefore, in the case of the manufacturing process in the examined example shown in FIGS. 38 to 45, the etching rate of the element isolation region ST into which impurity ions have been considerably implanted is likely to be high when performing the wet etching process in the step S114. In addition, since the etching rate in the wet etching process in the step S114 is considerably high, there is a fear that the divot DT is formed at the position adjacent to the semiconductor layer SM in the SOI region 1A.

As described above, in the case of the manufacturing process in the examined example shown in FIGS. 38 to 45, there is a fear that the divot DT is formed at the position adjacent to the semiconductor layer SM in the SOI region 1A because the element isolation region ST is wet-etched in the wet etching process in the step S110 and the wet etching process in the step S114. Since the formation of the divot DT leads to the decrease in the reliability of the manufactured semiconductor device, it is desirable for the improvement in the reliability of the semiconductor device that the formation of the divot DT in the element isolation region ST is suppressed or the depth of the divot DT is made shallower even if the divot DT is formed.

Main Characteristics of Present Embodiment

One of the main characteristics of the present embodiment is that the etching process in each of the steps S9, S10 and S11 is performed by dry etching. Another one of the main characteristics of the present embodiment is that the etching process in the step S11 is performed.

In the present embodiment, the photoresist pattern PR1 (first mask layer) which covers the insulating film ZM1 in the SOI region 1A (first region) and exposes the insulating film ZM1 in the bulk region 1B (second region) is formed, and then the insulating film ZM1 in the bulk region 1B is removed by dry etching with using the photoresist pattern PR1 as an etching mask to expose the semiconductor layer SM in the bulk region 1B in the step S9. Thereafter, in the step S10, the semiconductor layer SM in the bulk region 1B is removed by dry etching with using the photoresist pattern PR1 as an etching mask to expose the insulating layer BX in the bulk region 1B. Then, in the step S11, the insulating layer BX in the bulk region 1B is dry-etched with using the photoresist pattern PR1 as an etching mask to reduce the thickness of the insulating layer BX in the bulk region 1B. In the present embodiment, since the etching process in each of the steps S9, S10 and S11 is performed by dry etching, and thus the formation of the divot DT can be suppressed or prevented. The specific descriptions thereof will be given below.

In the present embodiment, the etching process in each of the steps S9, S10 and S11 is performed by dry etching, and thus the etching process in each of the steps S9, S10 and S11 can be performed in the state where the photoresist pattern PR1 is formed. Namely, the etching process in each of the steps S9, S10 and S11 can be performed in the state where the insulating film ZM1 in the SOI region 1A is covered with the photoresist pattern PR1. If the insulating film ZM1 in the SOI region 1A is covered with the photoresist pattern PR1, the element isolation region ST in a region adjacent to the semiconductor layer SM in the SOI region 1A in a plan view is also inevitably covered with the photoresist pattern PR1. Therefore, the etching process in each of the steps S9, S10 and S11 is performed in the state where the element isolation region ST in a region adjacent to the semiconductor layer SM in the SOI region 1A in a plan view is also covered with the photoresist pattern PR1. Consequently, in the present embodiment, the element isolation region ST in a region adjacent to the semiconductor layer SM in the SOI region 1A in a plan view is not etched in the etching process in each of the steps S9, S10 and S11.

In the case of the examined example (FIGS. 38 to 45) described above, the wet etching process in the step S110 is performed in the state where the photoresist pattern is not formed, and this is one of the causes of the formation of the divot DT. On the other hand, in the present embodiment, since the dry etching is performed in the state where the photoresist pattern PR1 is formed in the etching process in each of the steps S9, S10 and S11, the element isolation region ST in a region adjacent to the semiconductor layer SM in the SOI region 1A in a plan view is not etched, and thus the etching process in each of the steps S9, S10 and S11 does not cause the formation of the divot DT. Accordingly, it is possible to suppress or prevent the formation of the divot DT.

Also, in the present embodiment, the etching process in the step S11 is performed, and this can suppress or prevent the formation of the divot DT. The specific descriptions thereof will be given below.

In the present embodiment, after the semiconductor layer SM in the bulk region 1B is removed to expose the insulating layer BX in the bulk region 1B in the etching process of the step S10, the etching process in the step S11 is performed to reduce the thickness of the insulating layer BX in the bulk region 1B. In this manner, since the thickness of the insulating layer BX in the bulk region 1B immediately before performing the etching process in the step S14 can be reduced, the etching amount in the etching process in the step S14 can be reduced, so that it is possible to suppress or prevent the element isolation region ST from being excessively etched in the etching process in the step S14. Therefore, it is possible to suppress or prevent the divot (DT) from being formed in the element isolation region ST in the etching process in the step S14, and the depth of the divot (DT) formed in the element isolation region ST can be made shallower even if the divot is formed in the etching process in the step S14. Consequently, since it is possible to suppress or prevent the failure due to the divot (DT) in the element isolation region ST, the reliability of the semiconductor device can be improved.

It is assumed that the etching process in the step S11 is not performed after the etching process of the step S10 unlike the present embodiment. In this case, since the insulating layer BX in the bulk region 1B immediately before performing the etching process in the step S14 has a large thickness, the etching amount in the step S14 becomes large. Further, since impurity ions are considerably implanted also into the element isolation region S1 in the ion implantation process in the step S12 before the step S14, the etching rate of the element isolation region ST in the step S14 is likely to be high. In this case, there is a fear that the divot (DT) is formed in the element isolation region ST because the etching rate of the element isolation region ST into which impurity ions have been considerably implanted is likely to be high in the etching process in the step S14 and the etching amount in the etching process in the step S14 is large, and this leads to the decrease in the reliability of the semiconductor device.

On the other hand, in the present embodiment, the etching process in the step S11 is performed after the etching process in the step S10, and thus the thickness of the insulating layer BX in the bulk region 1B immediately before performing the etching process in the step S14 can be reduced, so that the etching amount in the step S14 can be reduced. Accordingly, even if the etching rate of the element isolation region ST is likely to be high because impurity ions are considerably implanted also into the element isolation region ST in the ion implantation process in the step S12, since the etching amount in the step S14 can be made small, it is possible to suppress or prevent the formation of the divot in the element isolation region ST, and the depth of the divot can be made shallower even if the divot is formed. In this manner, since the failure due to the divot formed in the element isolation region ST can be suppressed or prevented, the reliability of the semiconductor device can be improved.

As described above, in the case of the examined example shown in FIGS. 38 to 45, there are two factors due to which the element isolation region ST is excessively etched and the divot DT is formed in the etching process in the step S114 corresponding to the step S14. The first factor is that the ion implantation process (corresponding to the step S112) is performed before the etching process in the step S114 and impurity ions are implanted also into the element isolation region ST during the ion implantation. The second factor is that the etching amount in the etching process in the step S114 is large. When the first factor and the second factor are combined, the divot DT is likely to be formed in the element isolation region ST in the etching process in the step S114 corresponding to the step S14. In the present embodiment, the second factor is eliminated by performing the etching process in the step) S11 after the etching process in the step S10 and before the ion implantation in the step S12 to reduce the thickness of the insulating layer BX in the bulk region 1B, so that the formation of the divot (DT) in the element isolation region ST in the step S14 is suppressed or prevented.

In addition, since the step S11 is performed in the present embodiment, the thickness of the insulating layer BX in the bulk region 1B immediately before performing the etching process in the step S14 can be reduced even if the thickness of the insulating layer BX at the stage when the SOI substrate 1 is prepared in the step S1 is not reduced, and the etching amount in the step S14 can be reduced. Therefore, in the present embodiment, the thickness of the insulating layer BX in the SOI region 1A can be set to the optimum thickness in consideration of the required characteristics of the semiconductor device or the like, and the thickness of the insulating layer BX in the bulk region 1B immediately before performing the etching process in the step S14 can be reduced by performing the etching process in the step S11. Accordingly, it is possible to achieve both the optimum thickness of the insulating layer BX in the SOI region 1A set in consideration of the required characteristics of the semiconductor device or the like and the reduction of the etching amount in the step S14 at the same time. Consequently, it is possible to achieve both the performance improvement of the semiconductor device obtained by setting the thickness of the insulating layer BX in the SOI region 1A to the optimum thickness and the performance improvement of the semiconductor device obtained by suppressing or preventing the formation of the divot in the element isolation region ST by the reduction of the etching amount in the step S14.

Other characteristics of the present embodiment will be further described below.

Since the etching process in the step S9 and the etching process in the step S10 are different in the object to be etched, the etching gas to be used is also different. Also, since the etching process in the step S10 and the etching process in the step S11 are different in the object to be etched, the etching gas to be used is also different.

The main purpose of the step S9 is to remove the insulating film ZM1 in the bulk region 1B. Therefore, in the step S9, the insulating film ZM1 in the bulk region 1B is removed by dry etching to expose the semiconductor layer SM in the bulk region 1B under the condition that the insulating film ZM1 is more likely to be etched compared with the semiconductor layer SM, in other words, the semiconductor layer SM is hard to be etched compared with the insulating film ZM1. Namely, in the step S9, the etching condition (including the type of etching gas) that the etching rate of the insulating film ZM1 becomes higher and the etching rate of the semiconductor layer SM becomes lower compared with that of the insulating film ZM1 is selected. In this manner, the insulating film ZM1 in the bulk region 1B can be adequately removed in the etching process in the step S9.

Also, the main purpose of the step S10 is to remove the semiconductor layer SM in the bulk region 1B. Therefore, in the step S10, the insulating layer SM in the bulk region 1B is removed by dry etching to expose the insulating layer BX in the bulk region 1B under the condition that the semiconductor layer SM is more likely to be etched compared with the insulating layer BX, in other words, the insulating layer BX is hard to be etched compared with the semiconductor layer SM. Namely, in the step S10, the etching condition (including the type of etching gas) that the etching rate of the semiconductor layer SM becomes higher and the etching rate of the insulating layer BX becomes lower compared with that of the semiconductor layer SM is selected. In this manner, the semiconductor layer SM in the bulk region 1B can be adequately removed in the etching process in the step S10.

Further, the main purpose of the step S11 is to reduce the thickness of the insulating layer BX in the bulk region 1B. Therefore, the etching rate of the insulating layer BX (including the type of etching gas) in the case of using the etching condition (including the type of etching gas) in the step S11 becomes higher than the etching rate of the insulating layer BX in the case of using the etching condition (including the type of etching gas) in the step S10. Namely, the etching condition (including the type of etching gas) in the step S11 is selected such that the etching rate of the insulating layer BX in the bulk region 1B in the etching process in the step S11 becomes higher than the etching rate of the insulating layer BX in the bulk region 1B in the etching process in the step S10.

It is conceivable that the semiconductor layer SM in the bulk region 1B is removed by dry etching in the step S10 to expose the insulating layer BX in the bulk region 1B, and then the dry etching is continued without changing the etching gas to reduce the thickness of the insulating layer BX in the bulk region 1B unlike the present embodiment. This corresponds to the case where overetching after the semiconductor layer SM in the bulk region 1B is removed to expose the insulating layer BX in the bulk region 1B in the etching process in the step S10 is performed for a long time to reduce the thickness of the insulating layer BX in the bulk region 1B, that is, the case where the overetching is performed for a long time in the step S10 without performing the step S11. In this case, however, it is difficult to accurately control the thickness of the insulating layer BX in the bulk region 1B immediately before performing the etching process in the step S14.

Namely, the etching condition (including the type of etching gas) used in the step S10 is the etching condition suitable for etching the semiconductor layer SM, and the semiconductor layer SM can be selectively etched and the semiconductor layer SM in the bulk region 1B can be adequately removed in the step S10 by using this etching condition. However, since the etching condition used in the step S10 is the etching condition suitable for etching the semiconductor layer SM, the etching rate of the semiconductor layer SM in the case of using this etching condition can be controlled accurately to some extent, but the etching rate of the insulating layer BX in the case of using this etching condition cannot be controlled very accurately. Accordingly, when the overetching is performed for a long time in the step S10 without performing the step S11, the remaining thickness of the insulating layer BX in the bulk region 1B cannot be controlled very accurately even if the thickness of the insulating layer BX in the bulk region 1B is reduced by the overetching, and it is thus difficult to accurately control the thickness of the insulating layer BX in the bulk region 1B immediately before performing the step S14.

As described above, in order to prevent the formation of the divot (DT) in the element isolation region ST in the etching process in the step S14, it is effective to reduce the etching amount in the step S14. In order to reduce the etching amount in the step S14, it is effective to reduce the thickness of the insulating layer BX in the bulk region 1B immediately before performing the etching process in the step S14. However, even when the thickness of the insulating layer BX in the bulk region 1B immediately before performing the etching process in the step S14 is reduced, it is difficult to reduce the etching amount in the step S14 if the thickness cannot be controlled accurately to some extent. This is because, if the thickness of the insulating layer BX in the bulk region 1B immediately before performing the etching process in the step S14 varies, a considerably large etching amount has to be set as the etching amount in the step S14 so as to prevent removal residue of the insulating layer BX in the bulk region 1B after the step S14. In order to reduce the etching amount in the step S14, it is important not only to reduce the thickness of the insulating layer BX in the bulk region 1B immediately before performing the etching process in the step S14 but also to control the thickness of the insulating layer BX in the bulk region 1B immediately before performing the etching process in the step S14 accurately to some extent.

On the other hand, in the present embodiment, after the semiconductor layer SM in the bulk region 1B is removed by dry etching to expose the insulating layer BX in the bulk region 1B in the step S10, the thickness of the insulating layer BX in the bulk region 1B is reduced in the step S11 by using the etching gas different from the etching gas used in the step S10. Therefore, the thickness of the insulating layer BX in the bulk region 1B immediately before performing the etching process in the step S14 can be controlled accurately to some extent in the present embodiment.

Namely, the etching gas used in the step S11 is the etching gas suitable for etching the insulating layer BX. Therefore, the etching rate of the insulating layer BX in the case of using the etching condition (including the type of etching gas) in the step S11 is higher than the etching rate of the insulating layer BX in the case of using the etching condition (including the type of etching gas) in the step S10. By using such an etching condition, the etching rate of the insulating layer BX can be controlled accurately to some extent in the step S11. Therefore, in the present embodiment, the thickness of the insulating layer BX in the bulk region 1B can be reduced and the remaining thickness of the insulating layer BX in the bulk region 1B can be controlled accurately to some extent in the etching process in the step S11. Accordingly, in the present embodiment, it is possible not only to reduce the thickness of the insulating layer BX in the bulk region 1B immediately before performing the etching process in the step S14 but also to control the thickness of the insulating layer BX in the bulk region 1B immediately before performing the etching process in the step S14 accurately to some extent, and it is thus possible to further reduce the etching amount in the step S14. Consequently, it is possible to more reliably suppress or prevent the formation of the divot (DT) in the element isolation region ST in the etching process in the step S14.

In the present embodiment, the thickness of the insulating layer BX at the stage when the SOI substrate 1 is prepared in the step S1 can be set to an optimum thickness in accordance with the required characteristics of the semiconductor device, and the thickness of the insulating layer BX in the bulk region 1B is reduced in the etching process in the step S11. The semiconductor layer SM in the bulk region 1B can be adequately removed by selecting the etching condition suitable for etching the semiconductor layer SM in the step S10, and the thickness of the insulating layer BX in the bulk region 1B can be reduced and the thickness can be accurately controlled to a predetermined thickness by selecting the etching condition suitable for etching the insulating layer BX in the step S11. Accordingly, since the etching amount can be adequately reduced in the etching process in the step S14, it is possible to reliably suppress or prevent the formation of the divot in the element isolation region ST, and the depth of the divot can be made shallower even if the divot is formed. Consequently, it is possible to reliably suppress or prevent the failure due to the divot in the element isolation region ST, and the reliability of the semiconductor device can be reliably improved.

In addition, anisotropic dry etching is preferably performed for the etching process in each of the steps S9 and S11, and isotropic dry etching is preferably performed for the etching process in the step S10. The reason therefor will be described below.

Namely, since the object to be etched is the semiconductor layer SM in the step S10, there is a fear that the etching residue of the semiconductor layer SM remains on the side wall of the element isolation region ST in the bulk region 1B if the anisotropic dry etching is performed, and such an etching residue of the semiconductor layer SM is desirably prevented as much as possible. Therefore, it is preferable that the isotropic dry etching is performed for the etching process in the step S10, and this can reliably prevent the etching residue of the semiconductor layer SM from remaining on the side wall of the element isolation region ST in the bulk region 1B. Note that, when anisotropic dry etching is applied to the etching process in each of the steps S9 and S11, there is a possibility that the etching residue of the insulating film ZM1 and the etching residue of the insulating layer BX remain on the side wall of the element isolation region ST in the bulk region 1B, but these etching residues are made of an insulator and thus do not cause any failure.

Also, when isotropic dry etching is used for the etching process in each of the steps S9 and S11, the element isolation region ST is side-etched below the side surface of the photoresist pattern PR1. Therefore, it is preferable that the anisotropic dry etching is used for the etching process in each of the steps S9 and S11, and this can prevent the element isolation region ST from being side-etched below the side surface of the photoresist pattern PR1. Consequently, the manufacturing process of the present embodiment is applicable even when the planar dimensions of the element isolation region ST are reduced, and is thus advantageous for the miniaturization of the semiconductor device.

Also, when the step S9 and the step S11 are compared, it is more preferable that the etching rate of the insulating layer BX in the step S11 is lower than the etching rate of the insulating film ZM1 in the step S9. Since the semiconductor layer SM in the bulk region 1B can be made to function as an etching stopper in the step S9, the time required for the etching can be shortened by increasing the etching rate of the insulating film ZM1. Meanwhile, since the etching is finished in the step S11 before the semiconductor substrate SB in the bulk region 1B is exposed, there is a fear that the controllability of the etching amount of the insulating layer BX in the bulk region 1B decreases if the etching rate of the insulating layer BX is increased too much. Therefore, the time required for the step S9 is shortened by increasing the etching rate of the insulating film ZM1 in the step S9, and further the etching rate of the insulating layer BX in the step S11 is made lower than the etching rate of the insulating film ZM1 in the step S9, thereby making it easy to control the thickness of the insulating layer BX at the stage when the step S11 is finished, to a predetermined thickness.

In addition, the thickness TB11 of the insulating layer BX in the bulk region 1B immediately after the etching in the step S11 is finished is preferably 3 nm or more (that is, TB11≥3 nm).

When the thickness TB11 of the insulating layer BX in the bulk region 1B immediately after the etching in the step S11 is finished is too small, there is a fear that the semiconductor substrate SB in the bulk region 1B is partially exposed at the stage when the step S11 is finished. When the semiconductor substrate SB in the bulk region 1B is partially exposed at the stage when the step S11 is finished, the photoresist film formed in the step S12 or the step S13 comes into direct contact with the exposed surface of the semiconductor layer SM and the semiconductor substrate SB, and this is not desirable. Therefore, the thickness TB11 of the insulating layer BX in the bulk region 1B immediately after the etching in the step S11 is finished is preferably 3 nm or more, and this can reliably prevent the semiconductor substrate SB in the bulk region 1B from being partially exposed at the stage when the step S11 is finished.

Further, the etching thickness of the insulating layer BX in the bulk region 1B in the etching process in the step S11 is preferably 3 nm or more. Namely, it is preferable that the difference between the thickness TB10 of the insulating layer BX in the bulk region 1B immediately before performing the etching in the step S11 and the thickness TB11 of the insulating layer BX in the bulk region 1B immediately after the etching in the step S11 is finished is 3 nm or more (that is, TB10-TB11≥3 nm). In this manner, since the etching amount in the etching process in the step S14 can be reliably reduced, the effect of suppressing or preventing the formation of the divot in the element isolation region ST in the etching process in the step S14 can be properly achieved.

Also, the problem that the divot is formed in the element isolation region ST is caused due to the fact that the element isolation region ST is made of the same material as the insulating film ZM1 and the insulating layer BX and the element isolation region ST is also etched when the insulating film ZM1 and the insulating layer BX are etched in the etching process in the step S14. Therefore, the present embodiment is quite effective if applied to the case where the element isolation region ST, the insulating film ZM1 and the insulating layer BX are made of the same material. The element isolation region ST, the insulating film ZM1 and the insulating layer BX are preferably made of silicon oxide.

Further, in the present embodiment, it is preferable that a thickness TA14 of the insulating film ZM1 in the SOI region 1A and a thickness TB14 of the insulating layer BX in the bulk region 1B immediately before performing the etching process in the step S14 are equal to each other (that is, TA14=TB14). Note that the thickness TA14 and the thickness TA15 are shown in FIG. 17. In this manner, the etching amount in the etching process in the step S14 can be efficiently reduced, and thus the effect of suppressing or preventing the formation of the divot in the element isolation region ST in the etching process in the step S14 can be properly achieved.

Namely, when the Insulating film ZM1 in the SOI region 1A is thicker than the insulating layer BX in the bulk region 1B immediately before performing the etching process in the step S14, the etching amount in the step S14 needs to be set in accordance with the thickness of the thick insulating film ZM1. Also, when the insulating layer BX in the bulk region 1B is thicker than the insulating film ZM1 in the SOI region 1A immediately before performing the etching process in the step S14, the etching amount in the step S14 needs to be set in accordance with the thickness of the thick insulating layer BX. Therefore, in order to efficiently reduce the etching amount in the step S14, it is more advantageous that the thickness TB14 of the insulating layer BX in the bulk region 1B immediately before performing the etching process in the step S14 is reduced and also the thickness TA14 of the insulating film ZM1 in the SOI region 1A and the thickness TB14 of the insulating layer BX in the bulk region 1B immediately before performing the etching process in the step S14 are made equal to each other.

The thickness TA14 of the insulating film ZM1 in the SOI region 1A and the thickness TB14 of the insulating layer BX in the bulk region 1B immediately before performing the etching process in the step S14 can be made equal to each other (TA14=TB14) if the thickness TA11 of the insulating film ZM1 in the SOI region 1A and the thickness TB11 of the insulating layer BX in the bulk region 1B immediately after the etching process in the step S11 is finished are equal to each other (TA11=TB11). Therefore, it is preferable that the insulating layer BX in the bulk region 1B is dry-etched to reduce the thickness of the insulating layer BX in the bulk region 1B such that the thickness of the insulating layer BX in the bulk region 1B is made equal to the thickness of the insulating film ZM1 in the SOI region 1A in the etching process in the step S11. In this manner, the etching amount in the etching process in the step S14 can be efficiently reduced, and thus the effect of suppressing or preventing the formation of the divot in the element isolation region ST in the etching process in the step S14 can be properly achieved.

In addition, it is desirable that the etching condition in the step S11 is set such that the thickness TA11 of the insulating film ZM1 in the SOI region 1A and the thickness TB11 of the insulating layer BX in the bulk region 1B immediately after the etching process in the step S11 is finished are equal to each other (TA11=TB11). However, even when the etching condition is set in that way, difference may occur between the thickness TA11 of the insulating film ZM1 in the SOI region 1A and the thickness TB11 of the insulating layer BX in the bulk region 1B immediately after the etching process in the step S11 is finished, due to variations in the etching process. Even in such a case, it is preferable that the difference between the thickness of the insulating layer BX in the bulk region 1B and the thickness of the insulating film ZM1 in the SOI region 1A (absolute value of difference) is smaller immediately after the etching process in the step S11 is finished than immediately before performing the step S11. Namely, it is preferable that the difference between the thickness TB11 of the insulating layer BX in the bulk region 1B and the thickness TA11 of the insulating film ZM1 in the SOI region 1A (absolute value of difference) immediately after the step S11 is finished is smaller than the difference between the thickness TB10 of the insulating layer BX in the bulk region 1B and the thickness TA10 of the insulating film ZM1 in the SOI region 1A (absolute value of difference) immediately before performing the step S11. In addition to reducing the thickness of the insulating layer BX in the bulk region 1B by the etching process in the step S11, the difference between the thickness of the insulating layer BX in the bulk region 1B and the thickness of the insulating film ZM1 in the SOI region 1A (absolute value of difference) is reduced, and thus the difference between the thickness of the insulating layer BX in the bulk region 1B and the thickness of the insulating film ZM1 in the SOI region 1A (absolute value of difference) immediately before performing the etching process in the step S14 can be reduced. Accordingly, since the etching amount in the etching process in the step S14 can be efficiently reduced, the effect of suppressing or preventing the formation of the divot in the element isolation region ST in the etching process in the step S14 can be properly achieved.

Further, in consideration of the etching thickness of the insulating layer BX in the bulk region 1B in the step S11, the formation thickness of the insulating film ZM1 in the step S2 is preferably set such that the thickness (TA11) of the insulating film ZM1 in the SOI region 1A and the thickness (TB11) of the insulating layer BX in the bulk region 1B are equal to each other (TA11=TB11) at the stage immediately after the etching process in the step S11 is finished. Specifically, the formation thickness of the insulating film ZM1 in the step S2 may be set to the thickness obtained by subtracting the etching thickness (etching amount) of the insulating layer BX in the bulk region 1B in the step S11 from the thickness of the insulating layer BX at the stage when the step S2 is performed. In this manner, the thickness (TA11) of the insulating film ZM1 in the SOI region 1A and the thickness (TB11) of the insulating layer BX in the bulk region 1B become approximately equal to each other (TA11=TB11) at the stage immediately after the etching process in the step S11 is finished. Meanwhile, the thickness of the insulating layer BX at the stage when the SOI substrate 1 is prepared in the step S1 may be set in accordance with the required characteristics of the semiconductor device or the like.

Accordingly, the thickness of the insulating film ZM1 is smaller than the thickness of the insulating layer BX at the stage when the insulating film ZM1 is formed in the step S2. Then, the relation that the thickness of the insulating film ZM1 in the SOI region 1A is smaller than the thickness of the insulating layer BX in the bulk region 1B is maintained after the step S2 until immediately before performing the etching process in the step S11, and when etching process in the step S11 is performed, the thickness of the insulating film ZM1 in the SOI region 1A and the thickness of the insulating layer BX in the bulk region 1B become approximately equal to each other. Accordingly, the thickness of the insulating film ZM1 in the SOI region 1A is smaller than the thickness of the insulating layer BX in the bulk region 1B in each of the stages shown in FIGS. 4 to 12, and the thickness of the insulating film ZM1 in the SOI region 1A is approximately equal to the thickness of the insulating layer BX in the bulk region 1B in each of the stages shown in FIGS. 13 to 17. Note that the thickness of the insulating film ZM1 in the SOI region 1A and the thickness of the insulating layer BX in the bulk region 1B are equal to each other after the SOI substrate 1 is prepared in the step S1 until the insulating layer BX in the bulk region 1B is exposed in the step S10.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A manufacturing method of a semiconductor device, comprising the steps of:
    (a) preparing a substrate that includes a semiconductor substrate, an insulating layer on the semiconductor substrate, a semiconductor layer on the insulating layer, a first insulating film on the semiconductor layer, a trench penetrating the first insulating film, the semiconductor layer and the insulating layer so as to reach the semiconductor substrate, and a second insulating film embedded in the trench,
    the insulating layer, the first insulating film and the second insulating film being made of the same material as one another;
    (b) after the step (a), forming a first mask layer that covers the first insulating film in a first region of the substrate and exposes the first insulating film in a second region different from the first region of the substrate;
    (c) after the step (b), removing the first insulating film in the second region by etching using the first mask layer as an etching mask, thereby exposing the semiconductor layer in the second region;
    (d) after the step (c), removing the semiconductor layer in the second region by isotropic dry etching using the first mask layer as an etching mask, thereby exposing the insulating layer in the second region;
    (e) after the step (d), performing etching for the insulating layer in the second region using the first mask layer as an etching mask, thereby reducing a thickness of the insulating layer in the second region;
    (f) after the step (e), removing the first mask layer;
    (g) after the step (f), forming a first semiconductor region by ion-implanting an impurity to the semiconductor substrate in the first region, and forming a second semiconductor region by ion-implanting an impurity to the semiconductor substrate in the second region;
    (h) after the step (g), removing the first insulating film in the first region and the insulating layer in the second region by wet etching, thereby exposing the semiconductor layer in the first region and the semiconductor substrate in the second region; and
    (i) after the step (h), forming a first transistor on the semiconductor layer in the first region, and forming a second transistor on the semiconductor substrate in the second region.

2. The manufacturing method of a semiconductor device according to claim 1,
    wherein, in the step (c), the first insulating film in the second region is removed by dry etching,
    wherein, in the step (e), the thickness of the insulating layer in the second region is reduced by performing dry etching,
    wherein etching gas to be used is different between the step (c) and the step (d), and
    wherein etching gas to be used is different between the step (d) and the step (e).

3. The manufacturing method of a semiconductor device according to claim 2,
    wherein, in the step (c), the semiconductor layer in the second region is exposed by removing the first insulating film in the second region by dry etching under a condition that the semiconductor layer is hard to be etched compared with the first insulating film, wherein, in the step (d), the insulating layer in the second region is exposed by removing the semiconductor layer in the second region by dry etching under a condition that the insulating layer is hard to be etched compared with the semiconductor layer, and wherein an etching rate of the insulating layer in a case of using an etching condition in the step (e) is higher than an etching rate of the insulating layer in a case of using an etching condition in the step (d).

4. The manufacturing method of a semiconductor device according to claim 1, wherein anisotropic dry etching is performed in each of the step (c) and the step (e), and wherein isotropic dry etching is performed in the step (d).

5. The manufacturing method of a semiconductor device according to claim 1, wherein an etching rate of the insulating layer in the step (e) is lower than an etching rate of the first insulating film in the step (c).

6. The manufacturing method of a semiconductor device according to claim 1, wherein the first insulating film, the insulating layer, and the second insulating film are made of silicon oxide.

7. The manufacturing method of a semiconductor device according to claim 6, wherein the semiconductor layer is made of silicon.

8. The manufacturing method of a semiconductor device according to claim 1, wherein the second insulating film is disposed at a boundary between the first region and the second region in a plan view.

9. The manufacturing method of a semiconductor device according to claim 1, wherein the first insulating film is thinner than the insulating layer in the substrate prepared in the step (a).

10. The manufacturing method of a semiconductor device according to claim 9, wherein, in the step (e), the insulating layer in the second region is dry-etched to reduce the thickness of the insulating layer in the second region such that the thickness of the insulating layer in the second region is made equal to a thickness of the first insulating film in the first region.

11. The manufacturing method of a semiconductor device according to claim 1, wherein the step (a) includes the steps of:

(a1) preparing the substrate that includes the semiconductor substrate, the insulating layer on the semiconductor substrate, the semiconductor layer on the insulating layer, the first insulating film on the semiconductor layer, and a third insulating film on the first insulating film;

(a2) after the step (a1), forming the trench penetrating the third insulating film, the first insulating film, the semiconductor layer and the insulating layer to reach the semiconductor substrate;

(a3) after the step (a2), forming a fourth insulating film over the third insulating film so as to fill the trench;

(a4) after the step (a3), forming the second insulating film made of the fourth insulating film by removing the fourth insulating film outside the trench; and (a5) after the step (a4), removing the third insulating film by etching, wherein the third insulating film is made of a material different from that of the first insulating film.

12. The manufacturing method of a semiconductor device according to claim 11, wherein the insulating layer, the first insulating film, and the fourth insulating film are made of silicon oxide, wherein the third insulating film is made of silicon nitride, and wherein, in the step (a4), the fourth insulating film outside the trench is removed by polishing the fourth insulating film, thereby forming the second insulating film made of the fourth insulating film in the trench.

13. The manufacturing method of a semiconductor device according to claim 1, wherein the first semiconductor region is formed for controlling a threshold voltage of the first transistor.

14. The manufacturing method of a semiconductor device according to claim 13, wherein, in the step (g), the impurity is implanted also to the second insulating film in a region adjacent to the semiconductor layer in the first region in a plan view.

15. The manufacturing method of a semiconductor device according to claim 1, wherein the thickness of the insulating layer in the second region at a stage when the step (e) is finished is 3 nm or more.

16. The manufacturing method of a semiconductor device according to claim 15, wherein an etching thickness of the insulating layer in the second region in the step (e) is 3 nm or more.

* * * * *